United States Patent
Hasegawa et al.

(10) Patent No.: US 7,002,782 B2
(45) Date of Patent: Feb. 21, 2006

(54) MAGNETIC SENSING ELEMENT BIASED BY TWO ANTIFERROMAGNETIC LAYERS ABOVE FREE MAGNETIC LAYER AND TWO HARD BIAS LAYERS AT TWO SIDES OF THE FREE MAGNETIC LAYER, AND METHOD FOR MAKING THE SAME

(75) Inventors: Naoya Hasegawa, Niigata-ken (JP); Eiji Umetsu, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 154 days.

(21) Appl. No.: 10/437,219

(22) Filed: May 13, 2003

(65) Prior Publication Data

US 2004/0008455 A1 Jan. 15, 2004

(30) Foreign Application Priority Data

May 14, 2002 (JP) .............................. 2002-138566

(51) Int. Cl.
*G11B 5/39* (2006.01)
(52) U.S. Cl. ................................. 360/324.12
(58) Field of Classification Search ............... 360/324, 360/324.11, 324.1, 324.12, 324.2
See application file for complete search history.

(56) References Cited

U.S. PATENT DOCUMENTS

| | | | |
|---|---|---|---|
| 6,094,325 A | 7/2000 | Tagawa et al. | |
| 6,501,627 B1 * | 12/2002 | Noma et al. | 360/324.12 |
| 6,507,465 B1 | 1/2003 | Nakamoto et al. | |
| 6,822,836 B1 * | 11/2004 | Gill | 360/324.12 |
| 2003/0076635 A1 * | 4/2003 | Morinaga et al. | 360/324.12 |
| 2003/0179507 A1 * | 9/2003 | Freitag et al. | 360/322 |

* cited by examiner

*Primary Examiner*—William J Klimowicz
(74) *Attorney, Agent, or Firm*—Brinks Hofer Gilson & Lione

(57) ABSTRACT

A magnetic sensing element comprising a stably magnetized free magnetic layer is provided. Hard bias layers are disposed at the two sides of the free magnetic layer, and a third antiferromagnetic layer is disposed on the free magnetic layer. Side regions of the free magnetic layer extending beyond the track width are overlaid by second antiferromagnetic layers with the third antiferromagnetic layer therebetween. The magnetization directions of the side regions of the free magnetic layer are pinned in the track width direction by a synergetic effect of the exchange coupling magnetic fields generated between the side regions of the free magnetic layer and the third antiferromagnetic layer and the longitudinal bias magnetic fields from the hard bias layers.

5 Claims, 36 Drawing Sheets

FIG. 34
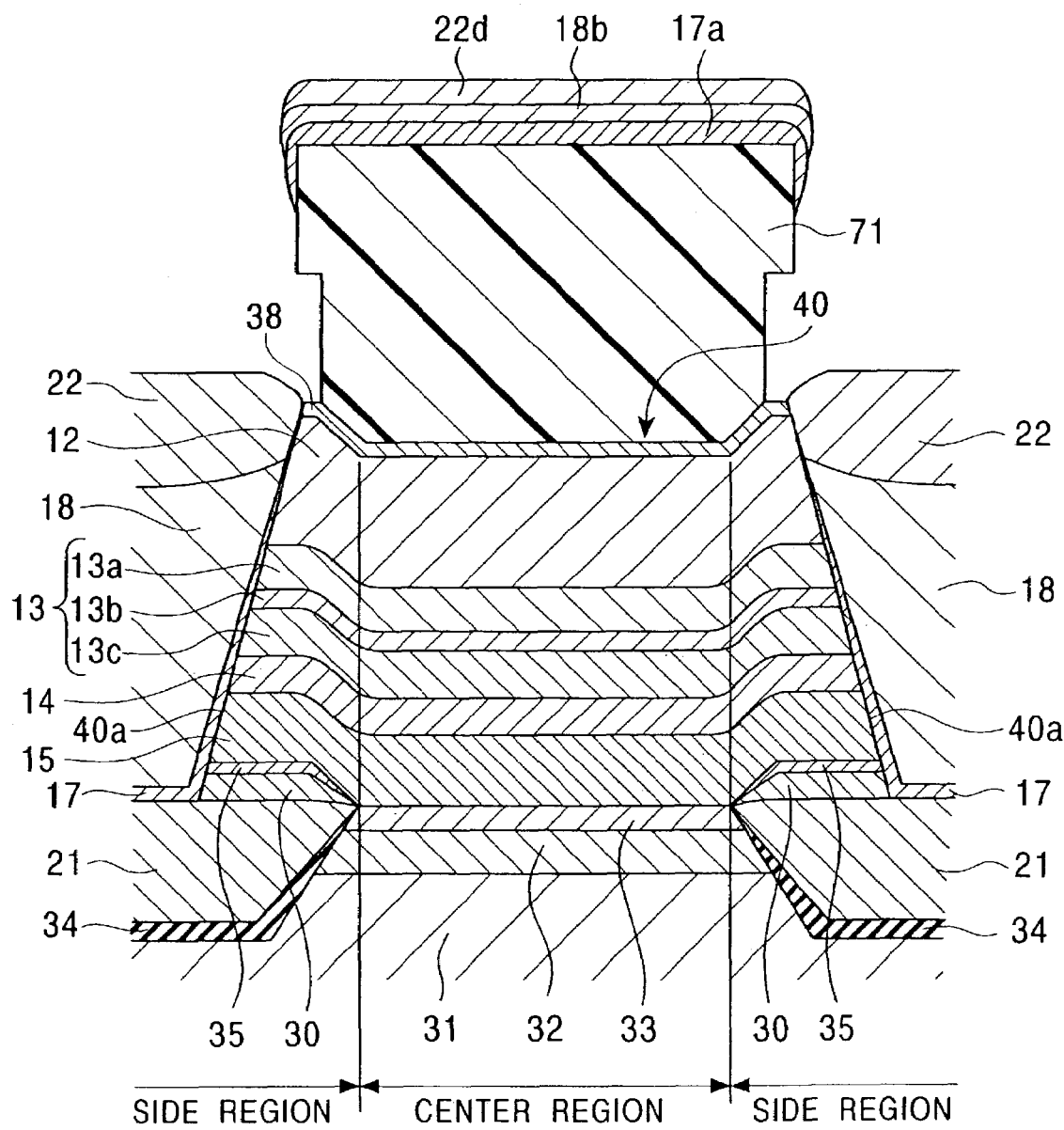
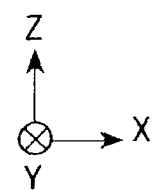

MAGNETIC SENSING ELEMENT BIASED BY TWO ANTIFERROMAGNETIC LAYERS ABOVE FREE MAGNETIC LAYER AND TWO HARD BIAS LAYERS AT TWO SIDES OF THE FREE MAGNETIC LAYER, AND METHOD FOR MAKING THE SAME

This application claims the benefit of priority to Japanese Patent Application 2002-138566, filed on May 14, 2002.

BACKGROUND OF THE INVENTION

1. Field of the Invention

The present invention relates to a magnetic sensing element, the electric resistance of which changes according to the relationship between the magnetization direction of a pinned magnetic layer and the magnetization direction of a free magnetic layer having a magnetization direction rotatable in response to an external field. In particular, the present invention relates to a magnetic sensing element that maintains a stable magnetization state exhibiting improved read characteristics such as prevention of side reading and the like.

2. Description of the Related Art

FIG. 36 is a partial cross-sectional view of a conventional magnetic element, such as a spin valve film, viewed from the face that opposes a recording medium. Hereinafter, this face is referred to as the "opposing face". As shown in FIG. 36, the magnetic sensing element is constituted from a composite film 5 comprising an antiferromagnetic layer 1 composed of a PtMn alloy, a pinned magnetic layer 2 composed of a NiFe alloy, a nonmagnetic material layer 3 composed of Cu or the like, and a free magnetic layer 4 composed of a NiFe alloy; two hard bias layers 6 respectively disposed at the two sides of the composite film 5; and electrode layers 7. The magnetic sensing element is of a hard bias type.

According to the conventional structure shown in FIG. 36, the electrode layers 7 extend over part of the upper face of the composite film 5. A large longitudinal biasing magnetic field is supplied from the bias layers 6 so that a sensing current from the electrode layers 7 can be supplied to the sensitive region and not to a dead region that makes substantially no contribution to the magnetoresistive effect. The sensitive region and the dead region will be described later with reference to FIG. 10.

The element size, i.e., the size of the composite film 5, must be reduced in order to meet the trends toward narrower track width. However, photolithographic technology has reached its limit and it is now difficult to further reduce the size of the composite film. Moreover, as the element becomes smaller, the percentage occupied by the dead region in the element becomes higher, resulting in degraded sensitivity. Furthermore, the dead region is not completely insensitive. In particular, the magnetization of the dead region slightly rotates in response to an external field near the border between the dead region and the sensitive region. Such a change in magnetization in the dead region affects the magnetization of the sensitive region and causes side reading.

FIG. 37 is a partial cross-sectional view of another example of a conventional magnetic sensing element viewed from the opposing face. The magnetic sensing element is constituted from the antiferromagnetic layer 1, the pinned magnetic layer 2, the nonmagnetic material layer 3, the free magnetic layer 4, and two second antiferromagnetic layers 8.

The second antiferromagnetic layers 8 are disposed on the free magnetic layer 4. The second antiferromagnetic layers 8 are separated from each other in the track width direction (the X direction) by a predetermined gap therebetween. The magnetic sensing element shown in FIG. 37 is of an exchange bias type. As shown in FIG. 37, the gap between the second antiferromagnetic layers 8 is defined as the track width Tw.

According to this conventional structure, the length of the free magnetic layer 4 in the track width direction (X direction) is sufficiently longer than the track width Tw. When compared to that of a hard bias type described above, this structure has been expected to easily achieve better control of the magnetization direction of the free magnetic layer 4, which is adaptable to narrower track widths.

Note that the magnetization directions in side regions 4a of the free magnetic layer 4 are pinned in the X direction in the drawing by exchange anisotropic magnetic fields generated by the second antiferromagnetic layers 8. A center portion 4b of the free magnetic layer 4 is moderately magnetized so as to be rotatable in response to an external magnetic field.

However, the magnetic sensing element of an exchange bias type shown in FIG. 37 has the following problems. Since the magnetic sensing element utilizes the exchange coupling magnetic fields with the second antiferromagnetic layers 8 and the thickness of the free magnetic layer 4 is uniform, the center portion of the free magnetic layer 4 is magnetized only by exchange interactions occurring within the free magnetic layer 4 in order to achieve a single-magnetic-domain state. Thus, the thickness and the composition of the second antiferromagnetic layers 8 and the free magnetic layer 4 or the state of the interface between the free magnetic layer 4 and the second antiferromagnetic layers 8 must be optimized in order to generate an exchange coupling magnetic field of the proper magnitude. Moreover, when the thickness of tips 8a of the second antiferromagnetic layers 8 is small, as shown in FIG. 37, the exchange coupling magnetic fields generated between the free magnetic layer 4 and the second antiferromagnetic layers 8 become excessively small. This attenuates the magnetic pinning in the side regions 4a of the free magnetic layer 4. In particular, the magnetic pinning at the borders with the center portion 4b becomes significantly weak. As a result, read characteristics are degraded, i.e., the off-track characteristics are degraded and linearity can be no longer maintained.

It has been the general understanding that neither a magnetic sensing element of a hard bias type nor a magnetic sensing element of an exchange bias type can achieve proper control of the magnetization of the free magnetic layer 4 compatible with narrower tracks.

SUMMARY OF THE INVENTION

It is an object of the present invention to overcome the above-described problems of the prior art by providing a magnetic sensing element having a structure combining the exchange bias method and the hard bias method. According to the present invention, the magnetization state of the free magnetic layer can be stabilized, and side reading can be prevented, thereby achieving improved read characteristics. A method for making the magnetic sensing element is also provided.

A first aspect of the present invention provides a magnetic sensing element comprising a composite film having side regions and a center region, comprising, in order from the bottom to top, a first antiferromagnetic layer, a pinned magnetic layer, a nonmagnetic material layer, and a free magnetic layer; two second antiferromagnetic layers disposed above the free magnetic layer in the side regions; a nonmagnetic layer disposed in a gap between the second antiferromagnetic layers in a track width direction; and two hard bias layers provided against at least two side faces of the free magnetic layer in the track width direction.

According to this structure, the magnetization directions of the side regions of the free magnetic layer can be suitably pinned in the track width direction (a single-magnetic-domain state) by a synergetic effect of the exchange coupling magnetic fields generated by the second antiferromagnetic layers and the longitudinal bias magnetic fields from the hard bias layers. When compared with conventional art in which the free magnetic layer is put into a single-magnetic-domain state solely by the longitudinal bias magnetic field from hard bias layers or solely by the exchange coupling magnetic fields by second antiferromagnetic layers, the magnetization directions of the side portions of the free magnetic layer can be reliably pinned.

The width of the free magnetic layer in the track width direction is longer than that according to the conventional hard bias method. Thus, the percentage of the free magnetic layer occupied by the dead regions does not increase, and the sensitivity is not degraded even with hard bias layers and narrower tracks.

Accordingly, side reading can be prevented and read characteristics such as stability in off-track characteristic and the like can be improved even with narrow tracks.

Since the nonmagnetic layer is disposed between the second antiferromagnetic layers in the track width direction, the layers underneath the nonmagnetic layer can be properly protected from oxidation. Moreover, the magnitude of the exchange coupling magnetic field generated by the second antiferromagnetic layers can be properly increased, and the magnetization directions of the side portions of the free magnetic layers can be properly pinned.

Preferably, a third antiferromagnetic layer is disposed on the free magnetic layer. In such a case, the second antiferromagnetic layers preferably overlay the side regions of the third antiferromagnetic layer and the hard bias layers. Preferably, the third antiferromagnetic layer has a thickness of 20 to 50 Å.

The third antiferromagnetic layer and the second antiferromagnetic layers on the side regions function as one antiferromagnetic layer. Since the center region of the third antiferromagnetic layer is thin, i.e., 50 Å or less in thickness, the third antiferromagnetic layer exhibits nonantiferromagnetic properties. Accordingly, exchange coupling magnetic fields of a proper magnitude are generated only between the free magnetic layer and the side regions of the third antiferromagnetic layer. As a result, the magnetization directions of the side regions of the free magnetic layer can be properly pinned in the track width direction by the exchange coupling magnetic fields described above and the longitudinal bias magnetic fields from the hard bias layers.

In this invention, a nonmagnetic element may exist at interfaces between the third antiferromagnetic layer and the second antiferromagnetic layers. The nonmagnetic layer is preferably composed of, or the nonmagnetic element is preferably at least one element selected from the group consisting of Ru, Re, Pd, Os, Ir Pt, Au, Rh, and Cr.

The magnetic sensing element of the present invention may further include at least one ferromagnetic layer provided at least between the free magnetic layer and the second antiferromagnetic layers and between the hard bias layers and the second antiferromagnetic layers. Exchange bias magnetic fields of the proper magnitude can be generated between the side regions of the ferromagnetic layer and the second antiferromagnetic layers, and the magnetization directions of the side regions of the free magnetic layer can be properly pinned in the track width direction by the exchange interaction with the ferromagnetic layer and the longitudinal bias magnetic fields from the hard bias layers.

Preferably, the magnetic sensing element further comprises electrode layers disposed on the second antiferromagnetic layers.

In the present invention, the second antiferromagnetic layers may be disposed on the side regions of the free magnetic layer, and the hard bias layers may be provided against two side faces of the composite film and two side faces of the second antiferromagnetic layers in the track width direction. With this structure also, the magnetization directions of the side regions of the free magnetic layer can be properly pinned in the track width direction by exchange coupling magnetic fields by the second antiferromagnetic layers and the longitudinal bias magnetic fields form the hard bias layers.

Preferably, electrode layers are formed on the hard bias layers and are extended over part of the second antiferromagnetic layers. In this manner, ratio of the sensing current shunting to the side regions of the composite film can be decreased, side reading can be further effectively prevented, and output can be increased.

A second aspect of the present invention provides a magnetic sensing element comprising a composite film having side regions and a center region, comprising, in order from the bottom to top, a free magnetic layer, a nonmagnetic material layer, a pinned magnetic layer, and a first antiferromagnetic layer; second antiferromagnetic layers disposed under the side regions of the free magnetic layer, the second antiferromagnetic layers having extended portions not overlaid by the composite film; and hard bias layers disposed on the extended portions and provided at least against two side faces of the free magnetic layer in a track width direction.

This structure also properly pins the magnetization directions of the side regions of the free magnetic layer in the track width direction by the exchange coupling magnetic fields by the second antiferromagnetic layers and the longitudinal bias magnetic fields from the hard bias layers.

Preferably, ferromagnetic layers are disposed between the side regions of the free magnetic layer and the second antiferromagnetic layers.

Preferably, the magnetic sensing element further includes electrode layers stacked on the hard bias layers.

Preferably, the electrode layers are extended to overlay the side regions of the first antiferromagnetic layer, and the distance between the electrode layers in the track width direction is equal to or smaller than the distance between the second antiferromagnetic layers in the track width direction. In this manner, ratio of the sensing current shunting to the side regions of the composite film can be decreased, a sensing current can be supplied to the entire sensitive region, side reading can be further effectively prevented, and output can be increased.

The electrode layers described above in each aspect may be disposed above and under the composite film in the thickness direction.

The present invention also provides a method for making a magnetic sensing element. The method comprises the steps of (a) forming a composite film precursor comprising, in order from the bottom to top, a first antiferromagnetic layer, a pinned magnetic layer, a nonmagnetic material layer, a free magnetic layer, and a nonmagnetic layer; (b) milling side portions of the composite film precursor to prepare a composite film having a center region and two side regions in a track width direction and forming a hard bias layer at each side of the composite film; and (c) milling the side regions of the nonmagnetic layer of the composite film, forming second antiferromagnetic layers over the hard bias layers and the side regions of the free magnetic layer, and forming electrode layers on the second antiferromagnetic layers.

According to this method, the two side faces of the free magnetic layer in the track width direction can be adjacent to the hard bias layers, and the second antiferromagnetic layers can be formed on the side regions of the free magnetic layer in the track width direction. Thus, the magnetization directions of the side regions of the free magnetic layer can be properly pinned in the track width direction by the exchange coupling magnetic fields by the second antiferromagnetic layers and the longitudinal bias magnetic fields from the hard bias layers.

Since the nonmagnetic layer is provided on the free magnetic layer, the free magnetic layer can be protected from oxidation. By milling the side regions of the nonmagnetic layer in the step (c), exchange coupling magnetic fields of the proper magnitude can be generated between the second antiferromagnetic layers and the free magnetic layer.

Preferably, in step (a), a third antiferromagnetic layer is formed on the free magnetic layer, the nonmagnetic layer thereby being formed on the third antiferromagnetic layer. Preferably, in step (c), prior to forming the second antiferromagnetic layers, at least the side regions of the nonmagnetic layer are milled to expose the side regions of the third antiferromagnetic layer, the second antiferromagnetic layers thereby overlaying the side regions of the third antiferromagnetic layers. Preferably, the thickness of the third antiferromagnetic layer is 20 to 50 Å.

The side regions of the third antiferromagnetic layer, 50 Å or less in thickness, function as one antiferromagnetic layer together with the second antiferromagnetic layers. The center region of the third antiferromagnetic layer is nonantiferromagnetic. Exchange coupling magnetic fields are generated only between the side regions of the third antiferromagnetic layer and the side regions of the free magnetic layer. Thus, the magnetization directions of the side regions of the free magnetic layer can be properly pinned in the track width direction while moderately putting the center region of the free magnetic layer into a single-magnetic-domain state, the magnetization direction of which is rotatable in response to an external magnetic field.

In step (c), the entire nonmagnetic layer on the third antiferromagnetic layer may be milled prior to forming the second antiferromagnetic layers; and a precursor of the second antiferromagnetic layers may be deposited on the third antiferromagnetic layer and the hard bias layers, a precursor of the electrode layers may be deposited on the precursor of the second antiferromagnetic layers, and the center regions of the precursors may be milled to prepare the second antiferromagnetic layers and electrode layers overlaying the side regions of the third antiferromagnetic layer.

Moreover, in step (c), ferromagnetic layers may be formed over the hard bias layers and the side regions of the free magnetic layer, the second antiferromagnetic layers being thereby formed on the ferromagnetic layers.

According to this method, exchange coupling magnetic fields of the proper magnitude can be generated between the second antiferromagnetic layers and the side regions of the ferromagnetic layer. The magnetization directions of the side regions of the free magnetic layer can be properly pinned in the track width direction by the exchange interaction with the ferromagnetic layer and the longitudinal magnetic fields from the hard bias layers.

Alternatively, in step (c), the ferromagnetic layers, a precursor of the second antiferromagnetic layers, and a precursor of the electrode layers may be formed over the free magnetic layer and the hard bias layers, and center portions of the precursors of the second antiferromagnetic layers and the electrode layers may be milled to prepare the second antiferromagnetic layers and electrode layers overlaying the side regions of the free magnetic layer.

Preferably, the nonmagnetic layer is formed with at least one element selected from the group consisting of Ru, Re, Pd, Os, Ir, Pt, Au, Rh, and Cr. The thickness of the nonmagnetic layer is preferably 3 to 10 Å.

The nonmagnetic layer protects the composite film formed underneath. Since the nonmagnetic layer is composed of Ru or the like, it functions as a protective layer even at a small thickness. Since the thickness of the nonmagnetic layer is reduced, low-energy ion milling can be employed in milling the nonmagnetic layer. Thus, the adverse affects to the composite resulting from the ion milling can be minimized, and a magnetic sensing element having superior read characteristics can be manufactured.

The present invention also provides another method for making a magnetic sensing element. The method includes the steps of (d) forming second antiferromagnetic layers separated from each other by a predetermined gap in a track width direction; (e) forming ferromagnetic layers on the second antiferromagnetic layers, forming nonmagnetic layers on the ferromagnetic layers, milling the nonmagnetic layers, and forming a composite film precursor over the ferromagnetic layers and the gap between the ferromagnetic layers in the track width direction, the composite film precursor comprising, in order from the bottom to top, a free magnetic layer, a nonmagnetic material layer, a pinned magnetic layer, and a first antiferromagnetic layer; and (f) milling side portions of the composite film precursor and side portions of the ferromagnetic layers to prepare a composite film having a center region and two side regions with the ferromagnetic layers thereunder, forming hard bias layers at two sides of the composite film and over part of the second antiferromagnetic layers in the track width direction, and forming electrode layers on the hard bias layers.

According to this method, the two side faces of the free magnetic layer can be put adjacent to the hard bias layers in the track width direction, and the second antiferromagnetic layers can be formed under the side regions of the free magnetic layer. Thus, the magnetization directions of the side regions of the free magnetic layer can be properly pinned in the track width direction by the exchange coupling magnetic fields by the second antiferromagnetic layers and the longitudinal magnetic fields from the hard bias layers.

In step (f), the electrode layers may be formed to extend over the side regions of the composite film, and the distance between the electrode layers in the track width direction may be equal to or smaller than the distance between the second antiferromagnetic layers in the track width direction. In this manner, the ratio of a sensing current shunting to the side regions of the composite film can be decreased, a sensing current can be supplied to the entire sensitive region, side reading can be further effectively prevented, and a magnetic sensing element having a large output can be manufactured.

BRIEF DESCRIPTION OF THE DRAWINGS

FIG. 34 shows a step subsequent to the step shown in FIG. 33;

DESCRIPTION OF THE PREFERRED EMBODIMENTS

First Embodiment

Figure 1:
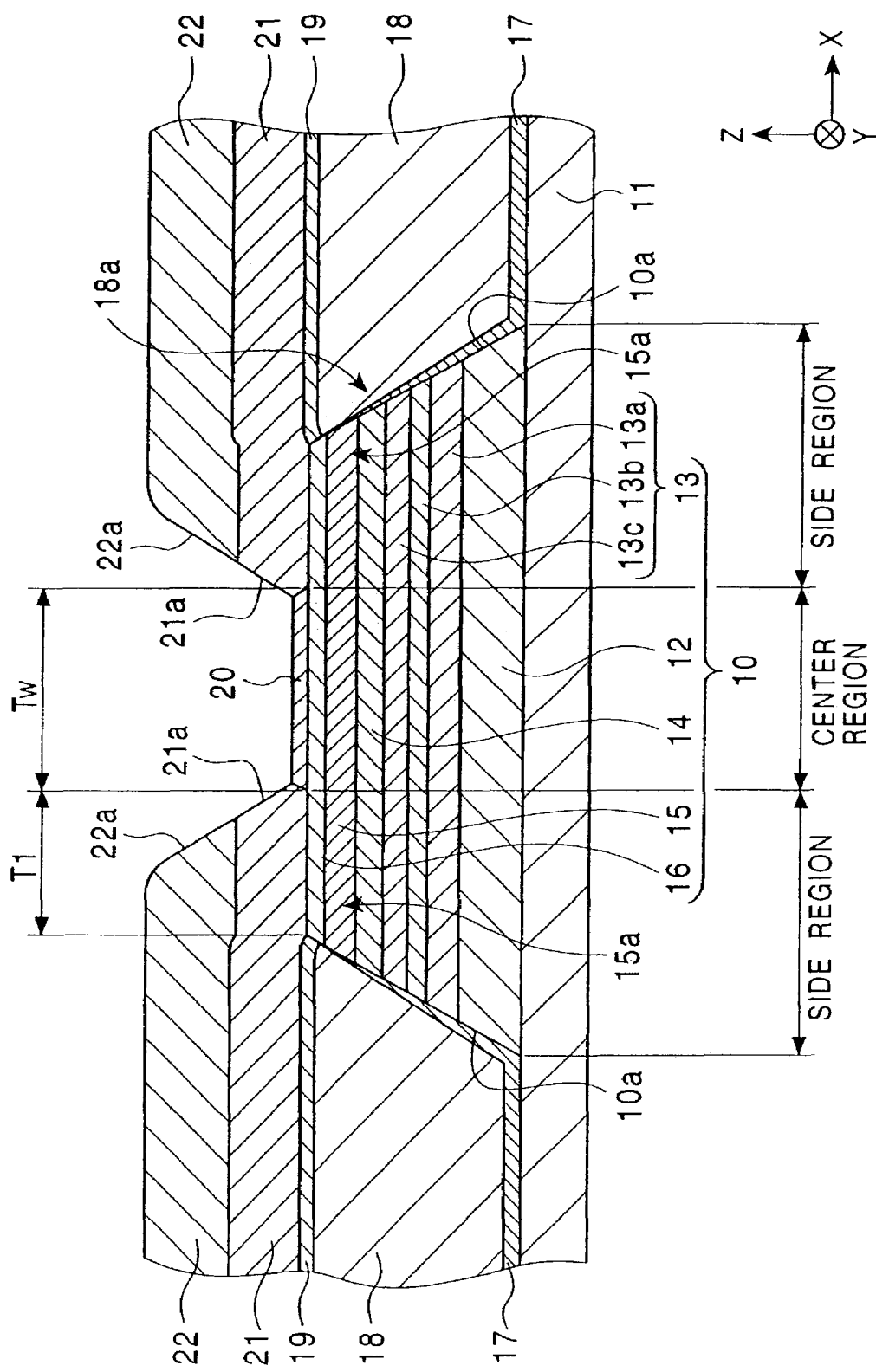
FIG. 1 is a partial cross-sectional view of a magnetic sensing element according to a first embodiment of the present invention viewed from the opposing face.

FIG. 1 is a partial cross-sectional view of a magnetic sensing element according to a first embodiment of the present invention viewed from the opposing face.

The magnetic sensing element shown in FIG. 1 is, for example, formed as a part of a magnetoresistive (MR) head of a magnetic head installed in a hard disk device.

A composite film 10 of the magnetic sensing element shown in FIG. 1 is formed by stacking a first antiferromagnetic layer 12, a pinned magnetic layer 13, a nonmagnetic material layer 14, a free magnetic layer 15, and a third antiferromagnetic layer 16 on a substrate 11 by a thin-film forming process such as sputtering or vapor deposition. The pinned magnetic layer 13 is of a synthetic ferrimagnetically pinned type comprising a first pinned magnetic sublayer 13a, a nonmagnetic interlayer 13b, and a second pinned magnetic sublayer 13c.

For example, the substrate 11 is a laminate comprising a lower shield layer composed of a magnetic material such as a NiFe alloy and a lower gap layer composed of an insulating material such as $Al_2O_3$.

The first antiferromagnetic layer 12 is composed of a PtMn alloy, X—Mn alloy, or Pt—Mn—X' alloy wherein X is at least one element selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr.

The first antiferromagnetic layer 12 composed of any of these materials can generate a large exchange coupling magnetic field once annealed. In particular, when the first antiferromagnetic layer 12 is composed of a PtMn alloy, the first antiferromagnetic layer 12 can produce an exchange coupling magnetic field of at least 48 kA/m, for example, that exceeding 64 kA/m, while achieving a high blocking temperature of 380° C. Note that "high blocking temperature" refers to the temperature at which the generated exchange coupling magnetic field is lost.

These alloys immediately after deposition have a disordered face-centered cubic (f cc) structure. They are transformed into a CuAuI-type ordered face-centered tetragonal (fct) structure by annealing.

The thickness of the first antiferromagnetic layer 12 is 80 to 300 Å, for example 200 Å. In making the first antiferromagnetic layer 12, the Pt content in the PtMn alloy or the X content in the X—Mn alloy is preferably in the range of 37 to 63 at %. The X'+Pt content in the Pt—Mn—X' alloy is preferably in the range of 37 to 63 at %. The X' content in the Pt—Mn—X' alloy is preferably in the range of 0.2 to 10 at %. However, when X' is at least one of Pd, Ir, Rh, Ru, Os, Ni, and Fe, the X' content is preferably in the range of 0.2 to 40 at %.

The first pinned magnetic sublayer 13a and the second pinned magnetic sublayer 13c are composed of a ferromagnetic material. Examples thereof include a NiFe alloy, elemental Co, a CoNiFe alloy, a CoFe alloy, and a CoNi alloy. The first and second pinned magnetic sublayers 13a and 13c are preferably made of a magnetic material containing Co, such as a CoFe alloy, a CoFeNi alloy, or a CoFeCr alloy. The first and second pinned magnetic sublayers 13a and 13b are preferably composed of the same material and may have a single-layer structure or a multilayer structure.

The nonmagnetic interlayer 13b is composed of a nonmagnetic material comprising at least one element selected from the group consisting of Ru, Rh, Ir, Cr, Re, and Cu. The nonmagnetic interlayer 13b is preferably composed of Ru.

In this embodiment, the pinned magnetic layer 13 has a synthetic ferrimagnetic structure. Alternatively, the pinned magnetic layer 13 may be a single layer or a composite layer composed of a magnetic material. An anti-diffusion layer composed of Co or the like may be provided between the second pinned magnetic sublayer 13c and the nonmagnetic material layer 14 so as to prevent interdiffusion.

In this embodiment, the magnetization direction of the first pinned magnetic sublayer 13a is pinned in the Y direction in the drawing, and that of the second pinned magnetic sublayer 13c is pinned in a direction opposite to the Y direction.

The nonmagnetic material layer 14 prevents magnetic coupling between the pinned magnetic layer 13 and the free magnetic layer 15. A sensing current mainly flows in the nonmagnetic material layer 14. The nonmagnetic material layer 14 is preferably composed of a nonmagnetic conductive material such as Cu, Cr, Au, or Ag. Copper (Cu) is particularly preferable.

The free magnetic layer 15 is composed of a ferromagnetic material such as a NiFe alloy, elemental Co, a CoNiFe alloy, a CoFe alloy, or a CoNi alloy.

The third antiferromagnetic layer 16 is preferably composed of a PtMn alloy, X—Mn alloy, or Pt—Mn—X' alloy wherein X is at least one element selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr. The thickness of the third antiferromagnetic layer 16 is smaller than that of the first antiferromagnetic layer 12, and is preferably in the range of 20 to 50 Å.

In the embodiment shown in FIG. 1, side portions of the composite film 10 is etched to form side faces 10a in the track width direction (X direction). The side faces 10a are formed as flat or curved slopes so that the width of the composite film 10 in the track width direction (the X direction) gradually decreases along the Z direction shown in the drawing.

As shown in FIG. 1, the side faces 10a of the composite film 10 and the surface of the substrate 11 not overlaid by the composite film 10 is covered with bias underlayers 17. Hard bias layers 18 are disposed on the bias underlayers 17. The bias underlayers 17 are composed of Cr or W. The hard bias layers 18 are composed of a permanent magnet material such as a CoPt alloy or a CoPtCr alloy.

It is necessary that the hard bias layers 18 be placed at least against the two side faces of the free magnetic layer 15.

Referring again to FIG. 1, a separating layer 19 is disposed on each of the hard bias layers 18. The separating layer 19 is composed of Cr, Ta, or the like.

In the embodiment shown in FIG. 1, a nonmagnetic layer 20 is formed on the composite film 10 in the center region. Second antiferromagnetic layers 21 are formed over the separating layers 19 and the side regions of the composite film 10.

The nonmagnetic layer 20 is preferably composed of at least one element selected from Ru, Re, Pd, Os, Ir, Pt, Au, Rh, and Cr. The second antiferromagnetic layers 21 are preferably composed of a PtMn alloy, X—Mn alloy, or Pt—Mn—X' alloy wherein X is at least one element selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr.

The gap between the bottom faces of the second antiferromagnetic layers 21 in the track width direction (X direction) defines the track width Tw. The track width Tw is, for example, approximately 0.15 μm to 0.2 μm. The track width Tw may vary depending on the specifications (track density) of the product.

In the embodiment shown in FIG. 1, electrode layers 22 are formed on the second antiferromagnetic layers 21. The electrode layers 22 are composed of, for example, Au, W, Cr, Ta, or the like.

Although not shown in FIG. 1, an insulating upper gap layer is formed over the electrode layers 22 and the nonmagnetic layer 20, and a magnetic upper shield layer is formed on the insulating upper gap layer.

The features of the magnetic sensing element shown in FIG. 1 will now be described. The width of the free magnetic layer 15 in the track width direction is larger than the track width Tw. Side portions 15a of the free magnetic layer 15 extending beyond the track width Tw are each overlaid by a third antiferromagnetic layer 16 and the second antiferromagnetic layer 21. According to this structure, the third antiferromagnetic layer 16 and the second antiferromagnetic layers 21 can function as single antiferromagnetic layer, thereby generating exchange coupling magnetic fields between the side portions 15a of the free magnetic layer 15 and the third antiferromagnetic layer 16. Since the hard bias layers 18 are provided at the two sides of the free magnetic layer 15 in the track width direction (the X direction), longitudinal bias magnetic fields can be supplied to the side portions 15a of the free magnetic layer 15 from the hard bias layers 18. As a result, the side portions 15a of the free magnetic layer 15 can be reliably put into a single-magnetic-domain state, and the magnetization pinning state can be stabilized.

In other words, according to the embodiment shown in FIG. 1, the side portions 15a of the free magnetic layer 15 can be properly put into a single-magnetic-domain state in the X direction by a synergistic effect of the exchange coupling magnetic fields between the second antiferromagnetic layers 21 and the third antiferromagnetic layer 16 and the longitudinal bias magnetic fields from the hard bias layers 18. When compared with conventional art in which the free magnetic layer is put into a single-magnetic-domain state solely by the longitudinal bias magnetic field from hard bias layers or solely by the exchange coupling magnetic fields by second antiferromagnetic layers, the magnetization directions of the side portions 15a of the free magnetic layer 15 can be reliably pinned.

As a result, the embodiment shown in FIG. 1 can prevent side reading and can exhibit improved read characteristics, such as stability in off-track characteristics, even with narrower tracks.

In the embodiment shown in FIG. 1, the width of the free magnetic layer 15 in the track width direction (the X direction) is sufficiently larger than the track width Tw. With this structure, the dead regions produced by the longitudinal bias magnetic fields from the hard bias layers 18 can be easily made equal to or smaller than the side portions 15a. Thus, the entire track width Tw can function as a highly sensitive region, thereby enabling production of a large-output magnetic sensing element.

Preferably, the width of the free magnetic layer 15 in the track width direction is approximately 0.2 to 0.5 μm. Since the track width Tw is naturally set to be smaller than this width, further reduction in width of the free magnetic layer 15 in the track width direction is not preferred. This is because such a reduction in width will cause the percentage of the free region occupied by the dead region to increase and the output to decrease. Note that in FIG. 1, the term "track width Tw" refers to the optical track width (O-Tw) determined with an optical microscope.

The relationship between the dead regions and an overlap length T1 will now be described. The overlap length T1 refers to the length of a portion of one of the second antiferromagnetic layers 21 directly overlaying and in contact with the top of the composite film 10.

The dead region is determined according to a full-track profiling method or a microtrack profiling method. The magnetic sensing element used for the determination has hard bias layers 18 at the two sides of the composite film 10 but does not have second antiferromagnetic layers 21.

Figure 10:
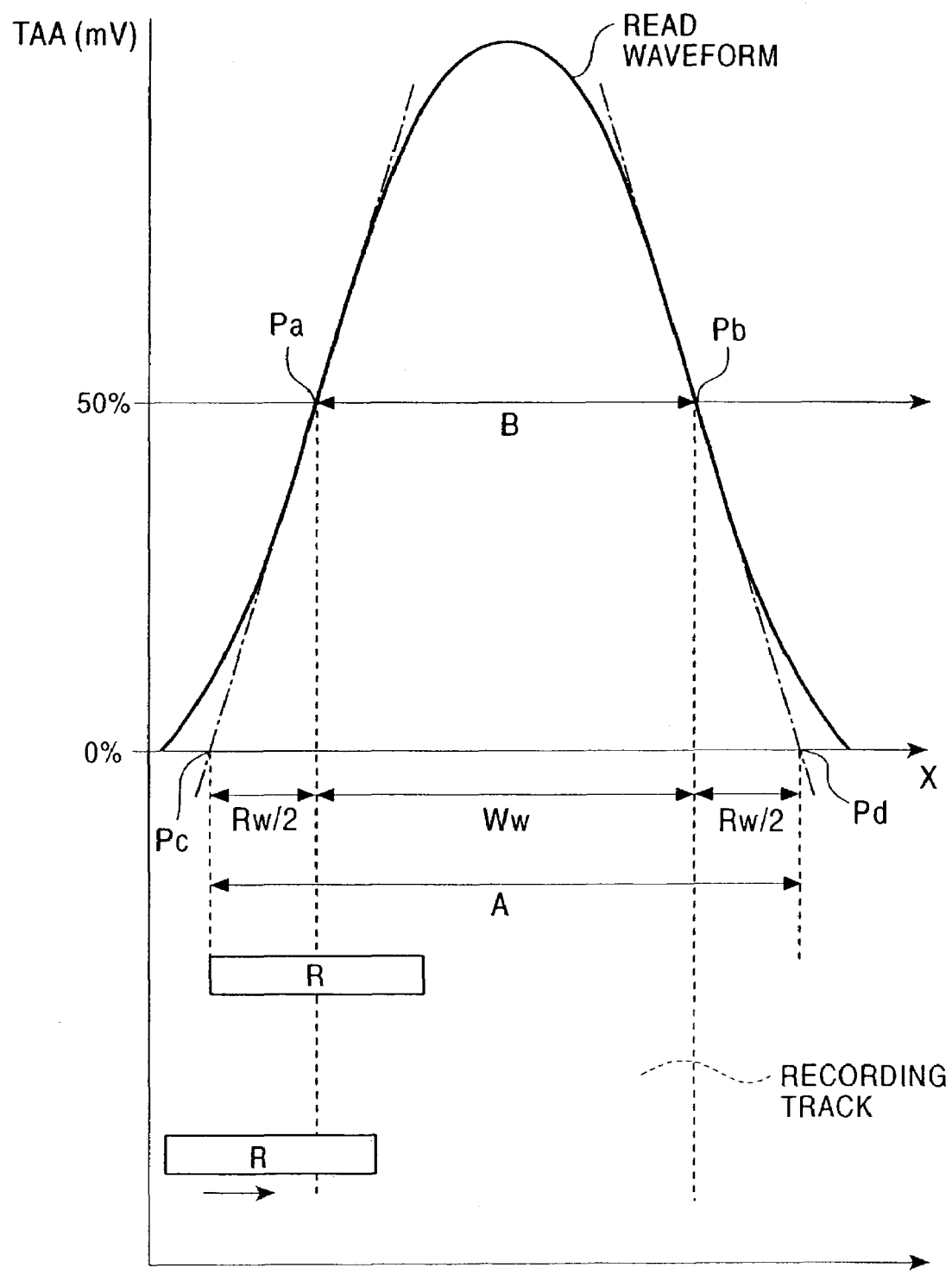
FIG. 10 is a diagram for explaining a full-track profiling method.

Referring now to FIG. 10, a full-track profiling method will now be described. A signal is recorded on a recording track of a recording medium having a recording track width Ww wider than the element width of the magnetic sensing element R. While allowing the magnetic sensing element R to scan the recording track in the track width direction (the X direction), the relationship between the position of the magnetic sensing element R in the recording track width direction (the X direction) and the output is determined. The results are shown in the upper part of the graph in FIG. 10.

From the read waveform, it can be understood that the read output is high around the center of the recording track and decreases towards the ends of the recording width.

In the graph, points Pa and Pb indicate 50% of the maximum of the read output in the read waveform. A tangential line is drawn at each of the points Pa and Pb, and the intersections of the tangential lines and the X axis are defined as points Pc and Pd, respectively. The difference (RW) between the distance B between the points Pa and Pb (half-value width) and the distance between the points Pc and Pd is the effective read track width of the magnetic sensing element. Here, the half-value width B is equal to the effective recording track width Ww.

The effective read track width is the width that actually functions as the track width. Most preferably, the effective track width is equal to the optical track width O-Tw.

The difference between the width of the free magnetic layer 15 in the track width direction (the X direction) in FIG. 1 and the above-described effective read track width (Rw) is the total width of the dead regions. In the embodiment shown in FIG. 1, the width of the dead region in the track width direction is preferably either coincident with the overlap length T1 or slightly smaller than the overlap length T1 to reliably pin the magnetization direction of the dead region in the free magnetic layer 15; in other words, the dead region can be made magnetically insensitive. As a result, an increase in effective read track width Tw can be properly prevented, and a magnetic sensing element that can prevent side reading can be fabricated. For example, the width of the free magnetic layer 15 in the track width direction is 0.4 μm, and the overlap length T1 is 0.13 μm.

In the magnetic sensing element shown in FIG. 1, the third antiferromagnetic layer 16 is formed on the entire top face of the free magnetic layer 15, and the two side portions of the third antiferromagnetic layer 16 are overlaid by the second antiferromagnetic layers 21. As is previously described, the thickness of the third antiferromagnetic layer 16 is 20 to 50 Å, which is significantly smaller than the thickness of the first antiferromagnetic layer 12. If the thickness of the third antiferromagnetic layer 16 is large, exchange coupling magnetic fields are generated between the third antiferromagnetic layer 16 and the free magnetic layer 15 by first field annealing for inducing the exchange coupling magnetic field between the pinned magnetic layer 13 and the first antiferromagnetic layer 12. In this manner, the magnetization direction of the entire free magnetic layer 15 will be pinned, which is a problem.

Accordingly, in the embodiment shown in FIG. 1, the thickness of the third antiferromagnetic layer 16 is set within the range of 20 to 50 Å. The thickness must be at least 20 Å; otherwise, the ferromagnetic property of the side portions of the third antiferromagnetic layer 16 is insufficient even when the second antiferromagnetic layers 21 are formed thereon. As a result, the exchange coupling magnetic fields generated between the two side portions of the third antiferromagnetic layer 16 and the two side regions 15a of the free magnetic layer 15 become weak, thereby failing to firmly pin the magnetization directions of the side portions 15a of the free magnetic layer 15 in the track width direction.

The sum of the thickness of the third antiferromagnetic layer 16 on the side portions 15a of the free magnetic layer 15 and the thickness of the second antiferromagnetic layer 21 is preferably in the range of 80 to 300 Å. At such a thickness, the two side portions of the third antiferromagnetic layer 16 and the second antiferromagnetic layers 21 can function as a single antiferromagnetic layer that exhibits antiferromagnetism once annealed in a magnetic field. As a result, exchange coupling magnetic fields of the proper magnitude can be produced between the two side portions of the third antiferromagnetic layer 16 and the side portions 15a of the free magnetic layer 15, thereby properly pinning the magnetization direction of the side portions 15a of the free magnetic layer 15 in the track width direction.

Although each side face of the free magnetic layer 15 is completely covered by a tip 18a of the hard bias layer 18, with the bias underlayer 17 therebetween, in the embodiment shown in FIG. 1, it is sufficient if part of each side face of the free magnetic layer 15 is covered by the tip 18a of the hard bias layer 18, with or without the bias underlayers 17 therebetween. Preferably, however, the two side faces of the free magnetic layer 15 are completely overlaid by the tips 18a so as to reliably supply longitudinal bias magnetic fields from the hard bias layers 18 via the two ends of the free magnetic layer 15. As a result, the magnetization directions of the side portions 15a of the free magnetic layer 15 can be properly pinned by the exchange coupling magnetic fields generated by the third antiferromagnetic layer 16.

In the embodiment shown in FIG. 1, the Cr bias underlayers 17 are formed as aligning films under the hard bias layers 18. The bias underlayers 17 must be provided at least on part of the substrate 11 not overlaid by the composite film 10. The bias underlayers 17 improve the remanence ratio and the coercive force.

The bias underlayers 17 may be extended to cover the two side faces 10a of the composite film 10, as shown in FIG. 1. However, when the bias underlayers 17 are provided between the free magnetic layer 15 and the hard bias layers 18, the free magnetic layer 15 and the hard bias layers 18 become magnetically disconnected. As a result, the magnetization of the side portions 15a of the free magnetic layer becomes disturbed due to demagnetization fields, resulting in emergence of magnetic walls and in magnetic discontinuity, which is known as a buckling phenomenon. In the embodiment shown in FIG. 1, the width of the free magnetic layer 15 in the track width direction is sufficiently longer than the track width Tw and the problem of the buckling phenomenon may be reduced. In order to reliably prevent the buckling phenomenon and to improve the read characteristics, the bias underlayers 17 may not be provided on the side faces 10a of the composite film 10, or on part of the side faces 10a at the two sides of the free magnetic layer 15.

In the embodiment shown in FIG. 1, the separating layers 19 are provided between the hard bias layers 18 and the second antiferromagnetic layers 21. The separating layers 19 composed of Cr, Ta, or the like prevent the hard bias layers 18 from being oxidized and block the magnetic interaction between the second antiferromagnetic layers 21 and the hard bias layers 18.

In the embodiment shown in FIG. 1, the end faces 21a of the second antiferromagnetic layers 21 and the end faces 22a of the electrode layers 22 are formed as flat or curved slopes so that the gap between the second antiferromagnetic layers 21 and the gap between the first antiferromagnetic layers 22 gradually increases in the Z direction in the drawing. Such a structure results from the fabrication process described below. Note that the electrode layers 22 may be extended to overlay the end faces 21a of the second antiferromagnetic layers 21.

In the embodiment shown in FIG. 1, the nonmagnetic layer 20 is formed on the composite film 10 between the second antiferromagnetic layers 21. The nonmagnetic layer 20 is composed of a nonmagnetic material such as Ru and functions as a protective layer for preventing the third antiferromagnetic layer 16 from being oxidized during the fabrication process of the magnetic sensing element shown in FIG. 1. The thickness of the nonmagnetic layer 20 is small, e.g., 5 to 10 Å. Alternatively, the nonmagnetic layer 20 may be extended to lie between the third antiferromagnetic layer 16 and the second antiferromagnetic layers 21. In such a case, the thickness is smaller, i.e., 3 Å or less. At such a thickness, the two side portions of the third antiferromagnetic layer 16 can properly exhibit antiferromagnetism, and exchange coupling magnetic fields of a proper magnitude can be generated between the third antiferromagnetic layer 16 and the side portions 15a of the free magnetic layer 15.

It should be noted here that even when the nonmagnetic layer 20 is not arranged to extend between the third antiferromagnetic layer 16 and the second antiferromagnetic layers 21, a nonmagnetic element sometimes exists between the third antiferromagnetic layer 16 and the second antiferromagnetic layers 21 under observation by secondary ion mass spectrometry (SIMS). The present invention encompasses such a case.

Second Embodiment

Figure 2:
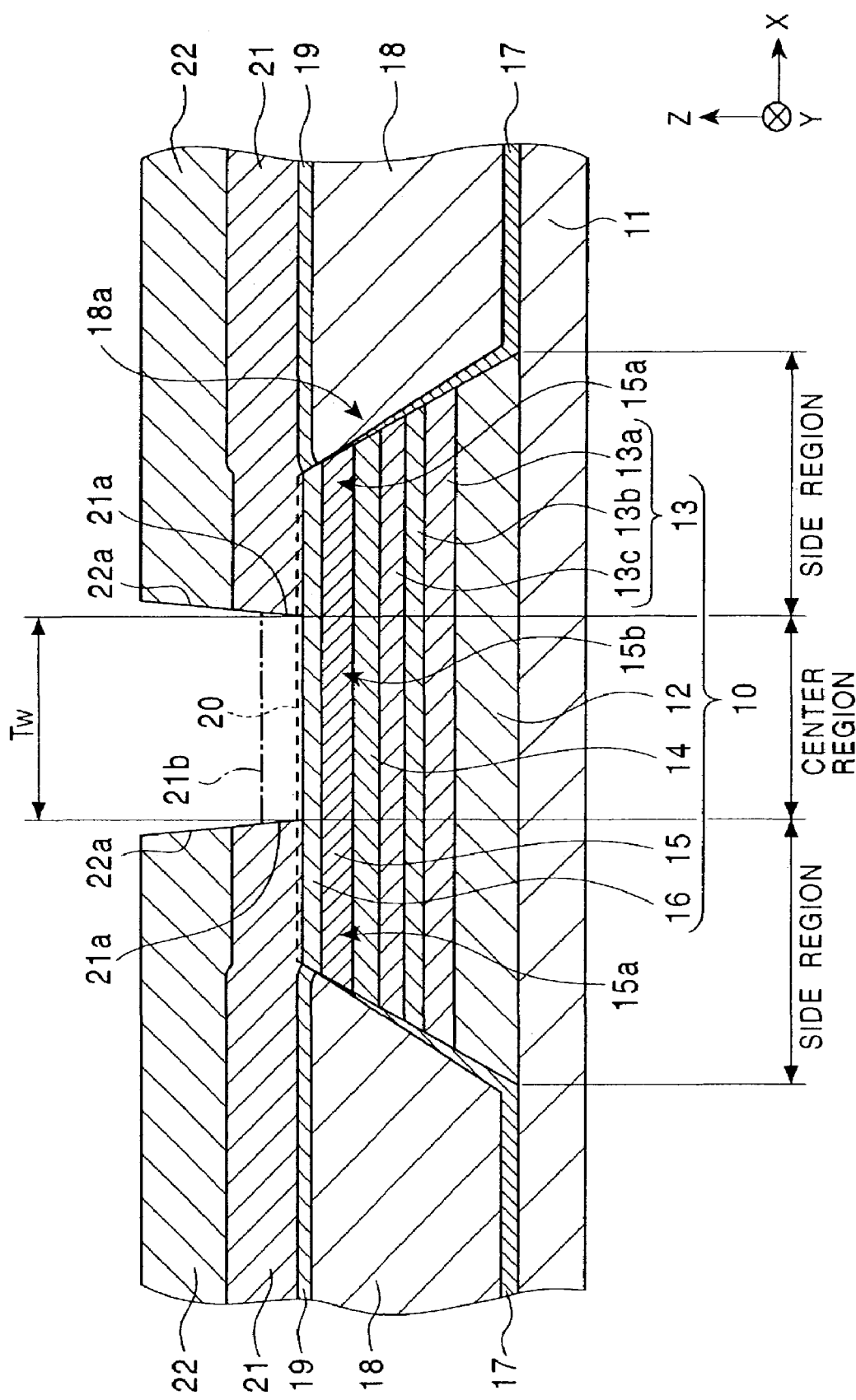
FIG. 2 is a partial cross-sectional view of a magnetic sensing element according to a second embodiment of the present invention viewed from the opposing face.

FIG. 2 is a partial cross-sectional view of a magnetic sensing element according to a second embodiment of the present invention viewed from the opposing face.

As in the first embodiment shown in FIG. 1, the magnetization directions of the side portions 15a of the free magnetic layer 15 of the second embodiment can be properly put into a single-magnetic-domain state in the X direction by a synergistic effect of the exchange coupling magnetic fields between the second antiferromagnetic layers 21 and the third antiferromagnetic layer 16 and the longitudinal bias magnetic fields from the hard bias layers 18. When compared with the conventional art in which the free magnetic layer is put into a single-magnetic-domain state solely by the longitudinal bias magnetic field from hard bias layers or solely by the exchange coupling magnetic fields by second antiferromagnetic layers, the magnetization directions of the side portions 15a of the free magnetic layer 15 can be reliably pinned.

The second embodiment shown in FIG. 2 differs from the first embodiment shown in FIG. 1 in that no nonmagnetic layer 20 is disposed on the composite film 10 and between the second antiferromagnetic layers 21. The nonmagnetic layer 20 may be formed, but in such a case, the nonmagnetic layer 20 is formed to cover the entire upper face of the third antiferromagnetic layer 16 and partly lies at the interfaces between the third antiferromagnetic layer 16 and the second antiferromagnetic layers 21, as shown by a broken line in FIG. 2. The thickness of the nonmagnetic layer 20 is greater than 0 Å but no more than 3 Å. When the thickness of the nonmagnetic layer 20 is 3 Å or less, the both side portions of the third antiferromagnetic layer 16 and the second antiferromagnetic layers 21 function as a single antiferromagnetic layer exhibiting antiferromagnetism, and exchange coupling magnetic fields of a proper magnitude can be generated between the third antiferromagnetic layer 16 and the free magnetic layer 15 in the side regions.

In the embodiment shown in FIG. 1, no second antiferromagnetic layer 21 is formed on the composite film 10 in the center region. In the embodiment shown in FIG. 2, however, the second antiferromagnetic layers 21 may be extended over the composite film 10 in the center region, as shown by a one-dot broken line in FIG. 2. The portion of the second antiferromagnetic layers 21 in the center region is a "second antiferromagnetic layer 21b". The thickness of the second antiferromagnetic layer 21b is adjusted so that the sum of the thickness of the second antiferromagnetic layer 21b and that of the third antiferromagnetic layer 16 is 50 Å or less. If an antiferromagnetic layer with a thickness exceeding 50 Å is provided on the center region of the composite film 10, a large exchange coupling magnetic field is produced by the center region 15b of the free magnetic layer 15. As a result, the center region 15b of the free magnetic layer 15 is firmly put into a single-magnetic-domain state and cannot rotate in response to an external magnetic field, thereby decreasing the output.

The magnetic sensing element shown in FIG. 2 is fabricated by a process different from that of the magnetic sensing element shown in FIG. 1. In the embodiment shown in FIG. 2, the end faces 21a of the second antiferromagnetic layers 21 and the end faces 22a of the electrode layers 22 are formed as flat or curved slopes so that the distance between the end faces 21a in the track width direction (the X direction) and the distance between the end faces 22a in the track width direction (the X direction) gradually increase along the Z direction in the drawing. Alternatively, the end faces 21a and the end faces 22a may be perpendicular to the surface of the substrate 11, that is, parallel to the axis in the Z direction.

Third Embodiment

Figure 3:
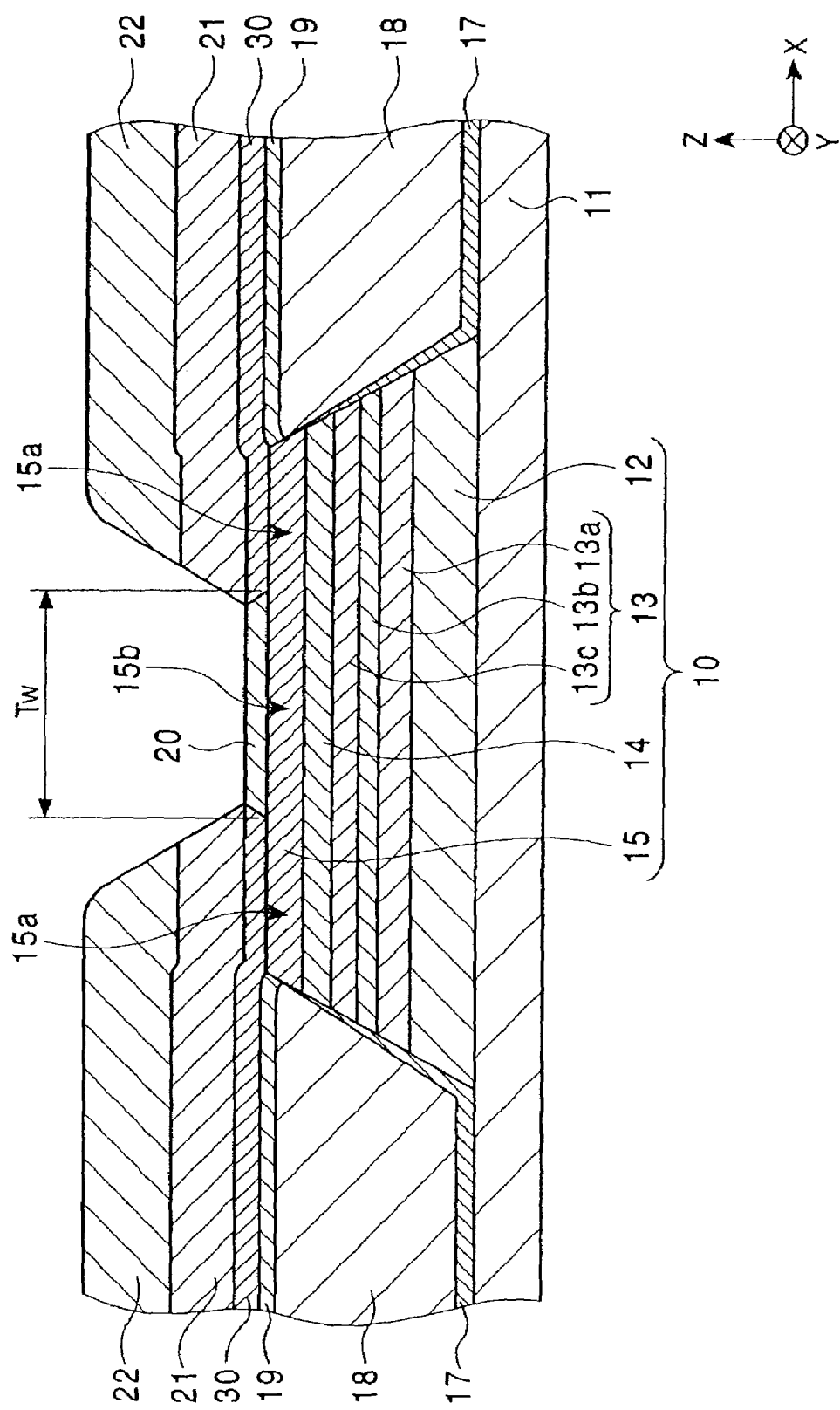
FIG. 3 is a partial cross-sectional view of a magnetic sensing element according to a third embodiment of the present invention viewed from the opposing face.

FIG. 3 is a partial cross-sectional view of a magnetic sensing element according to a third embodiment of the present invention viewed from the opposing face.

The magnetic sensing element shown in FIG. 3 is similar to that shown in FIG. 1. However, no third antiferromagnetic layer 16 is formed on the free magnetic layer 15 in FIG. 3. In this embodiment shown in FIG. 3, the nonmagnetic layer 20 is formed on the center region 15b of the free magnetic layer 15, and ferromagnetic layers 30 extend from the side ends of the nonmagnetic layer 20 along the axis of the X direction over the separating layers 19 formed on the hard bias layers 18. The second antiferromagnetic layers 21 and the electrode layers 22 are disposed on the ferromagnetic layers 30.

In this embodiment shown in FIG. 3, exchange coupling magnetic fields are generated between the second antiferromagnetic layers 21 and the ferromagnetic layers 30 and pin the magnetization directions of the ferromagnetic layers 30 in the track width direction. The side portions 15a of the free magnetic layer 15 are then put into a single-magnetic-domain state in the X direction by a synergistic effect of the exchange interaction with the ferromagnetic layers 30 and the longitudinal bias magnetic fields from the hard bias layers 18. When compared with conventional art in which the free magnetic layer is put into a single-magnetic-domain state solely by the longitudinal bias magnetic field from hard bias layers or solely by the exchange coupling magnetic fields by second antiferromagnetic layers, magnetization directions of the side portions 15a of the free magnetic layer 15 can be reliably pinned.

The structure of parts other than those described above are the same as in the first embodiment shown in FIG. 1. The description thereof is thus omitted to avoid redundancy.

Fourth Embodiment

Figure 4:
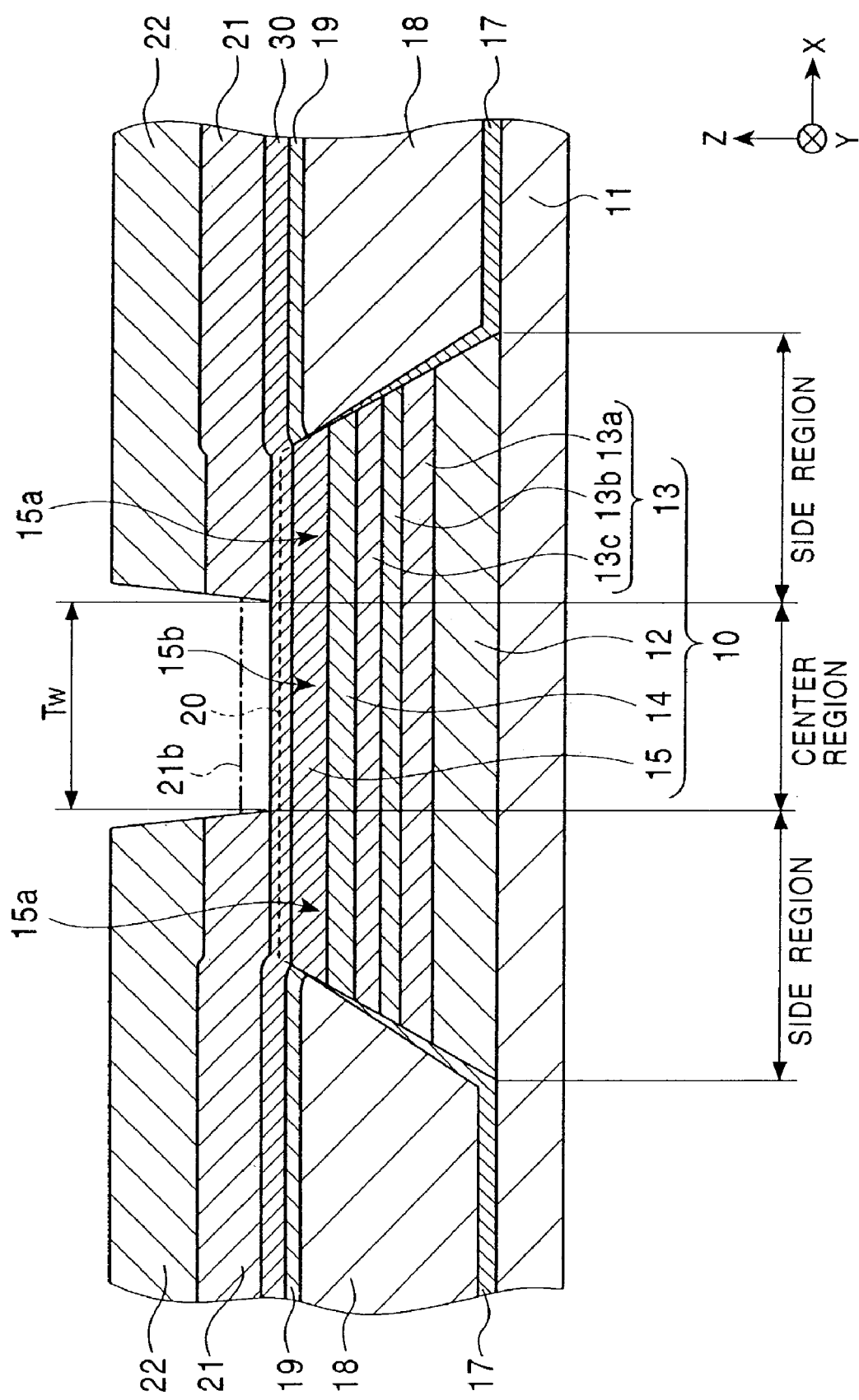
FIG. 4 is a partial cross-sectional view of a magnetic sensing element according to a fourth embodiment of the present invention viewed from the opposing face.

FIG. 4 is a partial cross-sectional view of a magnetic sensing element according to a fourth embodiment of the present invention viewed from the opposing face.

The fourth embodiment is similar to the second embodiment shown in FIG. 2. However, no third antiferromagnetic layer 16 is formed on the free magnetic layer 15. In the embodiment shown in FIG. 4, the ferromagnetic layers 30 on the separating layers 19 are extended to overlay the free magnetic layer 15. The second antiferromagnetic layers 21 and the electrode layers 22 are formed on the ferromagnetic layer 30. In the center region, gaps are formed between the electrode layers 22 and between the second antiferromagnetic layers 21, the gap between the bottom faces of the second antiferromagnetic layers 21 defining the track width Tw.

In the embodiment shown in FIG. 4, exchange coupling magnetic fields are generated between the second antiferromagnetic layers 21 and the portions of the ferromagnetic layers 30 overlaid by the second antiferromagnetic layer 21. As a result, the magnetization directions of these portions of the ferromagnetic layers 30 are pinned in the track width direction (the X direction). The side portions 15a of the free magnetic layer 15 are properly put into a single-magnetic-domain state in the X direction by a synergistic effect of the exchange interaction with the ferromagnetic layers 30 and the longitudinal bias magnetic fields from the hard bias layers 18. When compared with conventional art in which the free magnetic layer is put into a single-magnetic-domain state solely by the longitudinal bias magnetic field from hard bias layers or solely by the exchange coupling magnetic fields by second antiferromagnetic layers, magnetization directions of the side portions 15a of the free magnetic layer 15 can be reliably pinned.

The components other than those described above are the same as those of the second embodiment shown in FIG. 2. In the fourth embodiment shown in FIG. 4, the ferromagnetic layers 30 overlay the center region of the top face of the composite film 10. Alternatively, the ferromagnetic layers 30 may not be disposed on the composite film 10 in the center region. Note that when the ferromagnetic layers 30 overlay the center region of the composite film 10, the etching process in the fabrication method described below does not affect the center region 15b of the free magnetic layer 15. Thus, the ferromagnetic layers 30 are preferably formed to overlay the center region of the composite film 10. The thickness of the ferromagnetic layers 30 in the center region may be smaller than the thickness of the ferromagnetic layers 30 in the side regions and smaller than the thickness of the ferromagnetic layers 30 on the hard bias layers 18.

Although no nonmagnetic layer 20 is formed on the free magnetic layer 15 in FIG. 4, the nonmagnetic layer 20 may be formed on the free magnetic layer 15, as indicated by a broken line. In such a case, the nonmagnetic layer 20 covers the entire top face of the free magnetic layer 15 and has a thickness of 3 Å or less.

Fifth Embodiment

Figure 5:
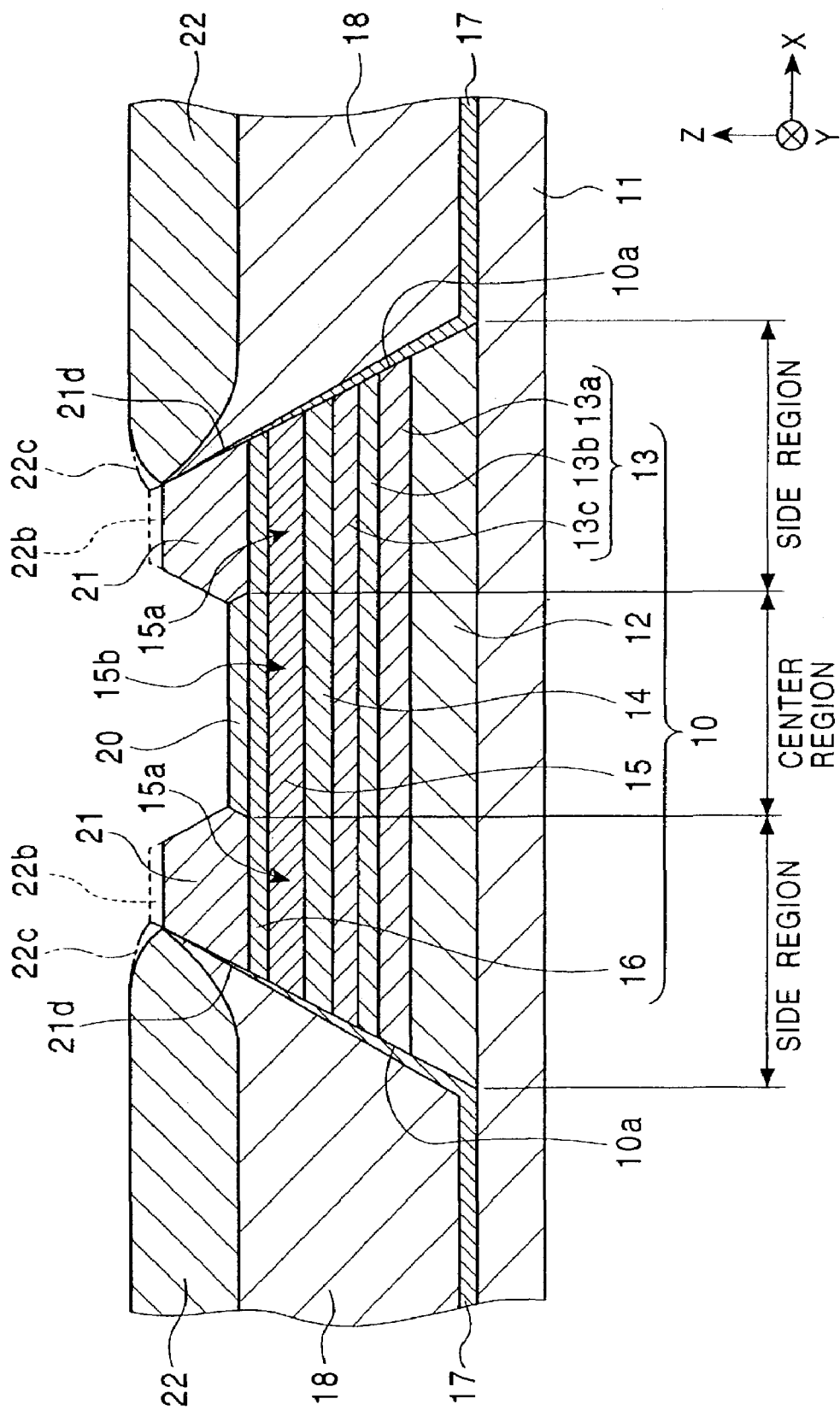
FIG. 5 is a partial cross-sectional view of a magnetic sensing element according to a fifth embodiment of the present invention viewed from the opposing face.

FIG. 5 is a partial cross-sectional view of a magnetic sensing element according to a fifth embodiment of the present invention viewed from the opposing face.

The structure of the composite film 10 is the same as those shown in FIGS. 1 and 2. In particular, the composite film 10 is constituted from the first antiferromagnetic layer 12, the pinned magnetic layer 13, the nonmagnetic material layer 14, the free magnetic layer 15, and the third antiferromagnetic layer 16.

As in the third and fourth embodiments shown in FIGS. 3 and 4, the magnetic sensing element of this embodiment may have no third antiferromagnetic layer 16 and but may instead have the ferromagnetic layers 30 disposed between the free magnetic layer 15 and the second antiferromagnetic layers 21.

In this embodiment, the nonmagnetic layer 20 is formed on the composite film 10 in the center region, and the second antiferromagnetic layers 21 are formed on the composite film 10 in the side regions, as shown in FIG. 5.

Referring again to FIG. 5, the side faces 10a of the composite film 10 are flush with side faces 21d of the second antiferromagnetic layers 21. This structure is unlike the first to fourth embodiments shown in FIGS. 1 to 4 comprising second antiferromagnetic layers 21 extending beyond the side faces 10a of the composite film 10 along the axis of the track width direction (the X direction).

In this embodiment, the bias underlayers 17 are formed on the portions of the substrate 11 not overlaid by the composite film 10 and over the side faces 10a of the composite film 10 and the side faces 21d of the second antiferromagnetic layers 21. The hard bias layers 18 and the first antiferromagnetic layers 22 are formed on the bias underlayers 17, as shown in FIG. 5.

In this embodiment, the side portions 15a of the free magnetic layer 15 can be properly put into a single-magnetic-domain state in the X direction by a synergistic effect of the exchange coupling magnetic fields between the second antiferromagnetic layers 21 and the third antiferromagnetic layer 16 and the longitudinal bias magnetic fields from the hard bias layers 18. When compared with conventional art in which the free magnetic layer is put into a single-magnetic-domain state solely by the longitudinal bias magnetic field from hard bias layers or solely by the exchange coupling magnetic fields by second antiferromagnetic layers, magnetization directions of the side portions 15a of the free magnetic layer 15 can be reliably pinned.

As shown in FIG. 5, the electrode layers 22 of this embodiment do not extend beyond the hard bias layers 18. Alternatively, tips 22b of the electrode layers 22 may be extended to overlay the top faces of the second antiferromagnetic layers 21, as indicated by broken lines in FIG. 5. In such a case, portions 22c of the first antiferromagnetic layers 22 on the hard bias layers 18 indicated by a one-dot broken lines in FIG. 5 must be electrically connected to the tips 22b on the second antiferromagnetic layers 21. This is because the tips 22b on the second antiferromagnetic layer 21 are formed by a step separate from the step of forming the portions 22c of the first antiferromagnetic layers 22 on the second antiferromagnetic layers 21.

When the tips 22b of the first antiferromagnetic layer 22 overlay the second antiferromagnetic layers 21, the ratio of a sensing current shunting into the side regions of the composite film 10 becomes smaller, and side reading can be effectively prevented. Thus, the output can be increased.

Sixth Embodiment

Figure 6:
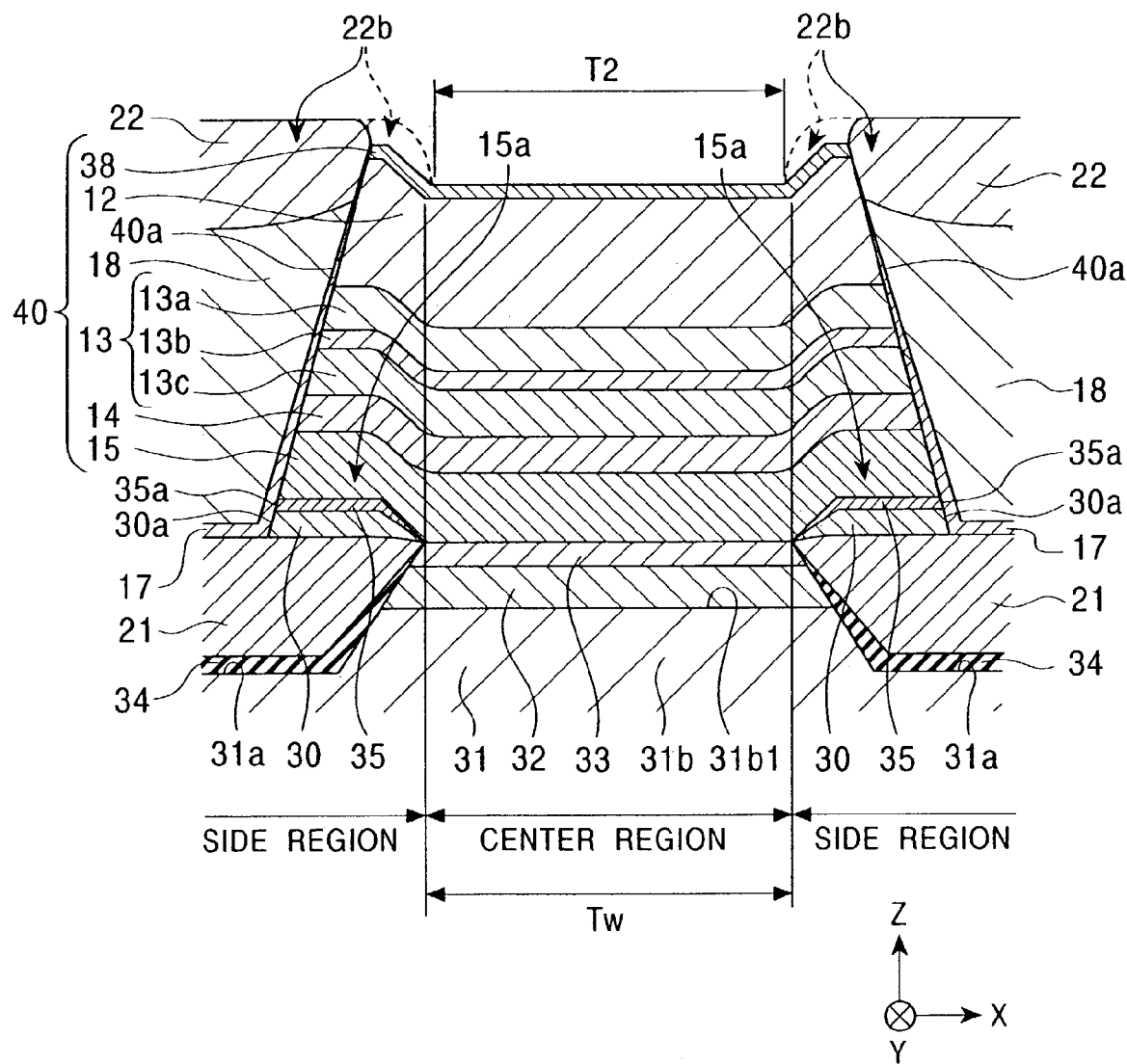
FIG. 6 is a partial cross-sectional view of a magnetic sensing element according to a sixth embodiment of the present invention viewed from the opposing face.

FIG. 6 is a partial cross-sectional view of a magnetic sensing element according to a sixth embodiment of the present invention viewed from the opposing face.

As shown in FIG. 6, the magnetic sensing element includes a lower shield layer 31 at the bottom. The lower shield layer 31 has a protruding portion 31b and flat portions 31a at the sides of the protruding portion 31b. A lower gap layer 32 and a seed layer 33 are disposed on a top face 31b1 of the protruding portion 31b. Insulating layers 34 are formed on the flat portions 31a, and second antiferromagnetic layers 21 are formed on the insulating layers 34. Ferromagnetic layers 30 are formed on the second antiferromagnetic layers 21, and nonmagnetic layers 35 are formed on the ferromagnetic layers 30. As shown in FIG. 6, the gap between the top faces of the second antiferromagnetic layers 21 in the track width direction defines the track width Tw (optical track width).

A composite film 40 is formed on the nonmagnetic layers 35 and the seed layer 33. The composite film 40 comprises a free magnetic layer 15, a nonmagnetic material layer 14, a pinned magnetic layer 13, a first antiferromagnetic layer 12, and a protective layer 38. The pinned magnetic layer 13 is of a synthetic ferrimagnetic type comprising a second pinned magnetic sublayer 13c, a nonmagnetic interlayer 13b, and a first pinned magnetic sublayer 13a.

Referring again to FIG. 6, two side faces 40a of the composite film 40 in the track width direction (the X direction) are formed to be flush with side faces 35a of the nonmagnetic layers 35 and side faces 30a of the ferromagnetic layers 30 by etching. The side faces 40a, 35a, and 30a are formed as flat or curved slopes so that the width of the composite film 40 in the track width direction gradually decreases along the Z direction.

As shown in FIG. 6, the second antiferromagnetic layers 21 have portions not overlaid by the composite film 40. Bias underlayers 17 are formed over the portions of the second antiferromagnetic layers 21 not overlaid by the composite film 40 and the side faces 40a, 35a, and 30a of the composite film 40, the nonmagnetic layers 35, and the ferromagnetic layers 30. Hard bias layers 18 are disposed on the bias underlayers 17, and electrode layers 22 are formed on the hard bias layers 18.

The embodiment shown in FIG. 6 differs from those shown in FIGS. 1 to 5 in that the layer structure of the composite film 40 is inverted compared to that of the composite film 10 shown in FIGS. 1 to 5.

The same components are represented by the same reference numerals in FIG. 6 as in FIGS. 1 to 5. The materials of the components represented by the same reference numeral are the same as those previously described.

The lower shield layer 31 shown in FIG. 6 is composed of a magnetic material such as NiFe. The nonmagnetic layer 32 and the insulating layers 34 are composed of an insulating material such as alumina ($Al_2O_3$) or $SiO_2$.

The seed layer 33 is composed of a nonmagnetic material, such as chromium, having a body-centered cubic (bcc) structure, a NiFeCr alloy having a face-centered cubic (fcc) structure, or tantalum having a structure nearly amorphous. The seed layer 33 controls the crystal orientation of the free magnetic layer 15, improves the soft magnetic properties, and decreases the specific resistance.

Note that the seed layer 33 may be also provided between the substrate 11 and the first antiferromagnetic layer 12 in each of the first to fifth embodiments shown in FIGS. 1 to 5.

In the embodiment shown in FIG. 6, exchange coupling magnetic fields are generated between the second antiferromagnetic layers 21 and the ferromagnetic layers 30 and pin the magnetization directions of the ferromagnetic layers 30 in the track width direction (the X direction). The side portions 15a of the free magnetic layer 15 can be properly put into a single-magnetic-domain state in the X direction by a synergistic effect of the exchange interaction with the ferromagnetic layers 30 and the longitudinal bias magnetic fields from the hard bias layers 18. When compared with conventional art in which the free magnetic layer is put into a single-magnetic-domain state solely by the longitudinal bias magnetic field from hard bias layers or solely by the exchange coupling magnetic fields by second antiferromagnetic layers, magnetization directions of the side portions 15a of the free magnetic layer 15 can be reliably pinned.

In the embodiment shown in FIG. 6, exchange coupling magnetic fields are generated between the ferromagnetic layers 30 and the second antiferromagnetic layers 21 and pin the magnetization directions of the ferromagnetic layers 30 in the track width direction (the X direction). In this manner, the side portions 15a of the free magnetic layer 15 in the side regions become magnetically connected to the ferromagnetic layers 30 either by a Ruderman-Kittel-Kasuya-Yosida (RKKY) interaction or by a direct exchange interaction occurring through pinholes in the nonmagnetic layers 35. As a result, the free magnetic layer 15 is put into a single-magnetic-domain state. In the magnetic sensing element shown in FIG. 6, the thickness of the nonmagnetic layers 35 is 6 to 11 Å. The magnetization direction of the free magnetic layer 15 is oriented antiparallel to the track width direction, i.e., antiparallel to the X direction.

The magnetization direction of the free magnetic layer 15 may be made parallel to the magnetization direction of the ferromagnetic layers 30 by adjusting the thickness of the nonmagnetic layers 35 to at least 0.5 Å but less than 6 Å.

The insulating layers 34 between the lower shield layer 31 and the second antiferromagnetic layers 21 decrease the shunt loss of a sensing current flowing into the lower shield layer.

Referring again to FIG. 6, tips 22b of the electrode layers 22 are placed against the side faces 40a of the composite film 40 and do not overlay the top face of the composite film 40. Alternatively, as shown by broken lines in FIG. 6, the tips 22b of the first antiferromagnetic layer 22 may be formed to overlap the top face of the composite film 40. In such a case, however, the distance T2 between the tips 22b is preferably equal to or less than the distance between the top faces of the second antiferromagnetic layers 21, i.e., the track width Tw. In this manner, the ratio of the sensing current shunting into the portions of the composite film 40 in the side regions can be decreased, and a sensing current can be properly fed to the entire track width Tw region. As a result, side reading can be properly inhibited, and a magnetic sensing element with large output can be fabricated.

Seventh Embodiment

Figure 7:
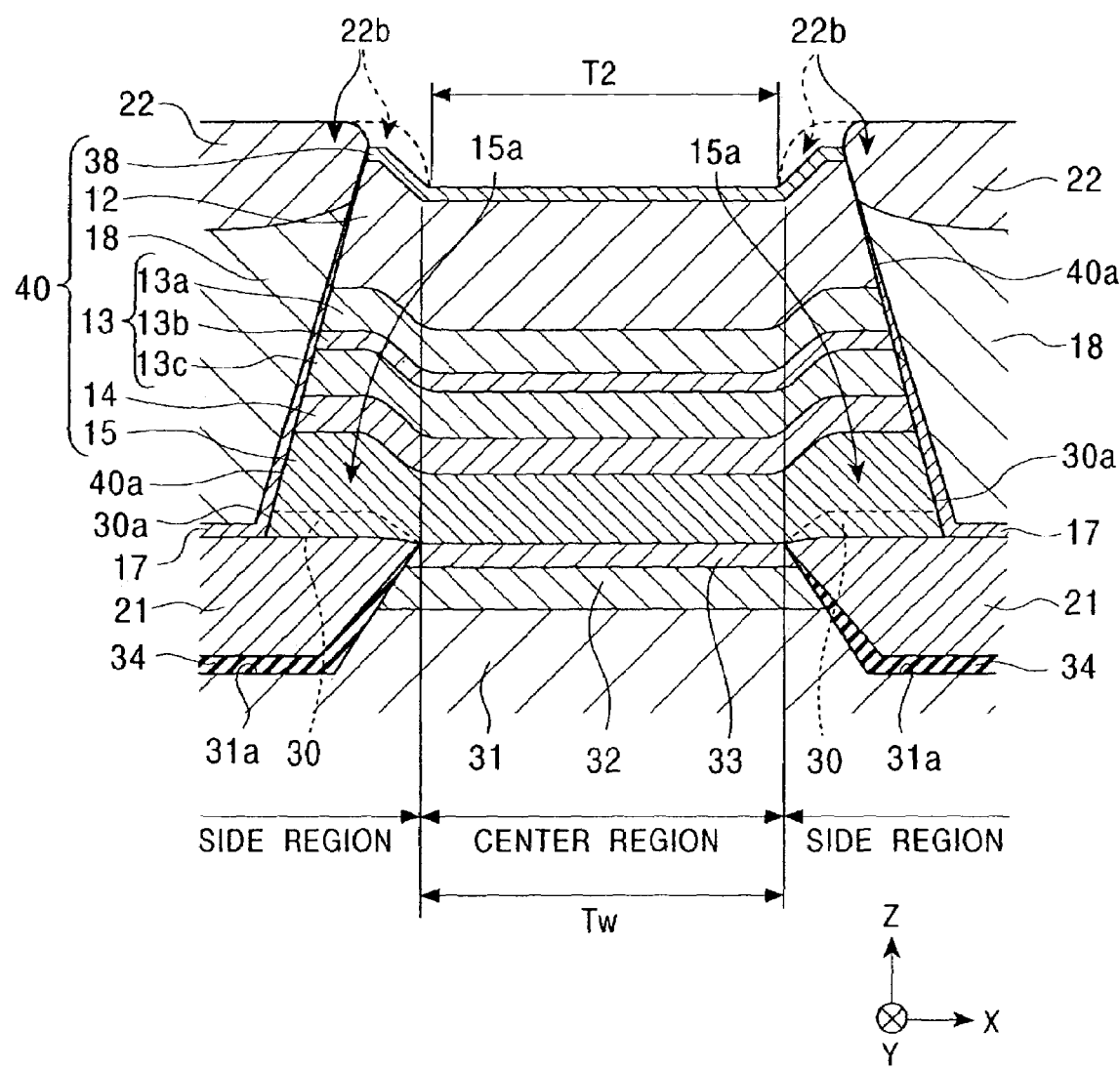
FIG. 7 is a partial cross-sectional view of a magnetic sensing element according to a seventh embodiment of the present invention viewed from the opposing face.

FIG. 7 is a partial cross-sectional view of a magnetic sensing element according to a seventh embodiment of the present invention viewed from the opposing face.

The magnetic sensing element of the seventh embodiment has a structure similar to that of the sixth embodiment. Although the nonmagnetic layers 35 are disposed between the free magnetic layer 15 and the ferromagnetic layers 30 in the sixth embodiment, no nonmagnetic layers 35 are provided in the seventh embodiment, as shown in FIG. 7. As shown in FIG. 7, the ferromagnetic layers 30 are integral with the free magnetic layer 15.

Referring to FIG. 7, exchange coupling magnetic fields are generated between the second antiferromagnetic layers 21 and the side portions 15a of the free magnetic layer 15. The side portions 15a of the free magnetic layer 15 function as the ferromagnetic layers 30, although they are integrated. The side portions 15a of the free magnetic layer 15 are properly put into a single-magnetic-domain state in the X direction by a synergetic effect of the above-described exchange coupling magnetic fields and the longitudinal bias magnetic fields from the hard bias layers 18. When compared with conventional art in which the free magnetic layer is put into a single-magnetic-domain state solely by the longitudinal bias magnetic field from hard bias layers or solely by the exchange coupling magnetic fields by second antiferromagnetic layers, magnetization directions of the side portions 15a of the free magnetic layer 15 can be reliably pinned.

Eighth Embodiment

Figure 8:
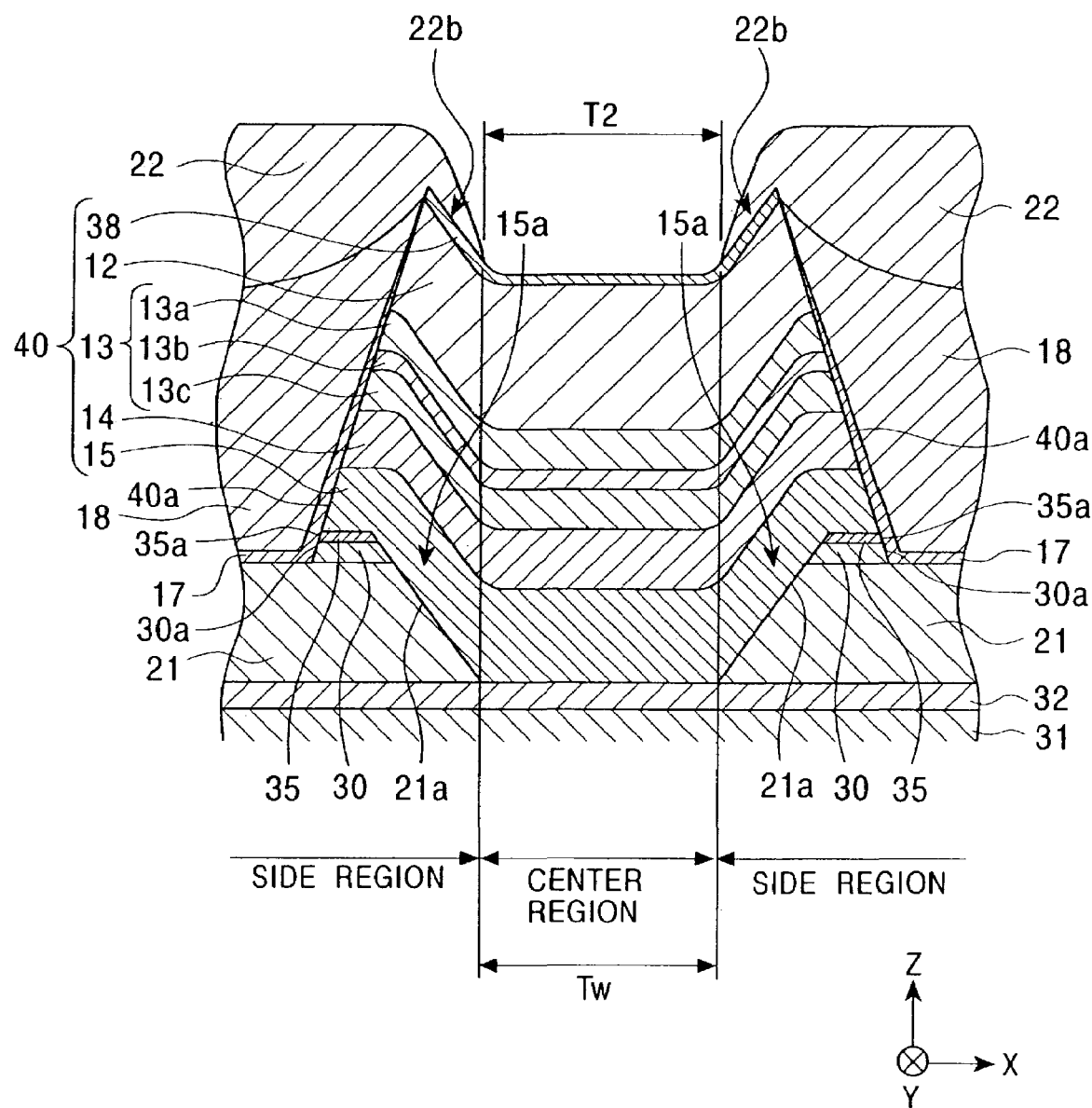
FIG. 8 is a partial cross-sectional view of a magnetic sensing element according to an eighth embodiment of the present invention viewed from the opposing face.

FIG. 8 is a partial cross-sectional view of a magnetic sensing element according to an eighth embodiment of the present invention viewed from the opposing face.

The structure of the magnetic sensing element of this embodiment is similar to that of the sixth embodiment shown in FIG. 6. The difference lies in the positions of the second antiferromagnetic layers 21.

Referring now to FIG. 8, the magnetic sensing element includes the lower shield layer 31 at the bottom. The nonmagnetic layer 32 is formed on the lower shield layer 31. The second antiferromagnetic layer 21 are disposed on the nonmagnetic layer 32 and are separated from each other by a gap corresponding to the track width Tw therebetween.

As shown in FIG. 8, the ferromagnetic layers 30 are deposited on the second antiferromagnetic layers 21, and the nonmagnetic layers 35 are deposited on the second antiferromagnetic layers 21. The free magnetic layer 15 is deposited over the nonmagnetic layers 35, end faces 21a of the second antiferromagnetic layer 21, and the nonmagnetic layer 32. The nonmagnetic material layer 14, the second pinned magnetic sublayer 13c, the nonmagnetic interlayer 13b, the first pinned magnetic sublayer 13a, and the first antiferromagnetic layer 12, and the protective layer 38 are sequentially stacked in that order on the free magnetic layer 15 so as to form the composite film 40. The second pinned magnetic sublayer 13c, the nonmagnetic interlayer 13b, and the first pinned magnetic sublayer 13a constitute the pinned magnetic layer 13 of a synthetic ferrimagnetically pinned type.

As shown in FIG. 8, each of the side faces 40a of the composite film 40 in the track width direction forms one continuous plane with the side face 30a of the ferromagnetic layer 30 and the side face 35a of the nonmagnetic layer 35 by etching. Each of the second antiferromagnetic layers 21 has a portion not overlaid by the composite film 40, and the bias underlayers 17 are formed over these portions of the second antiferromagnetic layers 21 and the side faces 40a of the composite film 40. The hard bias layers 18 are disposed on the bias underlayers 17. The electrode layers 22 are formed on the hard bias layers 18 in such a manner that the tips 22b of the electrode layers 22 overlap the top face of the composite film 40. The distance T2 between the tips 22b of the first antiferromagnetic layer 22 is either equal to or smaller than the track width Tw.

In the embodiment shown in FIG. 8, an exchange coupling magnetic field is generated between the second antiferromagnetic layer 21 and the ferromagnetic layer 30 and pins the magnetization direction of the ferromagnetic layer 30 in the track width direction (X direction). The side portions 15a of the free magnetic layer 15 can be properly put into a single-magnetic-domain state in the X direction by a synergistic effect of the exchange interaction with the ferromagnetic layers 30 and the longitudinal bias magnetic fields from the hard bias layers 18. When compared with conventional art in which the free magnetic layer is put into a single-magnetic-domain state solely by the longitudinal bias magnetic field from hard bias layers or solely by the exchange coupling magnetic fields by second antiferromagnetic layers, magnetization directions of the side portions 15a of the free magnetic layer 15 can be reliably pinned.

Ninth Embodiment

Figure 9:
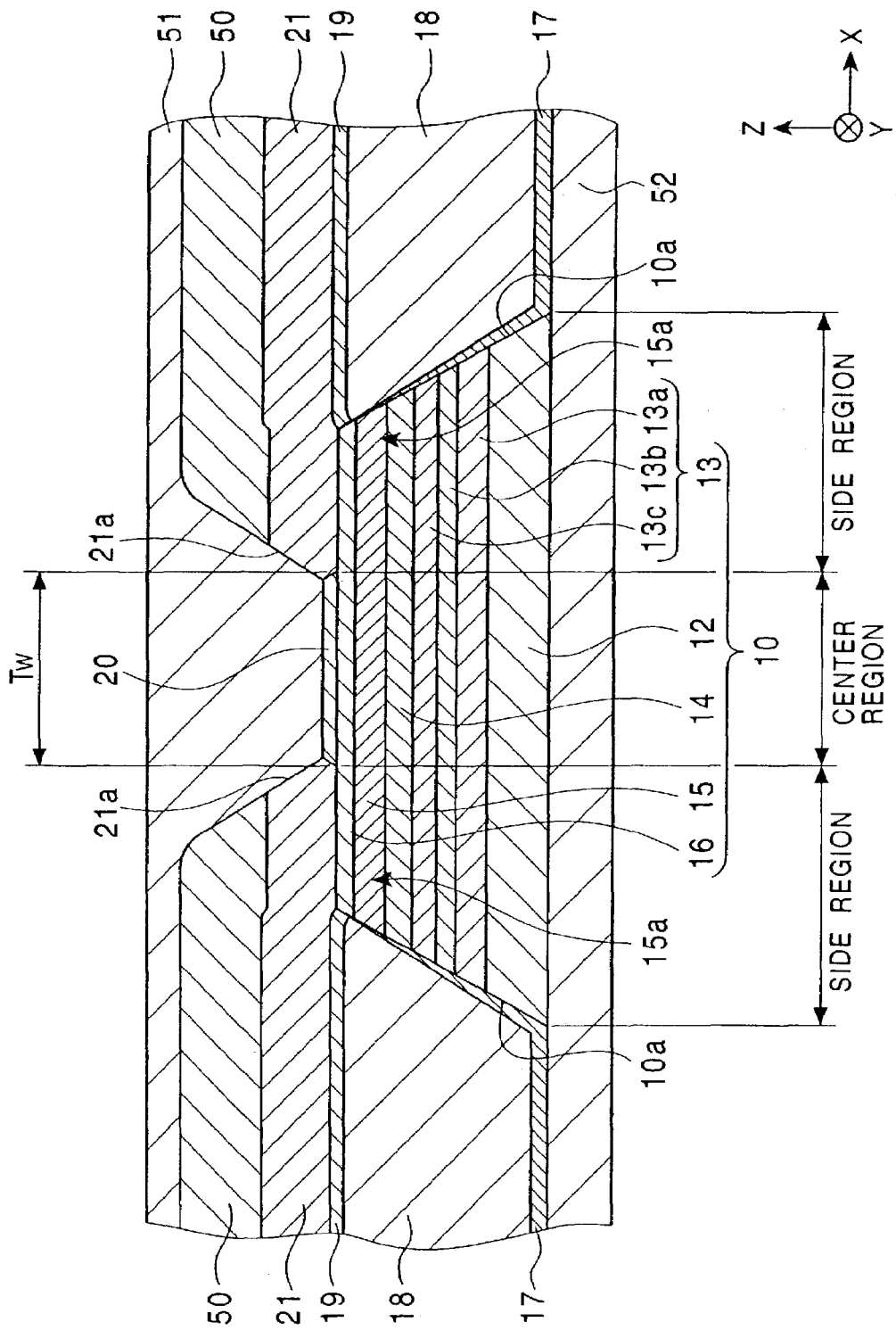
FIG. 9 is a partial cross-sectional view of a magnetic sensing element according to a ninth embodiment of the present invention viewed from the opposing face.

FIG. 9 is a partial cross-sectional view of a magnetic sensing element according to a ninth embodiment of the present invention viewed from the opposing face.

All of the magnetic sensing elements according to first to eighth embodiments shown in FIGS. 1 to 8 are of a current-in-the-plane (CIP) type in which the electrode layers 22 are formed at the two sides of the composite film 10 and the composite film 40 in the track width direction (the X direction) and a sensing current flows in a direction parallel to the surface of each layer constituting the composite films 10 and 40. The magnetic sensing element of the ninth embodiment is of a current-perpendicular-to-the-plane (CPP) type in which a sensing current flows in a direction perpendicular to the surface of each layer constituting the composite film 10, i.e., in the Z direction.

The structure of the composite film 10 and the positions of the hard bias layers 18 and the second antiferromagnetic layers 21 shown in FIG. 9 are the same as those of the first embodiment shown in FIG. 1. In the ninth embodiment, a lower electrode layer 52 is formed under the composite film 10. The lower electrode layer 52 also functions as a lower shield layer, for example. The lower electrode layer 52 extends beyond the composite film 10 along the X axis, and the bias underlayers 17 are formed over portions of the lower electrode layer 52 not overlaid by the composite film 10 and side faces 10a of the composite film 10. The hard bias layers 18 are formed on the bias underlayers 17.

An insulating layer 50 is formed on each of the second antiferromagnetic layer 21, as shown in FIG. 9. The insulating layer 50 is composed of $Al_2O_3$ or $SiO_2$, for example. Although the insulating layer 50 does not overlay the end face 21a of the second antiferromagnetic layer 21 in the embodiment shown in FIG. 9, the insulating layer 50 is preferably formed to extend over the end face 21a of the second antiferromagnetic layer 21 to properly reduce the shunt loss of the sensing current. In the embodiment shown in FIG. 9, an upper electrode layer 51 is formed over the insulating layers 50 and the nonmagnetic layer 20 formed on the composite film 10 in the center region. The upper electrode layer 51 also functions as an upper shield layer, for example.

As in the first embodiment shown in FIG. 1, the side portions 15a of the free magnetic layer 15 of the ninth embodiment can be properly put into a single-magnetic-domain state in the X direction by a synergistic effect of the exchange coupling magnetic fields between the second antiferromagnetic layers 21 and the third antiferromagnetic layer 16 and the longitudinal bias magnetic fields from the hard bias layers 18. When compared with conventional art in which the free magnetic layer is put into a single-magnetic-domain state solely by the longitudinal bias magnetic field from hard bias layers or solely by the exchange coupling magnetic fields by second antiferromagnetic layers, magnetization directions of the side portions 15a of the free magnetic layer 15 can be reliably pinned.

The CPP structure, i.e., forming shield electrode layers under and above the composite film 10 in the thickness direction, shown in FIG. 9 can be employed in any one of the second to eighth embodiments shown in FIGS. 2 to 8.

A method for making the magnetic sensing element shown in FIG. 1 will now be described.

Figure 11:
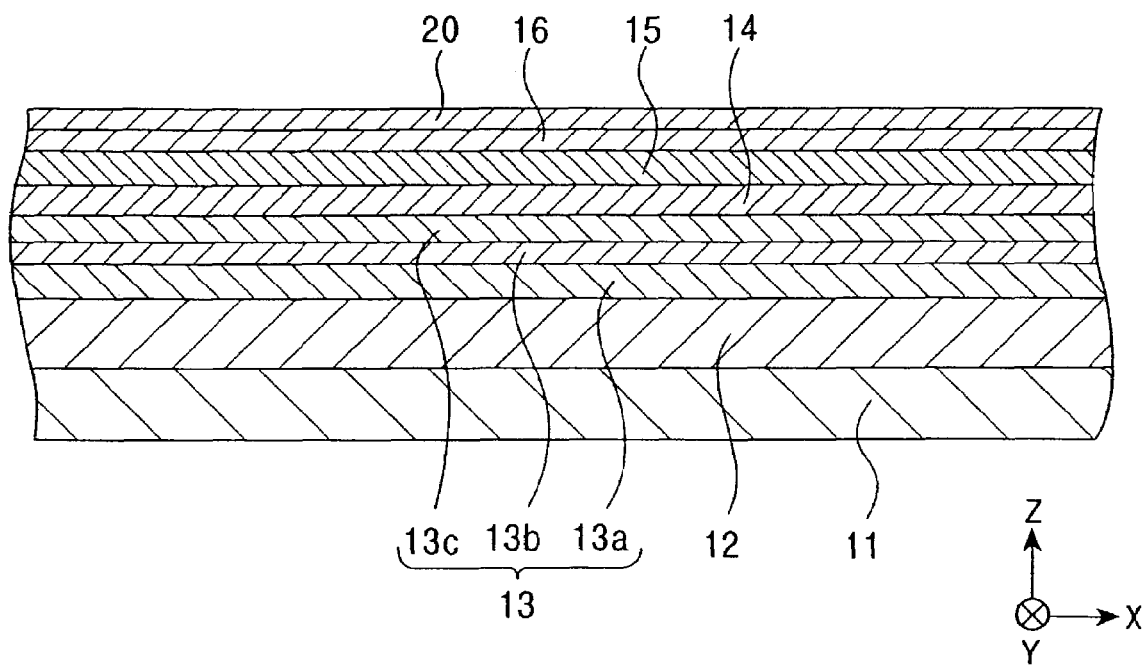
FIG. 11 shows a step of a method for making the magnetic sensing element shown in FIG. 1.

In the step shown in FIG. 11, the first antiferromagnetic layer 12 is deposited on the substrate 11. the first pinned magnetic sublayer 13a, the nonmagnetic interlayer 13b, and the second pinned magnetic sublayer 13c are sequentially deposited thereon to form the pinned magnetic layer 13. The nonmagnetic material layer 14, the free magnetic layer 15, the third antiferromagnetic layer 16, and the nonmagnetic layer 20 are then sequentially formed on the pinned magnetic layer 13 by a thin-film forming process such as sputtering or vapor deposition using the same vacuum deposition apparatus. Examples of sputtering methods include a DC magnetron sputtering method, a RF sputtering method, an ion beam sputtering method, a long throw sputtering method, and a collimation sputtering method. These methods may be employed alone or in combination.

The first antiferromagnetic layer 12 is formed using a PtMn alloy, X—Mn alloy, or Pt—Mn—X' alloy wherein X is at least one element selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr.

These alloys immediately after deposition have a disordered face-centered cubic (fcc) structure. They are transformed into a CuAuI-type ordered face-centered tetragonal (fct) structure by annealing.

The thickness of the first antiferromagnetic layer 12 is preferably in the range of 80 to 300 Å.

Next, a first field annealing is performed. While applying a first magnetic field in the Y direction perpendicular to the track width direction (the X direction), the deposited layers are annealed at a first annealing temperature to generate an exchange coupling magnetic field between the first antiferromagnetic layer 12 and the first pinned magnetic sublayer 13a. As a result, the magnetization direction of the first pinned magnetic sublayer 13a is pinned in the Y direction in the drawing. The magnetization direction of the second pinned magnetic sublayer 13c is pinned in a direction opposite to the Y direction by exchange coupling resulting from the RKKY interaction between the first pinned magnetic sublayer 13a and the second pinned magnetic sublayer 13c. For example, the first annealing temperature is 290° C., and the magnitude of the first magnetic field is 800 kA/m.

In the step shown in FIG. 11, the third antiferromagnetic layer 16 is preferably formed to have a thickness of 20 to 50 Å, and more preferably 30 to 40 Å.

The first characteristic feature of the step shown in FIG. 11 is to form the third antiferromagnetic layer 16 having a small thickness of 50 Å or less over the entire face of the free magnetic layer 15.

When the thickness of the third antiferromagnetic layer 16 is small, i.e., 50 Å or less, the third antiferromagnetic layer 16 exhibits nonantiferromagnetic properties. Thus, the third antiferromagnetic layer 16 is rarely transformed into an ordered structure even after the above-described field annealing. No exchange coupling magnetic field is generated between the third antiferromagnetic layer 16 and the free magnetic layer 15. If any exchange coupling magnetic field is generated therebetween, it is small. Accordingly, the magnetization direction of the free magnetic layer 15 is not as firmly as pinned as that of the pinned magnetic layer 13.

In the step shown in FIG. 11, the nonmagnetic layer 20 is dense and is rarely oxidized by exposure to air. For example, the nonmagnetic layer 20 is composed of at least one element selected from Ru, Re, Pd, Os, Ir, Pt, Au, Rh, and Cr.

The nonmagnetic layer 20 composed of a noble metal such as Ru is dense and rarely oxidized by exposure to air. Thus, the nonmagnetic layer 20 having a small thickness can still prevent the third antiferromagnetic layer 16 from being oxidized by exposure to air.

The second characteristic feature of the step shown in FIG. 11 is that the nonmagnetic layer 20 is deposited to a thickness of 3 to 10 Å. At such a small thickness, low-energy ion milling can be employed to remove portions of the nonmagnetic layer 20 in the side regions in a subsequent process. This improves milling controllability. Here, the definition of the low-energy ion milling is ion milling employing ion beams having a beam voltage (accelerating voltage) of less than 1,000 V. For example, a beam voltage of 100 to 500 V may be employed. In this embodiment, an Ar ion beam of 200 V is used.

Figure 12:
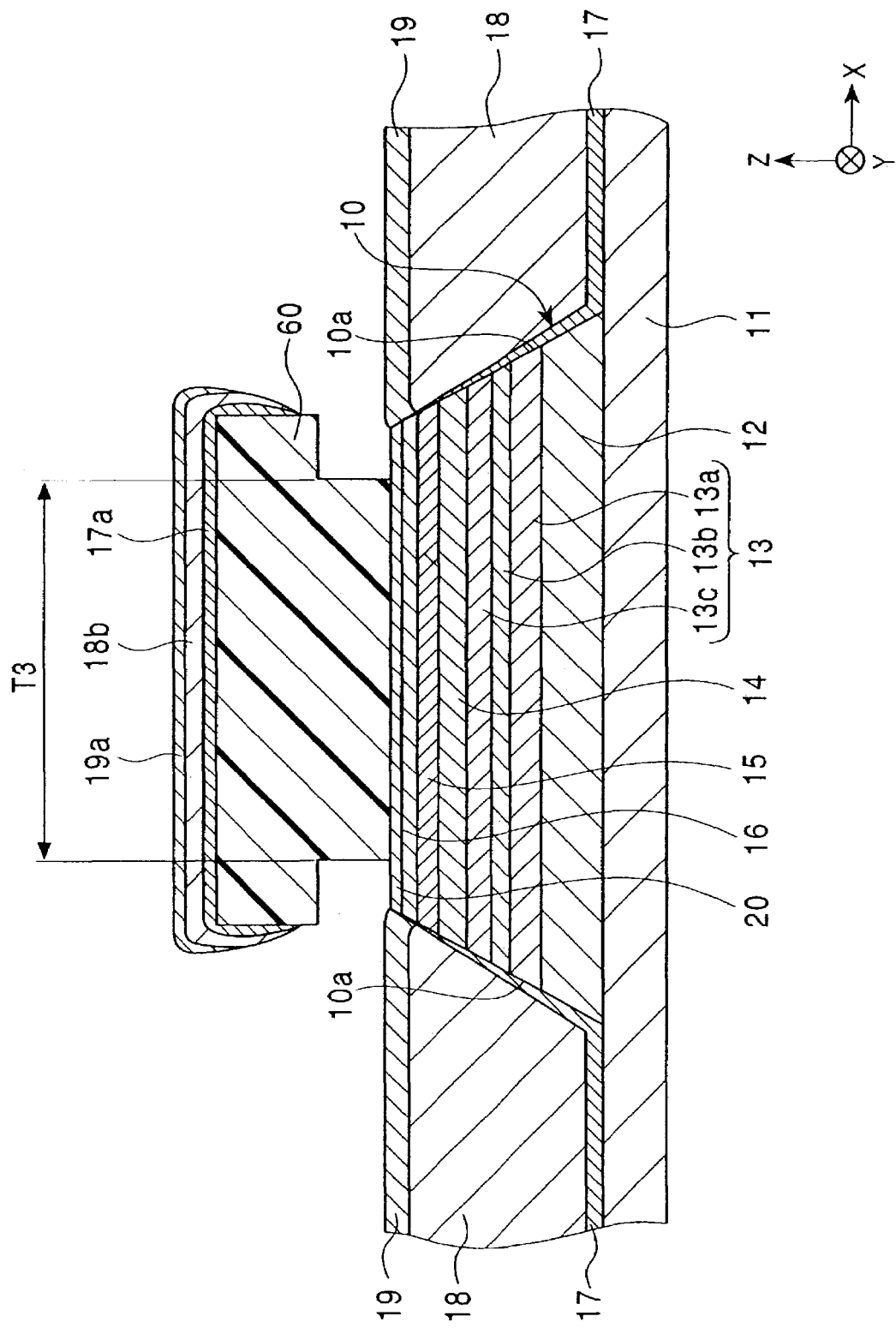
FIG. 12 shows a step subsequent to the step shown in FIG. 11.

In the step shown in FIG. 12, a resist layer 60 is formed on the top face of the nonmagnetic layer 20. The resist layer 60 is a lift-off resist, for example. The width of the resist layer 60 at the bottom in the track width direction (the X direction) is represented by T3.

Portions of the layers not covered with the resist layer 60 are removed by etching such as ion milling. As shown in FIG. 12, the side faces 10a of the composite film 10 constituted from side faces of the layers from the first antiferromagnetic layer 12 to the nonmagnetic layer 20 are formed as continuous planes. The side faces 10a of the composite film 10 are formed as flat or curved slopes so that the width of the composite film 10 in the track width direction (the X direction) gradually decreases along the Z direction in the drawing.

In the step shown in FIG. 12, the bias underlayers 17, the hard bias layers 18, and the separating layers 19 are sequentially formed over the side faces 10a of the composite film 10 and portions of the substrate 11 not overlaid by the composite film 10. The bias underlayers 17, the hard bias layer 18, and the separating layer 19 are formed using Cr, a CoPt alloy, and Ta, respectively, by sputtering, for example. During the course, an underlayer material layer 17a composed of the material for the bias underlayers 17, a bias material layer 18b composed of the material for the hard bias layer 18, and a nonmagnetic material layer 19b composed of the material for the separating layer 19 are deposited on the resist layer 60. These layers and the resist layer 60 are removed with an organic solvent.

Figure 13:
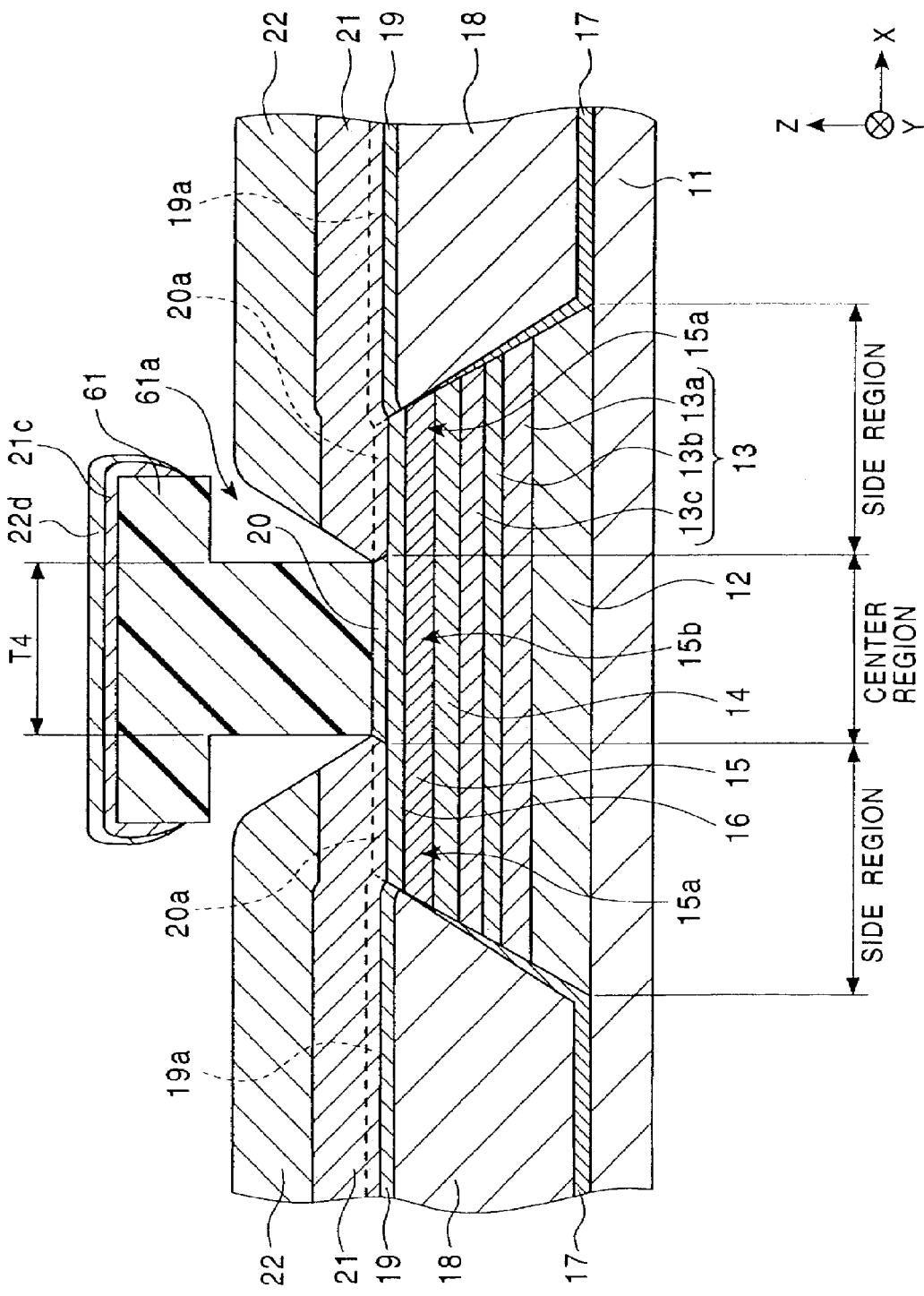
FIG. 13 shows a step subsequent to the step shown in FIG. 12.

In the step shown in FIG. 13, a resist layer 61, the width T4 of the bottom face in the track width direction of which is smaller than the width T3 shown in FIG. 11, is formed at the center of the nonmagnetic layer 20. The width T4 is either equal to or slightly smaller than the effective read track width determined in advance by the full-track profiling method described with reference to FIG. 10.

Side portions 20a of the nonmagnetic layer 20 and top faces 19a of the separating layers 19 not covered with the resist layer 61 are milled by ion milling. The separating layers 19 are milled partway. The side portions 20a of the nonmagnetic layer 20 may remain as long as the thickness thereof is 3 Å or less.

As described above, since the nonmagnetic layer 20 is composed of Ru or the like and is formed to have a small thickness of 3 to 10 Å, low-energy ion milling can be employed to remove the side portions 20a of the nonmagnetic layer 20. In this manner, the thickness of the side portions 20a can be made significantly small. Even when the side portions 20a of the nonmagnetic layer 20 are completely removed by ion milling, the surface of the third antiferromagnetic layer 16 in the side regions exposed by the milling is rarely damaged. Accordingly, the third antiferromagnetic layer 16 and the second antiferromagnetic layer 21 can properly function as one antiferromagnetic layer, as described below. Moreover, even when the side portions 20a of the nonmagnetic layer 20 are completely removed, a nonmagnetic element such as Ru, Re, Pd, Os, Ir, Pt, Au, Rh, or Cr sometimes exists between each third antiferromagnetic layer 16 and each second antiferromagnetic layer 21 after completion of the fabrication process under observation by secondary ion mass spectrometry (SIMS). These nonmagnetic elements do not degrade the properties of the antiferromagnetic layers even when they become mixed with the constituent elements of the antiferromagnetic layers. The presence of a nonmagnetic element such as Ru at the interface between each second antiferromagnetic layer 21 and each third antiferromagnetic layer 16 means that the fabrication method of the present invention has been employed.

Next, in the step shown in FIG. 13, the second antiferromagnetic layers 21 are formed over the separating layers 19 and the third antiferromagnetic layer 16 in the side regions when no nonmagnetic layer 20 are formed in the side regions. When the side portions 20a of the nonmagnetic layer 20 partly remain in the side regions, the second antiferromagnetic layers 21 are formed over the side portions 20a of the nonmagnetic layer 20 and the separating layers 19. The electrode layers 22 are then formed on the second antiferromagnetic layers 21. The second antiferromagnetic layers 21 and the electrode layers 22 are formed by sputtering at such an angle with respect to an axis normal to the surface of the substrate 11 that the second antiferromagnetic layers 21 and the electrode layers 22 are deposited inside voids 61a at the lower part of the resist layer 61.

Because the thickness of the side portions 20a of the nonmagnetic layer 20 is small, i.e., 3 Å at most, antiferromagnetic interactions can still be produced between the second antiferromagnetic layers 21 and the third antiferromagnetic layer 16 in the side regions. As a result, each second antiferromagnetic layer 21 and each side portion of the third antiferromagnetic layer 16 can function as a single antiferromagnetic layer.

After removing the resist layer 61, the layers up to the electrode layers 22 are subjected to second field annealing. In the second field annealing, a magnetic field having a magnitude smaller than the exchange anisotropic magnetic field of the first antiferromagnetic layer 12 is applied in the track width direction (the X direction). The annealing temperature is lower than the blocking temperature of the first antiferromagnetic layer 12. The magnitude of the applied magnetic field is preferably greater than the coercive force of the free magnetic layer 15 but smaller than the spin-flop magnetic field between the second pinned magnetic sublayer 13c and the first pinned magnetic sublayer 13a.

In this manner, the exchange anisotropic magnetic field between each second antiferromagnetic layer 21 and each side portion of the third antiferromagnetic layer 16 can be oriented in the track width direction (the X direction) without having to change the exchange anisotropic magnetic field of the first antiferromagnetic layer 12 oriented in the height direction (the Y direction). The magnetization directions of the side portions 15a of the free magnetic layer 15 are properly and firmly pinned in the track width direction (the X direction) by the exchange coupling magnetic fields in the track width direction (the X direction) resulting from the second field annealing and the longitudinal bias magnetic fields from the hard bias layers 18. Meanwhile, the center region 15b of the free magnetic layer 15 is moderately put into a single-magnetic-domain state so that the magnetization can rotate in response to an external magnetic field.

As shown in FIG. 13, during deposition of the second antiferromagnetic layers 21 and the electrode layers 22, an antiferromagnetic material layer 21c composed of the same material for the second antiferromagnetic layer 21 and an electrode material layer 22d composed of the same material for the electrode layers 22 are formed on the resist layer 61. These layers and the resist layer 61 are removed prior to the second field annealing. In this manner, the magnetic sensing element shown in FIG. 1 is formed.

Figure 14:
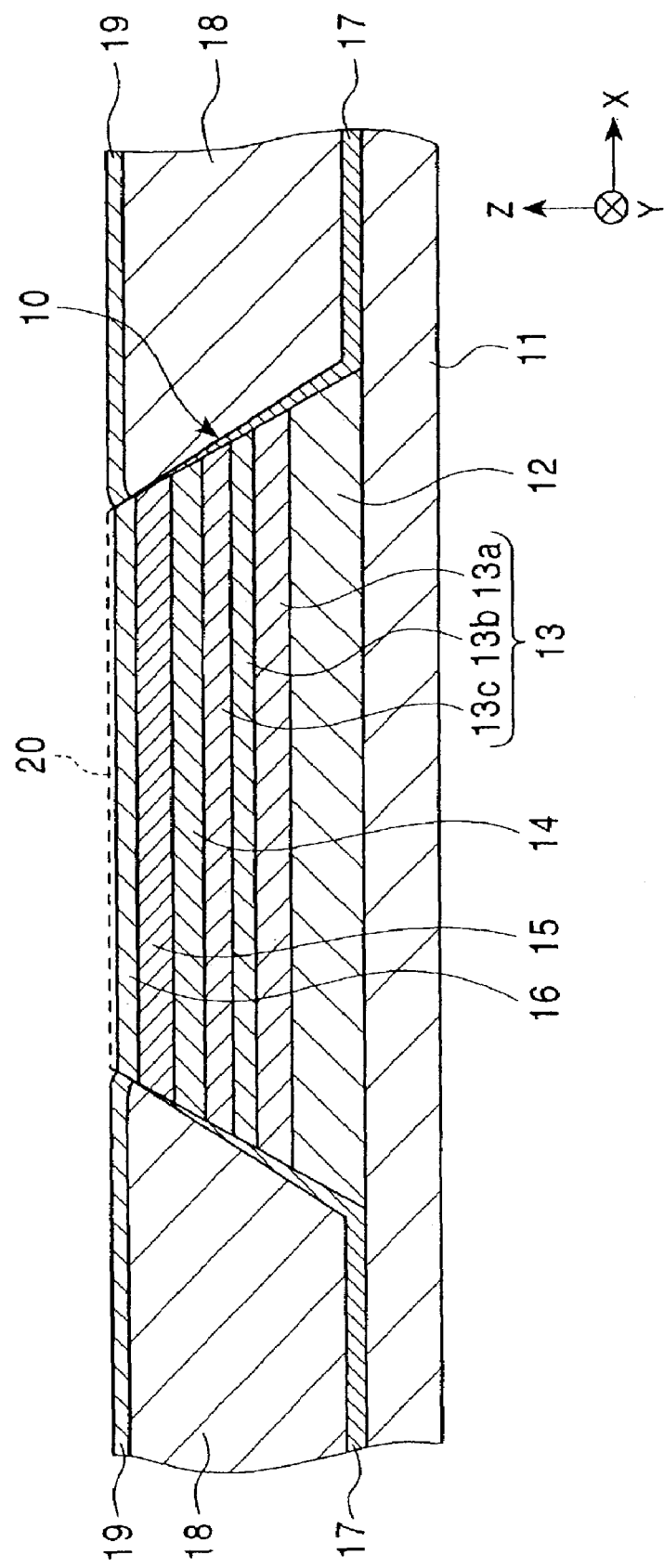
FIG. 14 shows a step of a method for making the magnetic sensing element shown in FIG. 2.
Figure 15:
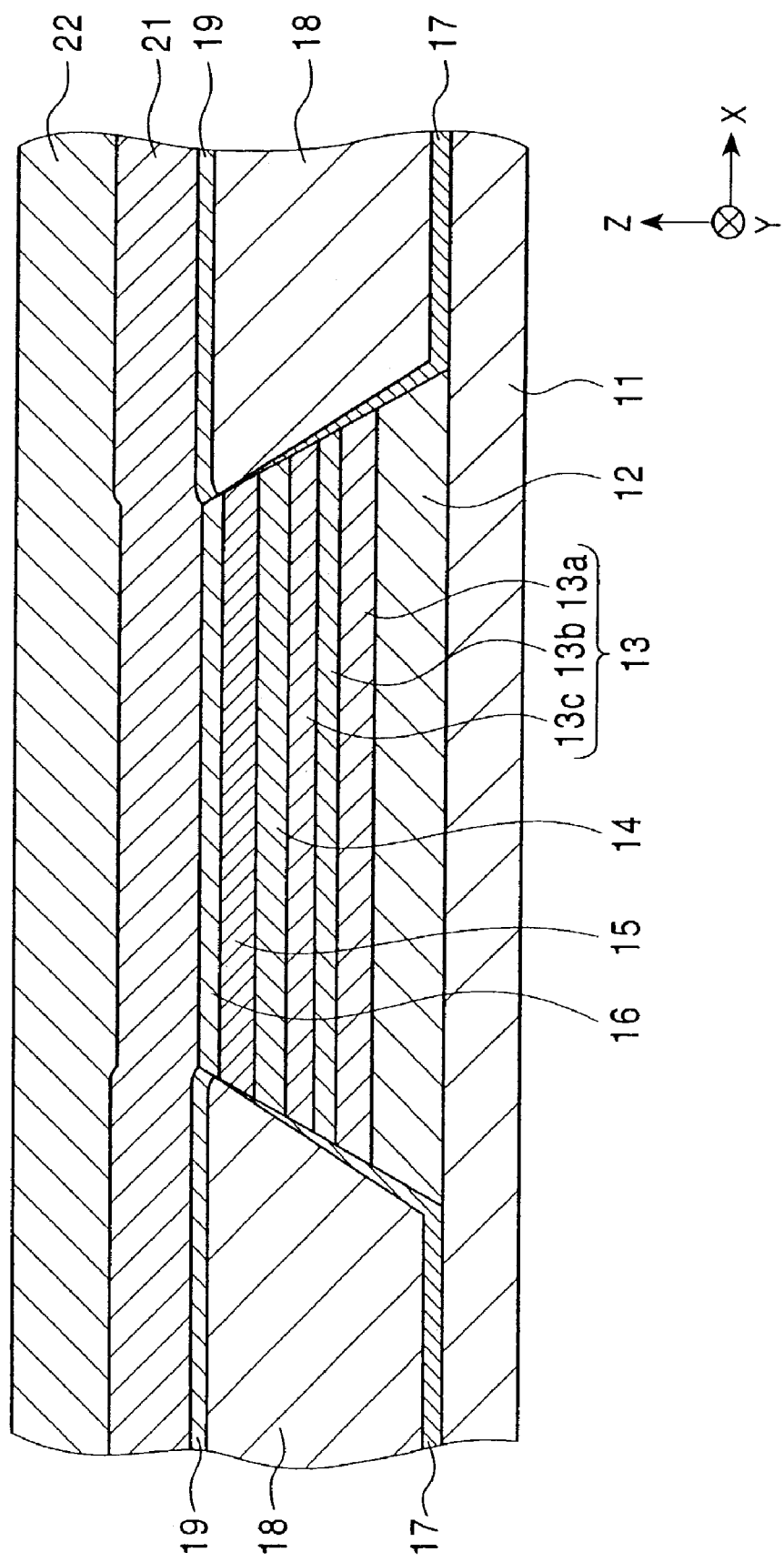
FIG. 15 shows a step subsequent to the step shown in FIG. 14.
Figure 16:
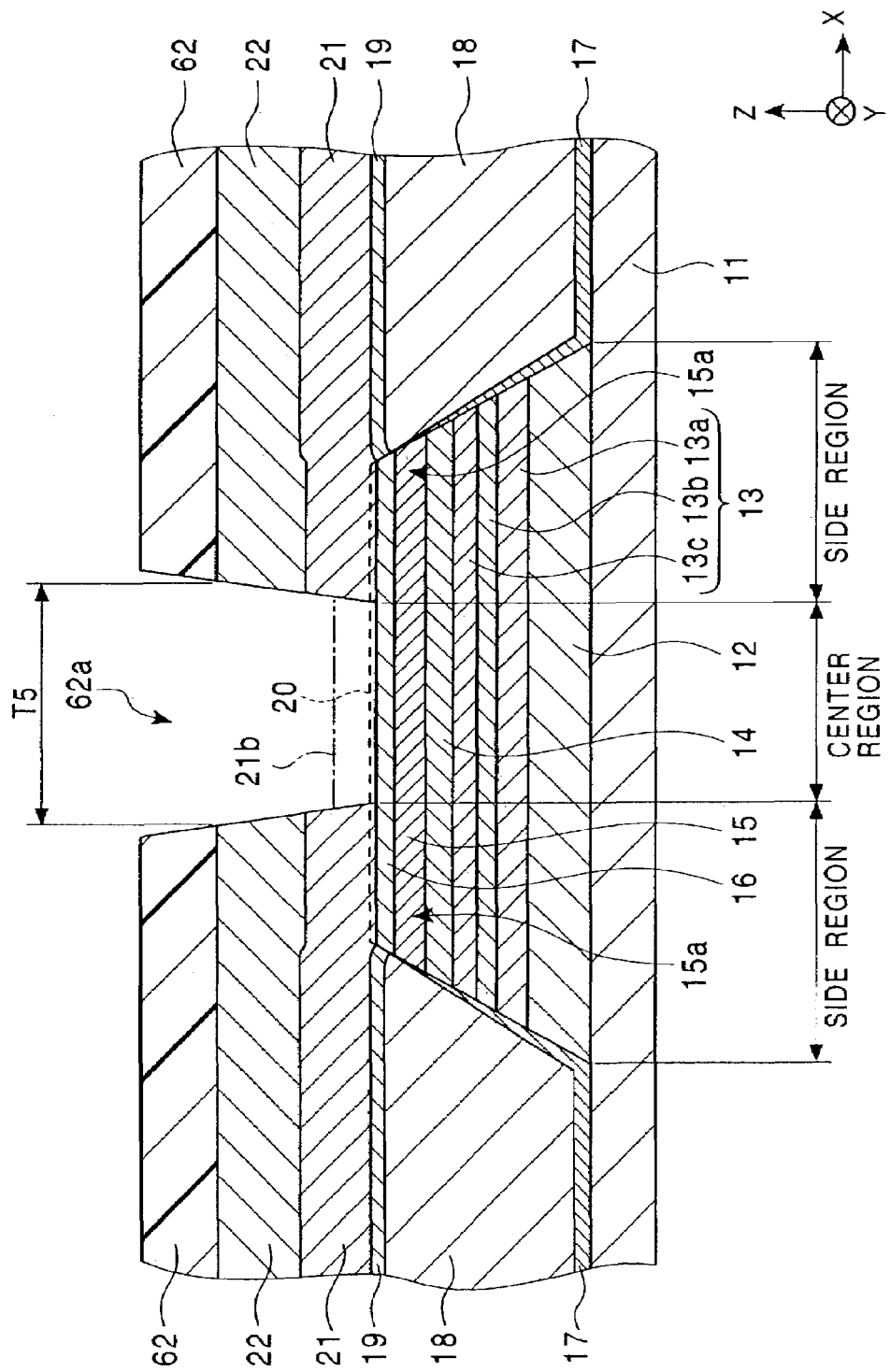
FIG. 16 shows a step subsequent to the step shown in FIG. 15.

FIGS. 14 to 16 show steps of a method for making the magnetic sensing element shown in FIG. 2. The method for making the magnetic sensing element shown in FIG. 2 will now be described.

First, the steps shown in FIGS. 11 and 12 are performed. Here, after the step shown in FIG. 11, first field annealing described above is performed. Without forming the resist layer 61 as in FIG. 13, the nonmagnetic layer 20 and part of the separating layer 19 are milled by ion milling. The nonmagnetic layer 20 may be completely removed, as shown in FIG. 14, or may be partly left, as indicated by a broken line in FIG. 14. As is previously described in the step shown in FIG. 11, the nonmagnetic layer 20 is composed of a material, such as Ru, not easily oxidizable and has a small thickness, i.e., 3 to 10 Å. Thus, low-energy ion milling can be employed to mill the nonmagnetic layer 20. The damage to the third antiferromagnetic layer 16 underneath the nonmagnetic layer 20 is minimized even when the nonmagnetic layer 20 is completely removed. When the nonmagnetic layer 20 is to remain on the third antiferromagnetic layer 16, the thickness of the nonmagnetic layer 20 should be 3 Å or less.

Next, in the step shown in FIG. 15, the separating layer 19 is formed over the third antiferromagnetic layer 16 and the separating layers 19. When the nonmagnetic layer 20 partly remains on the third antiferromagnetic layer 16, the separating layer 19 is formed over the nonmagnetic layer 20 and the separating layers 19. The electrode layer 22 is formed on the second antiferromagnetic layer 21. The second antiferromagnetic layer 21 and the electrode layer 22 are formed by sputtering or the like.

Next, in the step shown in FIG. 16, a resist layer 62 is formed on the electrode layer 22. Subsequently, a hole 62a is formed at the center of the resist layer 62 in the drawing by development and exposure. In forming the hole 62a, the position thereof is aligned to coincide with the position of the center region of the composite film 10 in the track width direction (the X direction). Since the width T5 of the hole 62a in the track width direction (the X direction) determines the track width Tw, the width T5 of the hole 62a is adjusted to be about the same as the track width Tw in forming the hole 62a.

Part of the electrode layer 22 exposed by the hole 62a is removed by etching. Part of the second antiferromagnetic layer 21 exposed by the etching is also removed. After completely removing the part of the second antiferromagnetic layer 21 exposed at the hole 62a, either the surface of the third antiferromagnetic layer 16 or the surface of the nonmagnetic layer 20 remaining on the third antiferromagnetic layer 16 in the step shown in FIG. 15 becomes exposed at the hole. It should be noted here that the nonmagnetic layer 20 may be removed at the same as etching the center of the second antiferromagnetic layer 21.

Moreover, as indicated by a one-dot broken line in FIG. 16, the second antiferromagnetic layer 21b exposed at the hole 62a of the resist layer 62 may be left partly unetched. The sum of the thickness of the second antiferromagnetic layer 21b and the thickness of the third antiferromagnetic layer 16 underneath is preferably 50 Å or less. If the thickness of the antiferromagnetic layers on the composite film 10 in the center region is large, a large exchange coupling magnetic field is generated in the composite film 10 in the center region. As a result, the center region 15b of the free magnetic layer 15 cannot be moderately put into a single-magnetic-domain state and the magnetization thereof cannot rotate in response to an external magnetic field. Subsequently, the resist layer 62 shown in FIG. 16 is removed.

Second field annealing is then performed to generate exchange coupling magnetic fields between the side regions of the third antiferromagnetic layer 16 overlaid by the second antiferromagnetic layers 21 and the side portions 15a of the free magnetic layer 15. The magnetization directions of the side portions 15a of the free magnetic layer 15 can be properly and firmly pinned by these exchange coupling magnetic fields and the longitudinal bias magnetic fields from the hard bias layers 18. The conditions of the second field annealing are the same as those described in the step shown in FIG. 13. This step completes the process for making the magnetic sensing element shown in FIG. 2.

Figure 17:
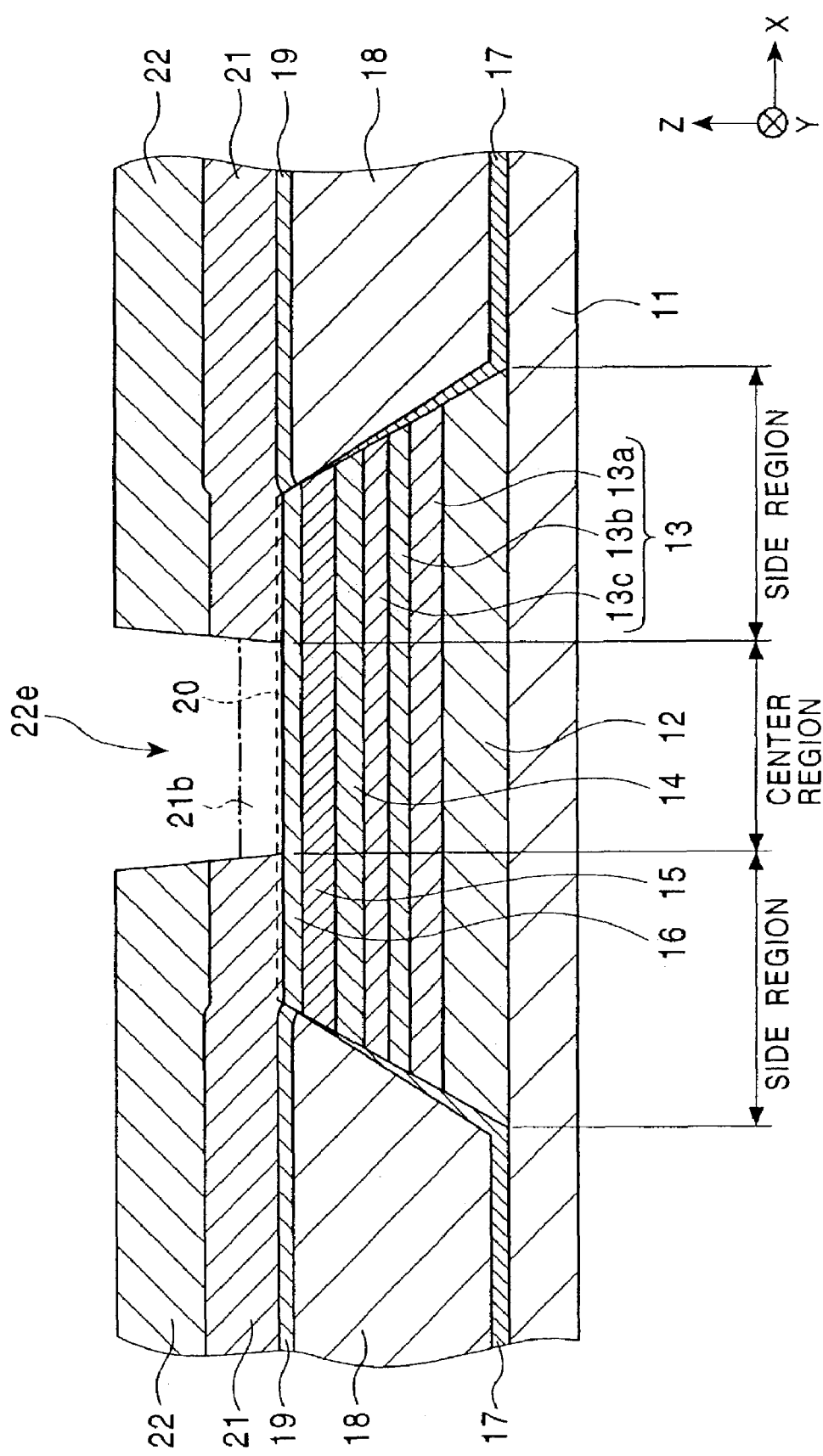
FIG. 17 shows a step that replaces the step shown in FIG. 16 according to another method.

The step shown in FIG. 17 may be performed instead of the step show in FIG. 16. In the step shown in FIG. 17, the electrode layer 22 having a hole 22e is formed on the second antiferromagnetic layer 21 formed by sputtering. Note that in forming the hole 22e, the position thereof is aligned to coincide with the position of the center region of the composite film 10 in the track width direction (the X direction).

The hole 22e may be formed by placing a resist layer on the second antiferromagnetic layer 21 at the position of the hole 22e, forming the electrode layers 22 on the second antiferromagnetic layer 21 at the two side regions not covered by the resist layer, and removing the resist layer. Alternatively, the hole 22e may be formed as in the step shown in FIG. 16, i.e., by placing the resist layer 62 having the hole 62a on the electrode layer 22 covering the entire surface of the second antiferromagnetic layer 21, forming the hole 22e by etching the electrode layer 22, and removing the resist layer 62.

Next, using the electrode layers 22 as mask layers, the center of the second antiferromagnetic layer 21 exposed at the hole 22e is removed by etching. At this time, part of the second antiferromagnetic layer 21b may remain, as shown by a one-dot broken line in FIG. 17. In such a case, the sum of the thickness of the second antiferromagnetic layer 21b and the thickness of the third antiferromagnetic layer 16 underneath is adjusted to be 50 Å or less.

It is essential in the step shown in FIG. 17 that the etching rate for etching the electrode layer 22 be lower than the etching rate for etching the second antiferromagnetic layer 21. This is because the electrode layers 22 are used as mask layers to remove, by etching, the second antiferromagnetic layer 21 exposed at the hole 22e. For example, Ar or the like is used as etching gas of ion milling, and a mixture of $CF_4$ and Ar or a mixture of $C_3F_8$ and Ar is used as the etching gas for reactive ion etching (RIE). The materials for the electrode layers 22 and the second antiferromagnetic layers 21 are selected such that the etching rate of the electrode layers 22 in these gasses is lower than the etching rate of the second antiferromagnetic layers 21 in these gasses. For example, this is achieved by using a PtMn alloy to form the second antiferromagnetic layer 21, using Ta to form the electrode layers 22, and using Ar gas as the etching gas in ion milling. The same can be achieved by forming the electrode layer 22 to have a Au/Ta two-layer structure.

Figure 18:
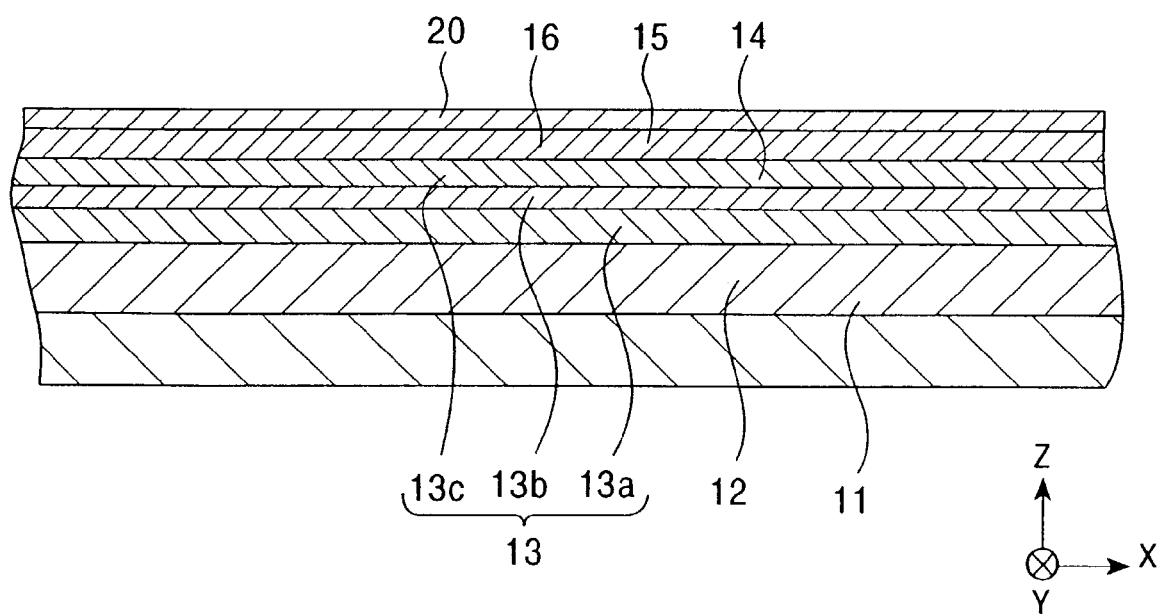
FIG. 18 shows a step for making the magnetic sensing element shown in FIG. 3.
Figure 19:
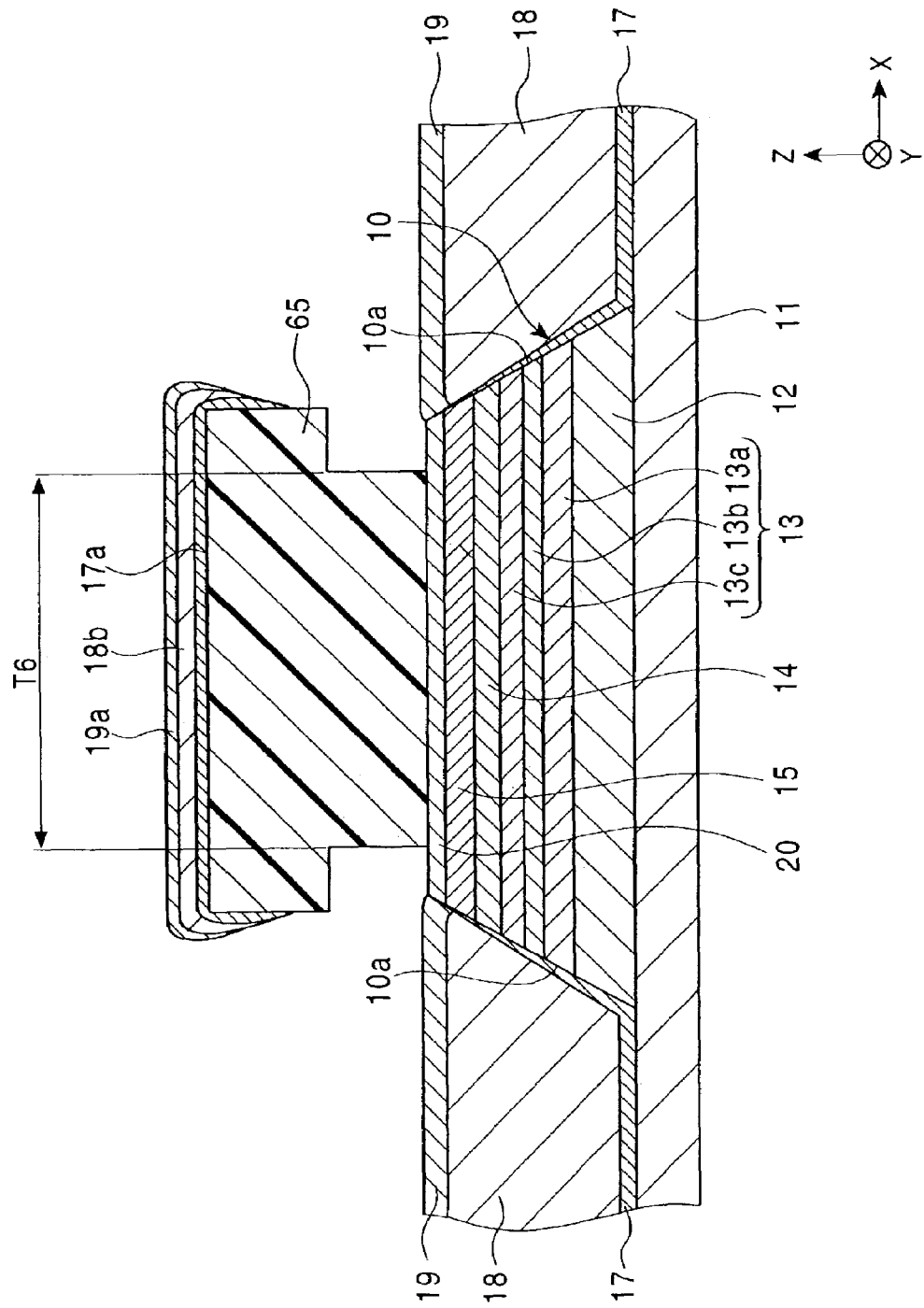
FIG. 19 shows a step subsequent to the step shown in FIG. 18.
Figure 20:
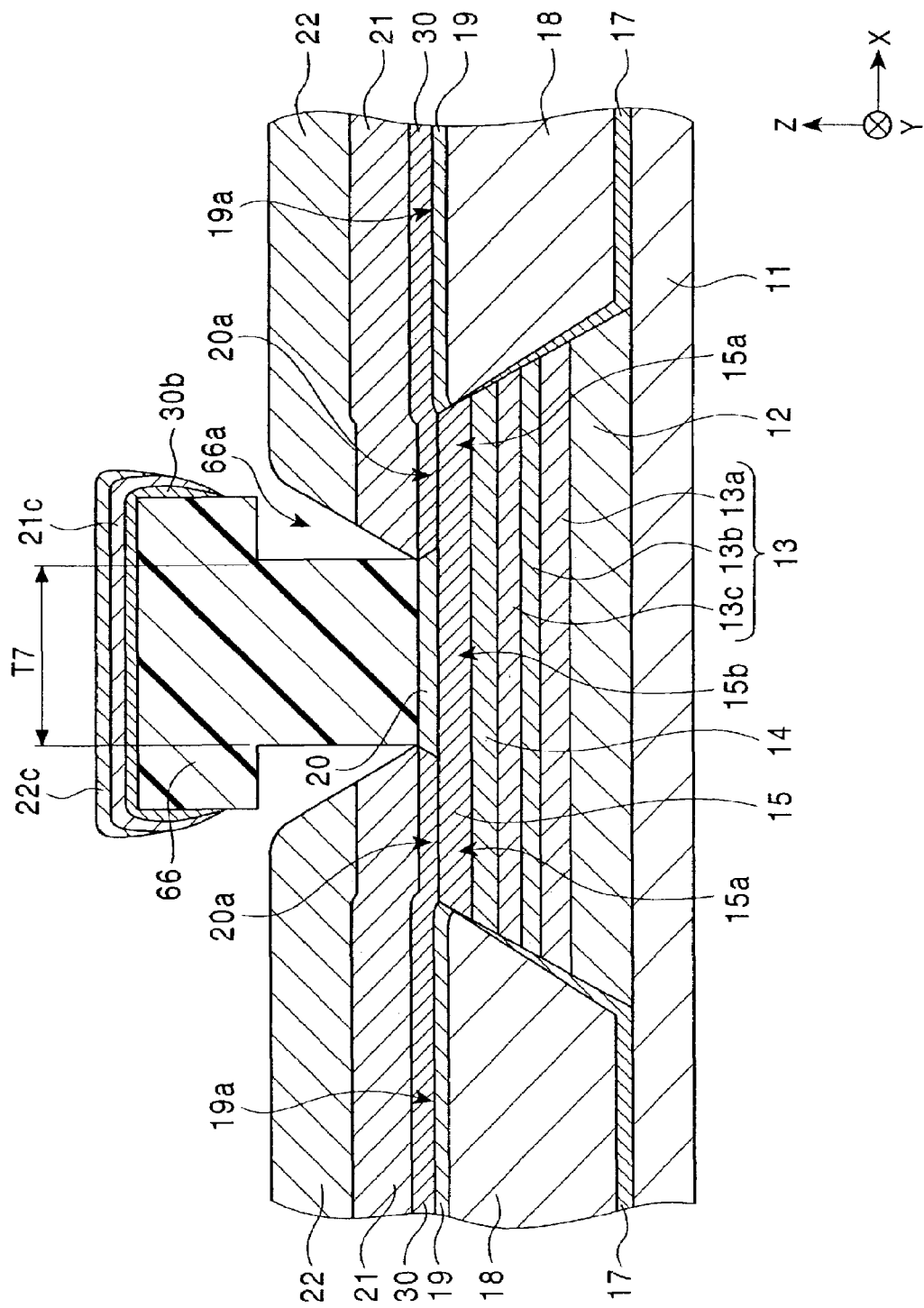
FIG. 20 shows a step subsequent to the step shown in FIG. 19.

A method for making the magnetic sensing element shown in FIG. 3 will now be described. FIGS. 18 to 20 show the steps for making the magnetic sensing element shown in FIG. 3.

In the step shown in FIG. 18, the first antiferromagnetic layer 12 is deposited on the substrate 11. The first pinned magnetic sublayer 13a, the nonmagnetic interlayer 13b, and the second pinned magnetic sublayer 13c are sequentially deposited on the first antiferromagnetic layer 12 so as to form the pinned magnetic layer 13 of a synthetic ferrimagnetically pinned type. The nonmagnetic material layer 14, the free magnetic layer 15, and the nonmagnetic layer 20 are sequentially deposited on the pinned magnetic layer 13 by a thin-film forming process such as sputtering or vapor deposition using the same vacuum deposition apparatus.

The first antiferromagnetic layer 12 is formed with a PtMn alloy, X—Mn alloy, or Pt—Mn—X' alloy wherein X is at least one element selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr.

These alloys immediately after deposition have a disordered face-centered cubic (fcc) structure. They are transformed into a CuAuI-type ordered face-centered tetragonal (fct) structure by annealing.

The thickness of the first antiferromagnetic layer 12 is preferably in the range of 80 to 300 Å.

Next, first field annealing is performed. While applying a first magnetic field in the Y direction perpendicular to the track width direction (the X direction), the deposited layers are annealed at a first annealing temperature to generate an exchange coupling magnetic field between the first antiferromagnetic layer 12 and the first pinned magnetic sublayer 13a. As a result the magnetization direction of the first pinned magnetic sublayer 13a is pinned in the Y direction in the drawing. The magnetization direction of the second pinned magnetic sublayer 13c is pinned in a direction opposite to the Y direction by exchange coupling resulting from the RKKY interaction between the first pinned magnetic sublayer 13a and the second pinned magnetic sublayer 13c. For example, the first annealing temperature is 290° C., and the magnitude of the first magnetic field is 800 kA/m.

In the step shown in FIG. 18, the nonmagnetic layer 20 is deposited on the free magnetic layer 15. The nonmagnetic layer 20 is dense and is rarely oxidized by exposure to air. For example, the nonmagnetic layer 20 is composed of at least one element selected from Ru, Re, Pd, Os, Ir, Pt, Au, Rh, and Cr.

The nonmagnetic layer 20 composed of a noble metal such as Ru is dense and rarely oxidized by exposure to air. Thus, the nonmagnetic layer 20 having a small thickness can still prevent the free magnetic layer 15 from being oxidized by exposure to air.

The characteristic feature of the step shown in FIG. 18 is that the nonmagnetic layer 20 is deposited to have a thickness of 3 to 10 Å. At such a small thickness, low-energy ion milling can be employed to remove portions of the nonmagnetic layer 20 in the side regions in a subsequent process. This improves milling controllability.

In the step shown in FIG. 19, a resist layer 65 is formed on the nonmagnetic layer 20. The resist layer 65 is, for example, a lift-off resist. The width of the bottom of the resist layer 65 in the track width direction (the X direction) is represented by T6.

The layers from the nonmagnetic layer 20 to the first antiferromagnetic layer 12 not covered with the resist layer 65 are milled by etching. As shown in FIG. 19, the side faces of these layers in the track width direction (the X direction) form continuous planes, i.e., the side faces 10a of the composite film 10. The side faces 10a are formed as flat or curved slopes so that the width of the composite film 10 in the track width direction gradually decreases along the Z direction.

In the step shown in FIG. 19, the bias underlayers 17 composed of Cr or the like are formed over the side faces 10a of the composite film 10 and the portions of the substrate 11 not overlaid by the composite film 10. The bias underlayers 17, the hard bias layers 18 composed of a CoPt alloy or the like, and separating layers 19 composed of Ta or the like are sequentially deposited by, for example, sputtering. During the course, an underlayer material layer 17a composed of the material for the bias underlayers 17, a bias material layer 18b composed of the material for the hard bias layer 18, and a nonmagnetic material layer 19a composed of the material for the separating layer 19 are deposited on the resist layer 65. These layers and the resist layer 60 are removed.

In the step shown in FIG. 20, a resist layer 66 having a width T7 of the bottom face in the track width direction smaller than the width T6 shown in FIG. 19 is formed at the center of the nonmagnetic layer 20 in the track width direction (the X direction) in the drawing. The width T7 of the resist layer 66 is set equal to or slightly smaller than the effective track width. The effective track width determined in advance by the full-track profiling method described with reference to FIG. 10.

The side portions 20a of the nonmagnetic layer 20 and the top faces 19a of the separating layers 19 not covered with the resist layer 66 are milled by ion milling. The separating layers 19 are milled partway. The side portions 20a of the nonmagnetic layer 20 may remain within a thickness of 3 Å or less.

As described above, since the nonmagnetic layer 20 is composed of Ru or the like and is formed to have a small thickness of 3 to 10 Å, low-energy ion milling can be employed to remove the side portions 20a of the nonmagnetic layer 20. In this manner, the thickness of the side portions 20a can be made significantly small. Even when the side portions 20a of the nonmagnetic layer 20 are completely removed by ion milling, the surfaces of the side portions 15a of the free magnetic layer 15 exposed by the milling are rarely damaged. Accordingly, proper exchange interactions occur between the ferromagnetic layer 30 described below and the side portions 15a of the free magnetic layer 15.

In the step shown in FIG. 20, the ferromagnetic layers 30 are formed over the side portions 15a of the free magnetic layer 15 and the separating layers 19. When the nonmagnetic layer 20 remains on the side portions 15a of the free magnetic layer 15, the ferromagnetic layers 30 are formed over the nonmagnetic layer 20 and the separating layers 19. The second antiferromagnetic layer 21 is formed on the ferromagnetic layers 30. The electrode layers 22 are formed on the second antiferromagnetic layers 21. The ferromagnetic layers 30, the second antiferromagnetic layers 21, and the electrode layers 22 are formed by sputtering at such an angle with respect to an axis normal to the surface of the substrate 11 that the ferromagnetic layers 30, the second antiferromagnetic layers 21, and the electrode layers 22 are deposited inside voids 66a at the lower part of the resist layer 66.

Even when the side portions 20a of the nonmagnetic layer 20 remain on the side portions 15a of the free magnetic layer 15, the thickness thereof is small, i.e., 3 Å or less. Thus, ferromagnetic exchange interactions can still occur between the free magnetic layer 15 and the ferromagnetic layers 30 via the side portions 20a of the nonmagnetic layer 20.

After removing the resist layer 66, the layers up to the electrode layers 22 are subjected to second field annealing. In the second field annealing, a magnetic field having a magnitude smaller than the exchange anisotropic magnetic field of the first antiferromagnetic layer 12 is applied in the track width direction (the X direction). The annealing temperature is lower than the blocking temperature of the first antiferromagnetic layer 12. The magnitude of the applied magnetic field is preferably greater than the coercive force of the free magnetic layer 15 and the ferromagnetic layers 30 but smaller than the spin-flop magnetic field between the second pinned magnetic sublayer 13c and the first pinned magnetic sublayer 13a.

In this manner, the exchange anisotropic magnetic field between each second antiferromagnetic layer 21 and each ferromagnetic layer 30 can be oriented in the track width direction (the X direction) without having to change the exchange anisotropic magnetic field of the first antiferromagnetic layer 12 oriented in the height direction (the Y direction). The magnetization directions of the side portions 15a of the free magnetic layer 15 are properly and firmly pinned in the track width direction (the X direction) by exchange interaction with the ferromagnetic layers 30 pinned in the track width direction due to the second annealing and by the longitudinal bias magnetic fields from the hard bias layers 18. Meanwhile, the center region 15b of the free magnetic layer 15 is moderately put into a single-magnetic-domain state so that the magnetization can rotate in response with an external magnetic field.

As shown in FIG. 20, during deposition of the ferromagnetic layers 30, the second antiferromagnetic layers 21, and the electrode layers 22, a ferromagnetic material layer 30b composed of the material for the ferromagnetic layer 30, the antiferromagnetic material layer 21c composed of the same material for the second antiferromagnetic layer 21, and the electrode material layer 22c composed of the same material for the electrode layers 22 are formed on the resist layer 66. These layers and the resist layer 66 are removed prior to the second field annealing. In this manner, the magnetic sensing element shown in FIG. 3 is formed.

Figure 21:
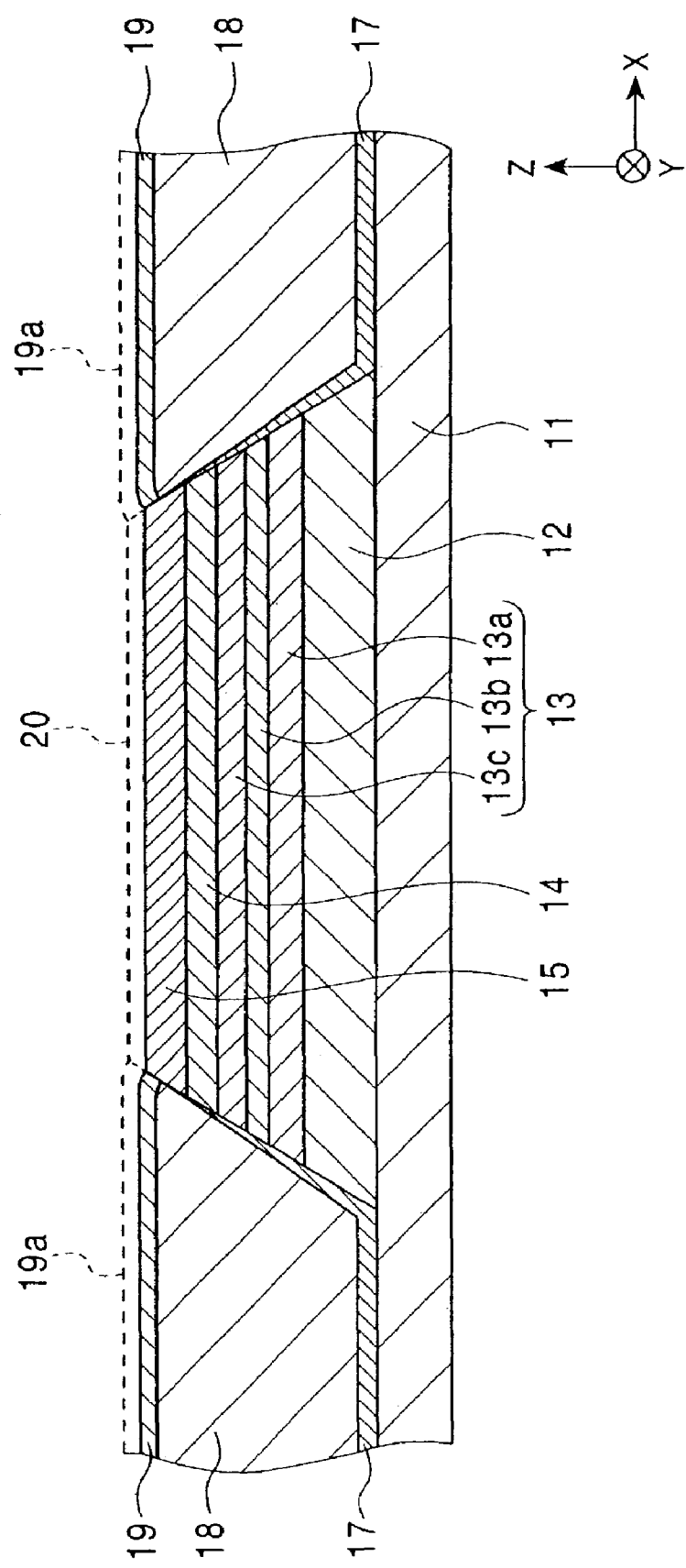
FIG. 21 shows a step for making the magnetic sensing element shown in FIG. 4.
Figure 22:
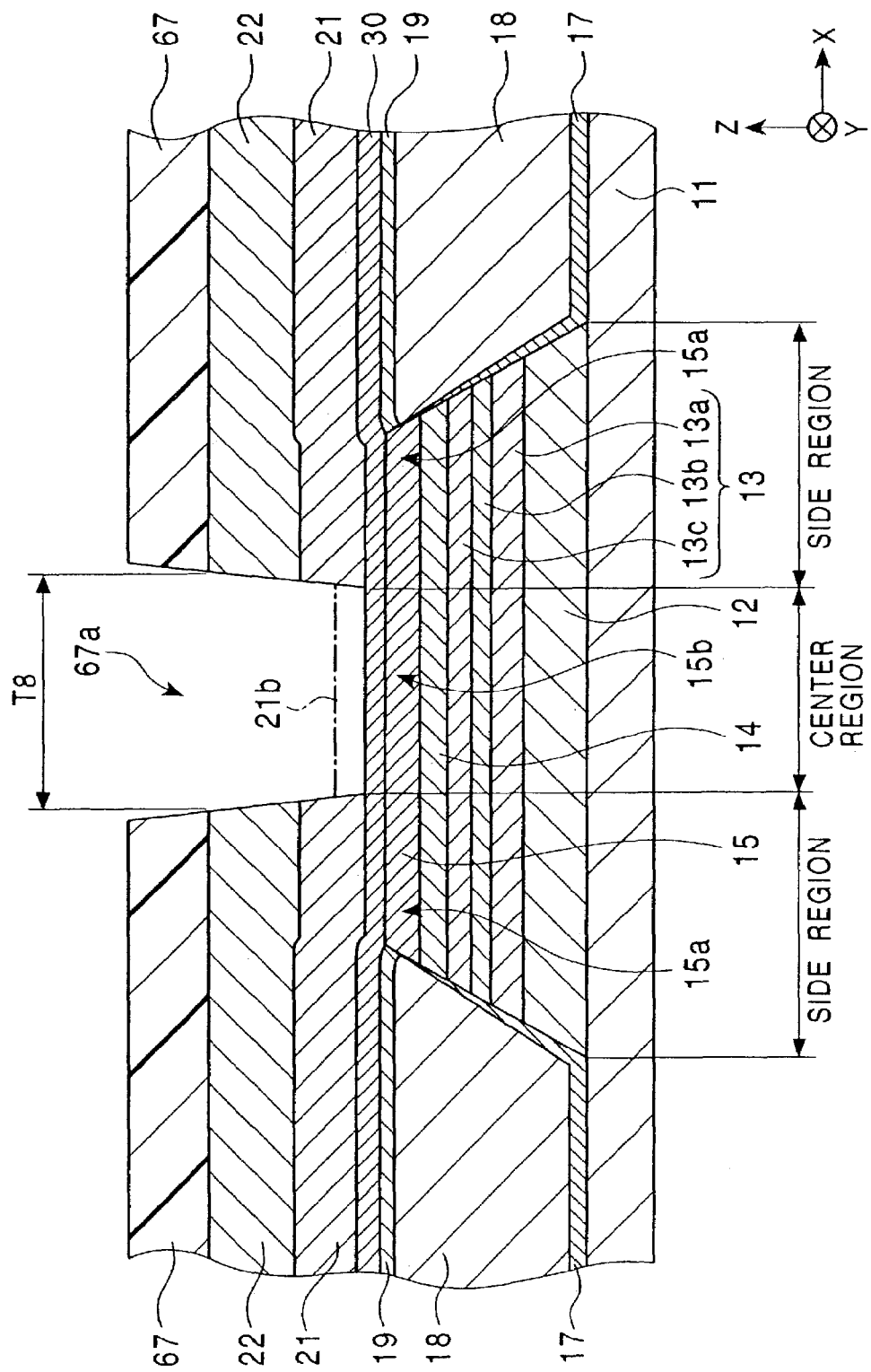
FIG. 22 shows a step subsequent to the step shown in FIG. 21.
Figure 23:
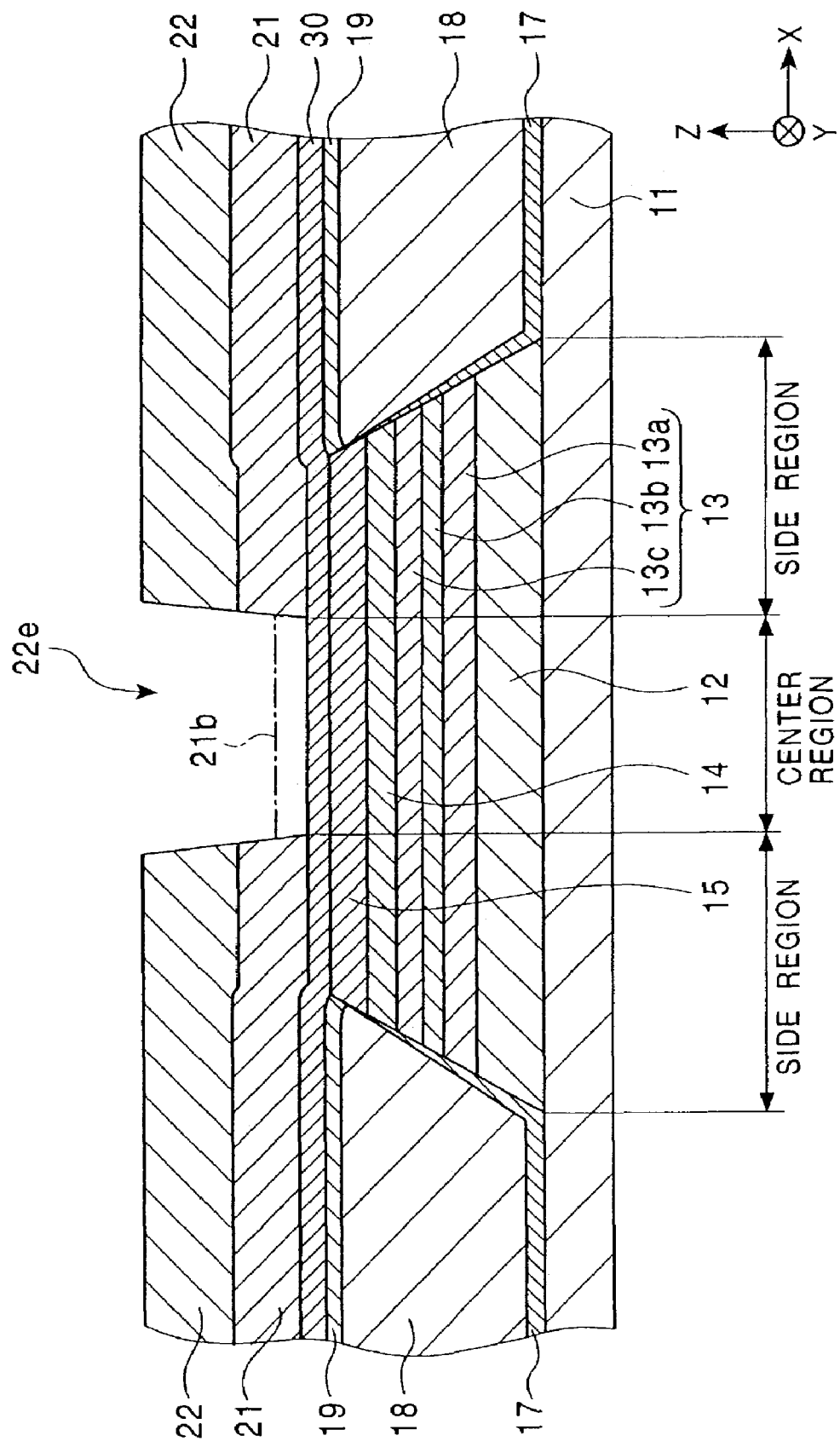
FIG. 23 shows a step that replaces the step shown in FIG. 22 according to another method.

A method for making the magnetic sensing element according to the fourth embodiment shown in FIG. 4 will now be described. FIGS. 21 to 23 show the steps for making the magnetic sensing element.

First, the steps show in FIGS. 18 and 19 are performed. Next, without forming the resist layer 66, the nonmagnetic layer 20 formed on the free magnetic layer 15 and part of the separating layers 19 are milled by ion milling, as shown in FIG. 21. The nonmagnetic layer 20 may be completely removed, as illustrated in FIG. 21. Alternatively, part of the nonmagnetic layer 20 may remain, as shown by a broken line in the drawing. As previously described in the step shown in FIG. 18, the nonmagnetic layer 20 is composed of a material, such as Ru, not easily oxidizable and has a small thickness of approximately 3 to 10 Å immediately after the deposition. Thus, low-energy ion milling can be employed to mill the nonmagnetic layer 20. The damage to the free magnetic layer 15 underneath the nonmagnetic layer 20 is minimized even when the nonmagnetic layer 20 is completely removed. When the nonmagnetic layer 20 is to remain on the free magnetic layer 15 as shown by the broken line in FIG. 21, the thickness of the nonmagnetic layer 20 should be 3 Å or less.

In the step shown in FIG. 22, the ferromagnetic layers 30, the second antiferromagnetic layers 21, and the electrode layers 22 are deposited by sputtering or the like over the free magnetic layer 15 and the separating layers 19. When the nonmagnetic layer 20 partly remains on the free magnetic layer 15, these layers are deposited on the nonmagnetic layer 20 and the separating layers 19.

Next, in the step shown in FIG. 22, a resist layer 67 is formed on the electrode layer 22, and a hole 67a is then formed in the resist layer 67 at the center in the drawing by exposure and development. In forming the hole 67a by exposure and development, the position thereof is aligned to coincide with the position of the center region of the composite film 10 in the track width direction (the X direction). Since the width T8 of the hole 67a in the track width direction (the X direction) determines the track width Tw, the width T8 of the hole 67a is adjusted to be about the same as the track width Tw in forming the hole 67a.

Part of the electrode layer 22 exposed at the hole 67a is removed by etching, and part of the second antiferromagnetic layer 21 exposed by the etching is also removed by etching. After completely removing the second antiferromagnetic layer 21 exposed at the hole 67a, the surface of the ferromagnetic layer 30 appears in the hole 67a. The ferromagnetic layer 30 may be partly milled.

Alternatively, the second antiferromagnetic layer 21b exposed at the hole 67a of the resist layer 67 may be partly left unetched, as indicated by a one-dot broken line shown in FIG. 22. Preferably, the thickness of the second antiferromagnetic layer 21b is 50 Å or less. The thickness of the second antiferromagnetic layer 21b on the composite film 10 must be sufficiently thin. Otherwise, large exchange coupling magnetic field is generated between the second antiferromagnetic layer 21b and the ferromagnetic layer 30 or between the second antiferromagnetic layer 21b and the free magnetic layer 15, and the center region 15b of the free magnetic layer 15 firmly put into a single-magnetic-domain state cannot change its magnetization direction in response to an external magnetic field.

Second field annealing is then performed to generate exchange coupling magnetic fields between the second antiferromagnetic layers 21 and the side portions of the ferromagnetic layer 30. As a result, the magnetization direction of the ferromagnetic layer 30 is pinned in the track width direction, and the magnetization directions of the side portions 15a of the free magnetic layer 15 can be properly and firmly pinned by the exchange interaction between the ferromagnetic layer 30 and the free magnetic layer 15 and by the longitudinal bias magnetic fields from the hard bias layers 18. The conditions of the second field annealing are the same as those previously described with reference to FIG. 13.

The resist layer 67 is removed before second field annealing. Thus, the method for making the magnetic sensing element shown in FIG. 4 is completed.

The step shown in FIG. 23 may be performed instead of the step shown in FIG. 22. In the step shown in FIG. 23, after the second antiferromagnetic layer 21 is deposited by sputtering or the like, the electrode layers 22 are deposited on the second antiferromagnetic layer 21. The electrode layers 22 are separated from each other by a hole 22e. In forming the hole 22e, the position thereof is aligned to coincide with the position of the center region of the composite film 10 in the track width direction (the X direction). The details for forming the hole 22e are the same as those described above with reference to FIG. 17.

Using the electrode layer 22 shown in FIG. 23 as a mask layer, the center region of the second antiferromagnetic layer 21 exposed at the hole 22e is removed by etching. As indicated by a one-dot broken line in FIG. 23, the second antiferromagnetic layer 21b in the center region may be partly left unetched. The thickness of the second antiferromagnetic layer 21b in the center region should be 50 Å or less. Alternatively, the ferromagnetic layer 30 exposed by completely removing the second antiferromagnetic layer 21b in the center region may be partly milled.

The relationship between the etching rates for the electrode layers 22 and the second antiferromagnetic layers 21 is the same as that described above with reference to FIG. 17. The description thereof is omitted to avoid redundancy.

Figure 24:
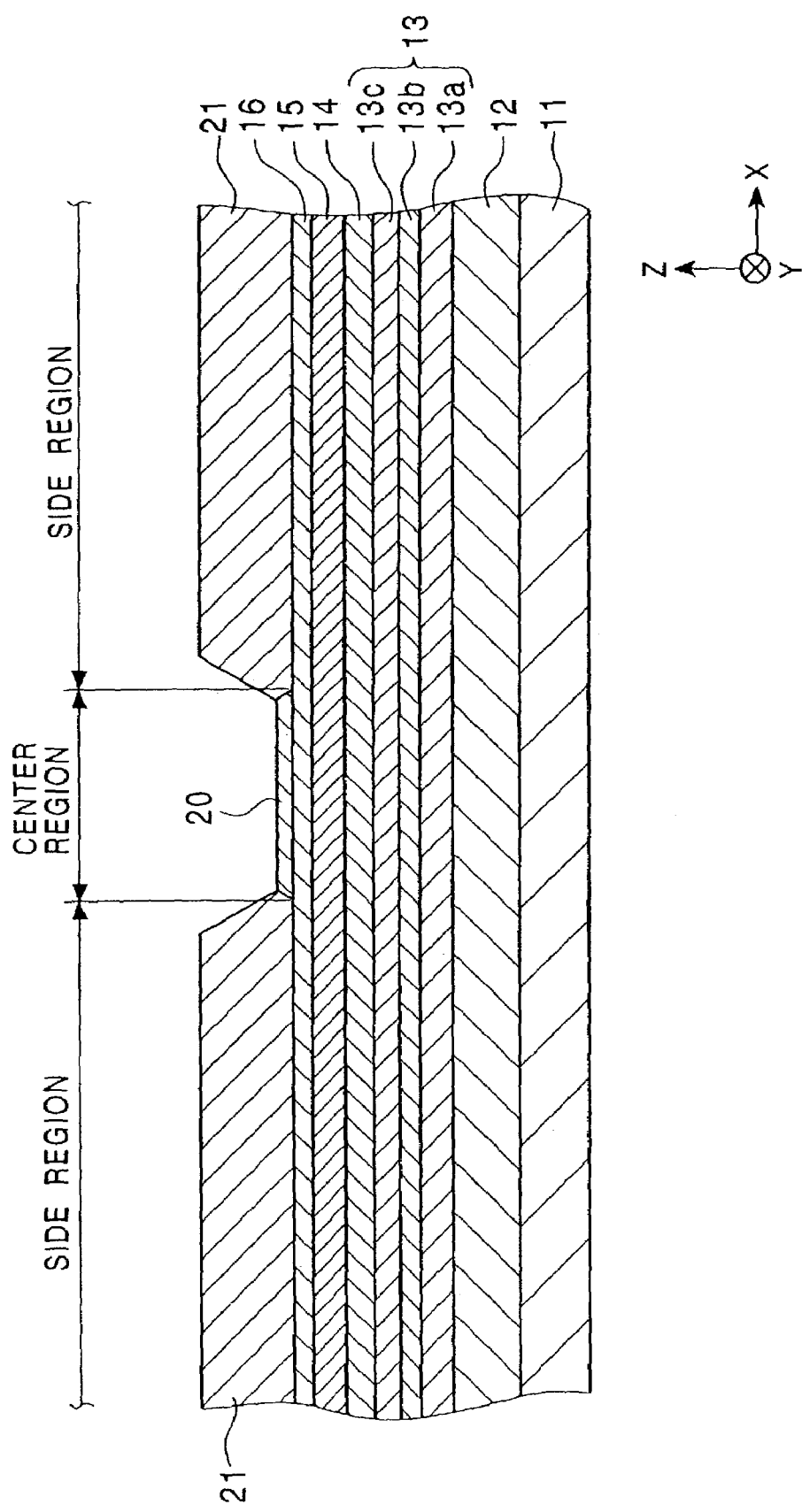
FIG. 24 shows a step for making the magnetic sensing element shown in FIG. 5.
Figure 25:
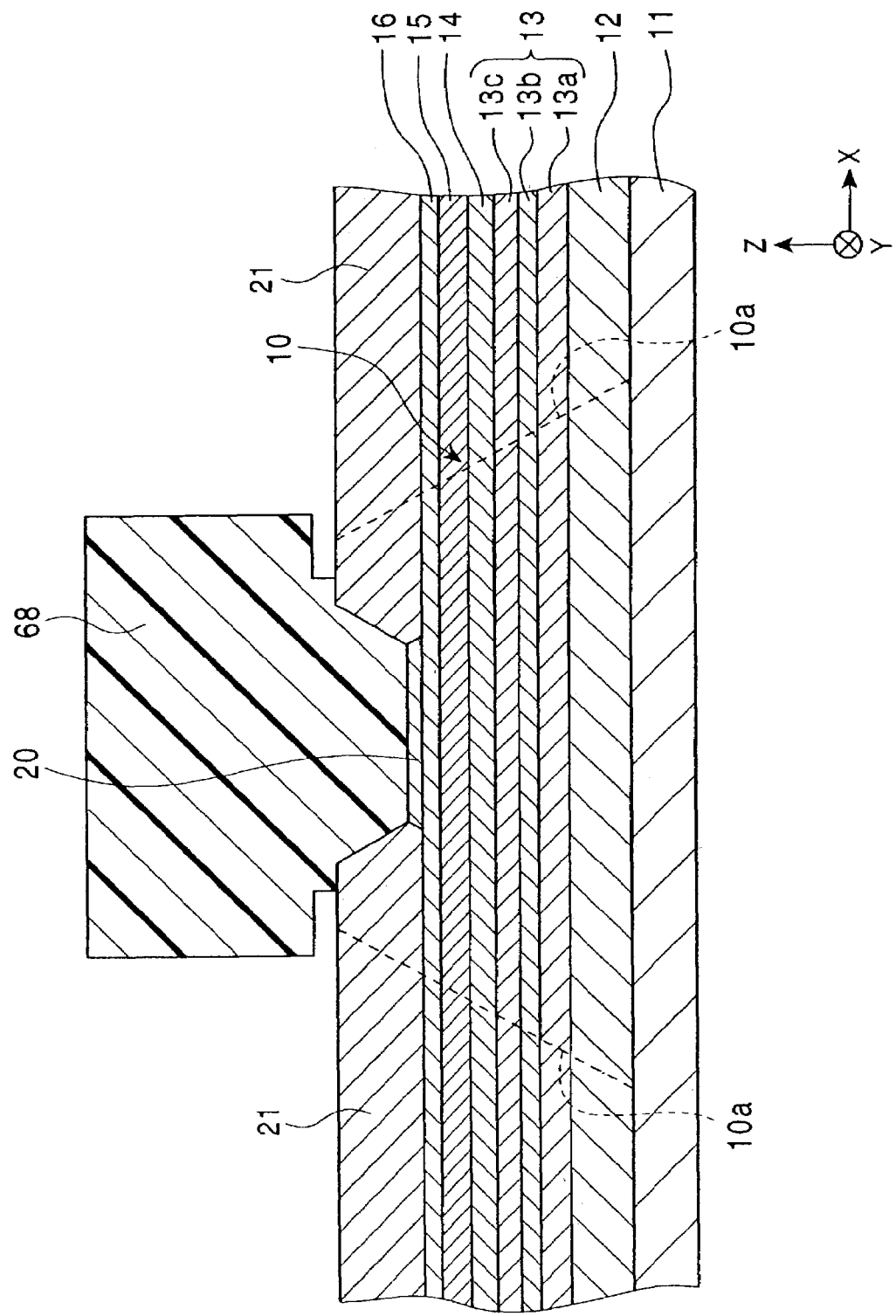
FIG. 25 shows a step subsequent to the step shown in FIG. 24.
Figure 26:
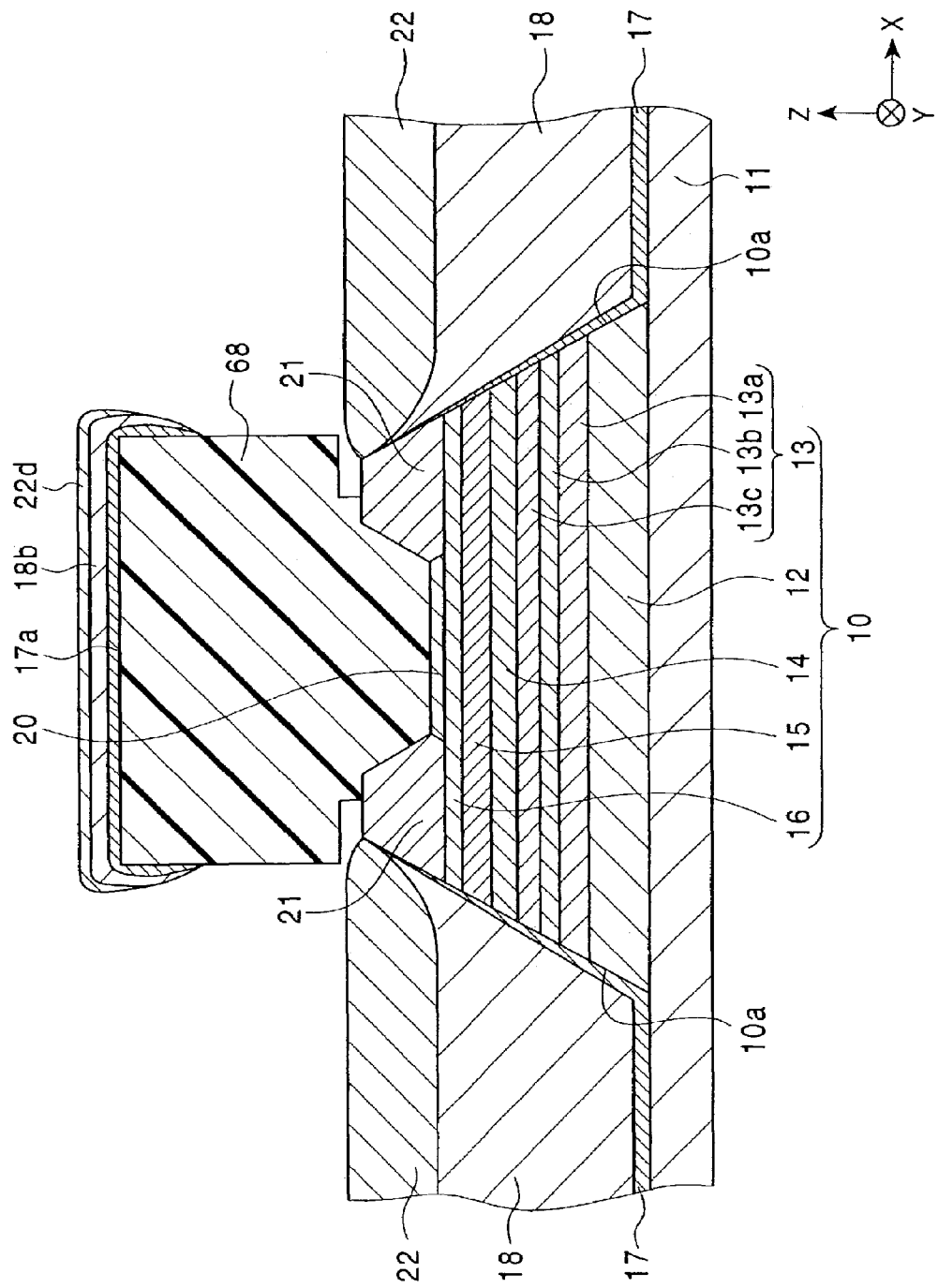
FIG. 26 shows a step subsequent to the step shown in FIG. 25.

A method for making the magnetic sensing element according to the fifth embodiment of the present invention will now be described. FIGS. 24 to 26 are the diagrams showing steps of the fabrication method.

In the step shown in FIG. 24, the first antiferromagnetic layer 12 is deposited on the substrate 11. The first pinned magnetic sublayer 13a, the nonmagnetic interlayer 13b, the second pinned magnetic sublayer 13c are deposited on the substrate 11 to form the pinned magnetic layer 13 of a synthetic ferrimagnetically pinned type. The nonmagnetic material layer 14, the free magnetic layer 15, the third antiferromagnetic layer 16, and the nonmagnetic layer 20 are then deposited on the pinned magnetic layer 13. These layers are sequentially deposited by a thin-film forming process such as sputtering or vapor deposition using the same deposition apparatus.

In the step shown in FIG. 24, portions of the nonmagnetic layer 20 in the side regions are completely milled to leave the nonmagnetic layer 20 only in the center region on the third antiferromagnetic layer 16. The second antiferromagnetic layer 21 is subsequently deposited by, for example, sputtering.

The magnetic sensing element shown in FIG. 24 can be made through the steps previously described. In particular, the step shown in FIG. 11 is first performed. The step shown in FIG. 12 is omitted. The resist layer 61 is then formed in the step shown in FIG. 13. The side portions of the nonmagnetic layer 20 not covered with the resist layer 61 are removed or partly milled to a thickness of 3 Å or less. The second antiferromagnetic layers 21 are then deposited by sputtering.

In the step shown in FIG. 25, a resist layer 68 is formed on the nonmagnetic layer 20 in the center region and part of each of the second antiferromagnetic layers 21. The two side portions of the composite film 10 consisting of layers from the first antiferromagnetic layer 12 to the third antiferromagnetic layer 16 not covered with the resist layer 68 are milled by-etching. As a result, the side faces 10a (indicated by broken lines) of the composite film 10 are formed as flat or curved slopes so that the width of the composite film 10 in the track width direction increases along the Z direction in the drawing.

In the step shown in FIG. 26, the bias underlayers 17 are formed over the portions of the substrate 11 not overlaid by the composite film 10 and the side faces 10a of the composite film 10. The hard bias layers 18 are then formed on the bias underlayers 17, and the electrode layers 22 are formed on the hard bias layers 18.

In depositing the layers from the bias underlayers 17 to the electrode layers 22, the underlayer material layer 17a composed of the material for the bias underlayers 17, the bias material layer 18b composed of the material for the hard bias layer 18, and the electrode material layer 22d composed of the material for the electrode layers 22 are deposited on the resist layer 68. These layers and the resist layer 68 are removed to complete the magnetic sensing element shown in FIG. 5.

Figure 27:
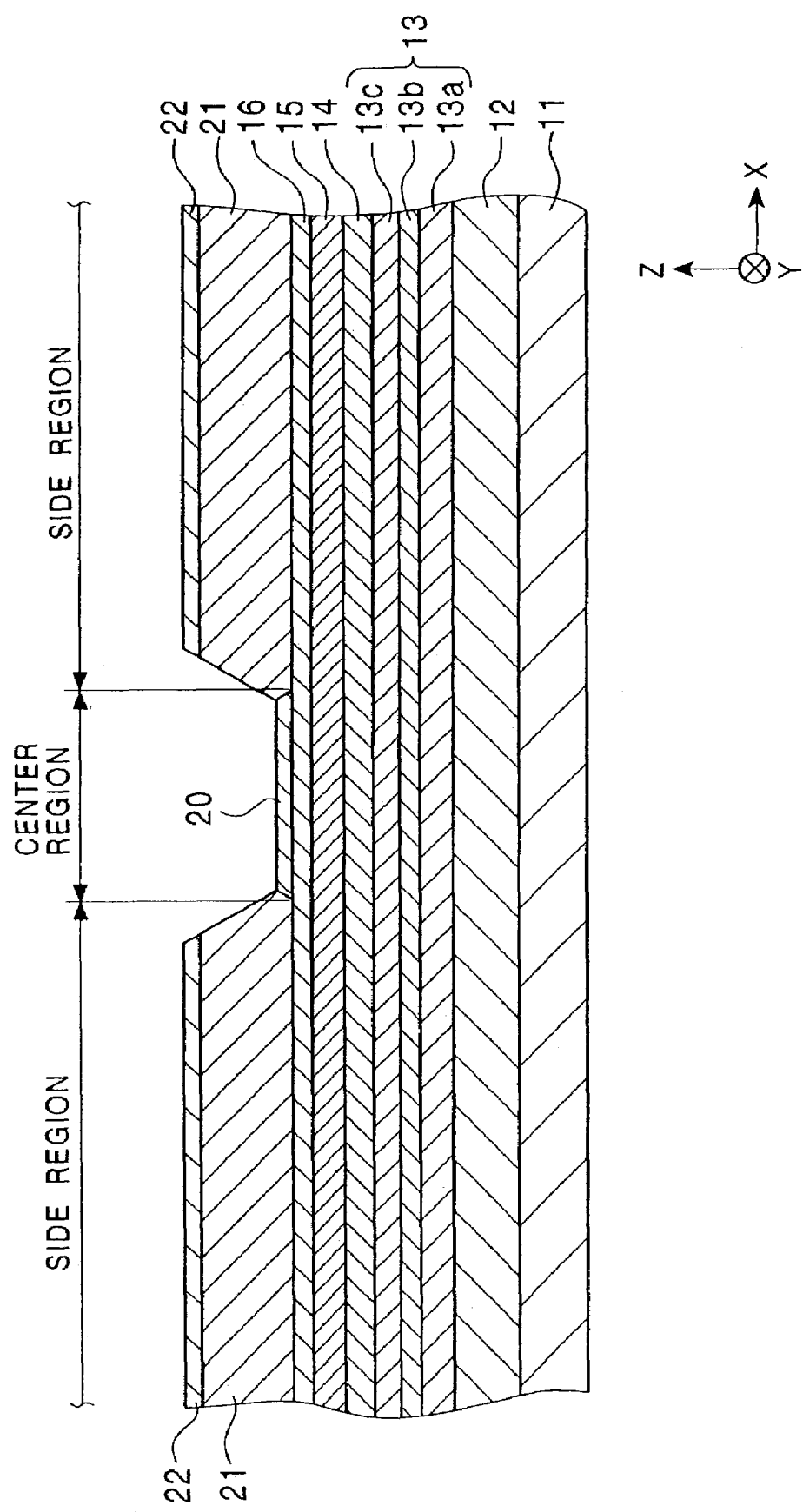
FIG. 27 shows a step that replaces the step shown in FIG. 24 according to another method.
Figure 28:
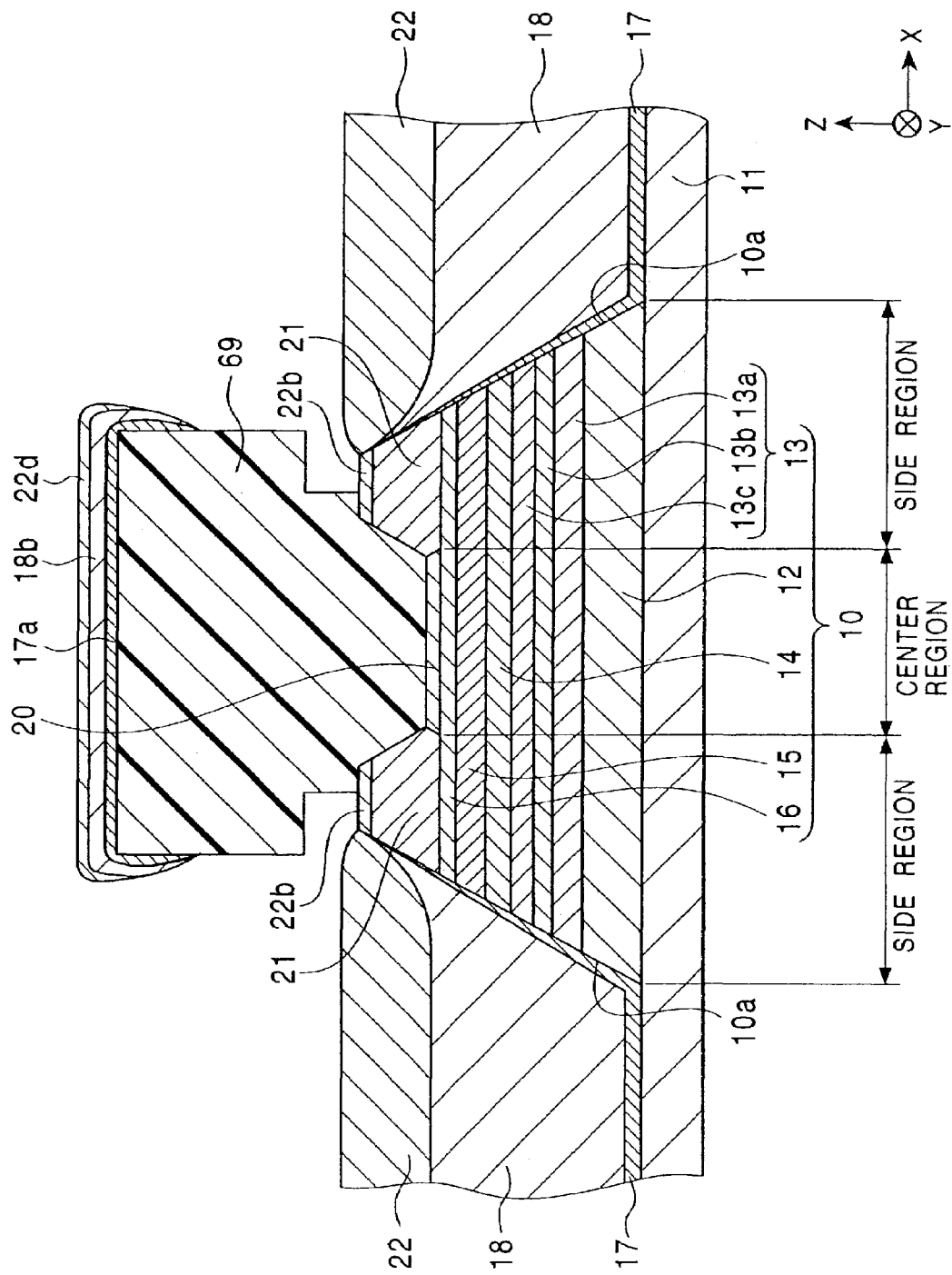
FIG. 28 shows a step subsequent to the step shown in FIG. 27.

The steps shown in FIGS. 27 and 28 are performed in order to form the tips 22b of the electrode layer 22 overlaying the top face of the second antiferromagnetic layer 21, as shown in FIG. 5.

In the step shown in FIG. 27, the first antiferromagnetic layer 12 is deposited on the substrate 11. The first pinned magnetic sublayer 13a, the nonmagnetic interlayer 13b, and the second pinned magnetic sublayer 13c are deposited on the first antiferromagnetic layer 12 to form the pinned magnetic layer 13 of a synthetic ferrimagnetically pinned type. The nonmagnetic material layer 14, the free magnetic layer 15, the third antiferromagnetic layer 16, and the nonmagnetic layer 20 are formed on the pinned magnetic layer 13. These layers are sequentially formed by a thin-film forming process such as sputtering or vapor deposition using the same vacuum deposition apparatus.

In the step shown in FIG. 27, portions of the nonmagnetic layer 20 on third antiferromagnetic layer 16 and in the side regions are removed, thereby leaving the nonmagnetic layer 20 only in the center region on the third antiferromagnetic layer 16. Subsequently, the second antiferromagnetic layers 21 are formed by, for example, sputtering. The electrode layers 22 are formed on the second antiferromagnetic layer 21 by sputtering.

The structure of the magnetic sensing element shown in FIG. 27 can be fabricated by combining the above-described steps. First, the step shown in FIG. 11 is performed. The step shown in FIG. 12 is omitted, and the resist layer 61 is formed in the step show in FIG. 13. The two side portions of the nonmagnetic layer 20 not covered by the resist layer 61 are completely removed or partly removed until the thickness thereof is 3 Å or less. The second antiferromagnetic layers 21 and the electrode layers 22 are formed by sputtering.

Next, in the step shown in FIG. 28, a resist layer 69 is formed over the nonmagnetic layer 20 and part of the second antiferromagnetic layers 21. The side portions of the composite film 10 consisting of layers from the first antiferromagnetic layer 12 to the third antiferromagnetic layer 16 are milled by etching to form the side faces 10a. The side faces 10a are formed as flat or curved slopes so that the width of the composite film 10 in the track width direction gradually decreases along the Z direction.

Subsequently, in the step shown in FIG. 28, the bias underlayers 17 are formed on the portions of the substrate 11 not overlaid by the composite film 10 and the side faces 10a of the composite film 10. The hard bias layers 18 are formed on the bias underlayers 17, and the electrode layers 22 are formed on the hard bias layers 18.

During the course of deposition, the underlayer material layer 17a composed of the material for the bias underlayers 17, the bias material layer 18b composed of the material for the hard bias layer 18, and the electrode material layer 22d composed of the same material for the electrode layers 22 are formed on the resist layer 69. These layers and the resist layer 69 are removed to complete the magnetic sensing element shown in FIG. 5 having the tips 22b of the electrode layer 22 overlaying the second antiferromagnetic layers 21.

Note that the steps performed prior to the steps shown in FIG. 25 or 27 may be other than those shown in FIGS. 11 and 13. For example, one of the steps shown in FIGS. 15, 16, and 17 may be performed after the step shown in FIG. 14 but without forming the hard bias layers 18 at the two sides of the composite film, and the steps shown in FIGS. 25, 26, and 28 may be subsequently performed. Alternatively, the step similar to the step shown in FIG. 20 may be performed after the step shown in FIG. 18 while skipping the step shown in FIG. 19, and the steps shown in FIGS. 25, 26, and 28 may subsequently be performed. Alternatively, the step shown in FIG. 22 or 23 may be performed after the step shown in FIG. 21 but without forming the hard bias layers 18 at the two sides of the composite film, and the steps shown in FIGS. 25, 26, and 28 may subsequently be performed.

Accordingly, the structure of the magnetic sensing element during the course of fabrication in the step shown in FIGS. 24 and 27 need not coincide with the structures illustrated in FIGS. 24 and 27. For example, various structures including a structure in which no nonmagnetic layer 20 is provided on the composite film 10 or a structure in which the ferromagnetic layers 30 are provided on the free magnetic layer 15 without the third antiferromagnetic layer 16 may be employable.

A method for making the magnetic sensing element according to the sixth embodiment shown in FIG. 6 will now be described. FIGS. 29 to 34 show the steps for making the magnetic sensing element of the sixth embodiment.

Figure 29:
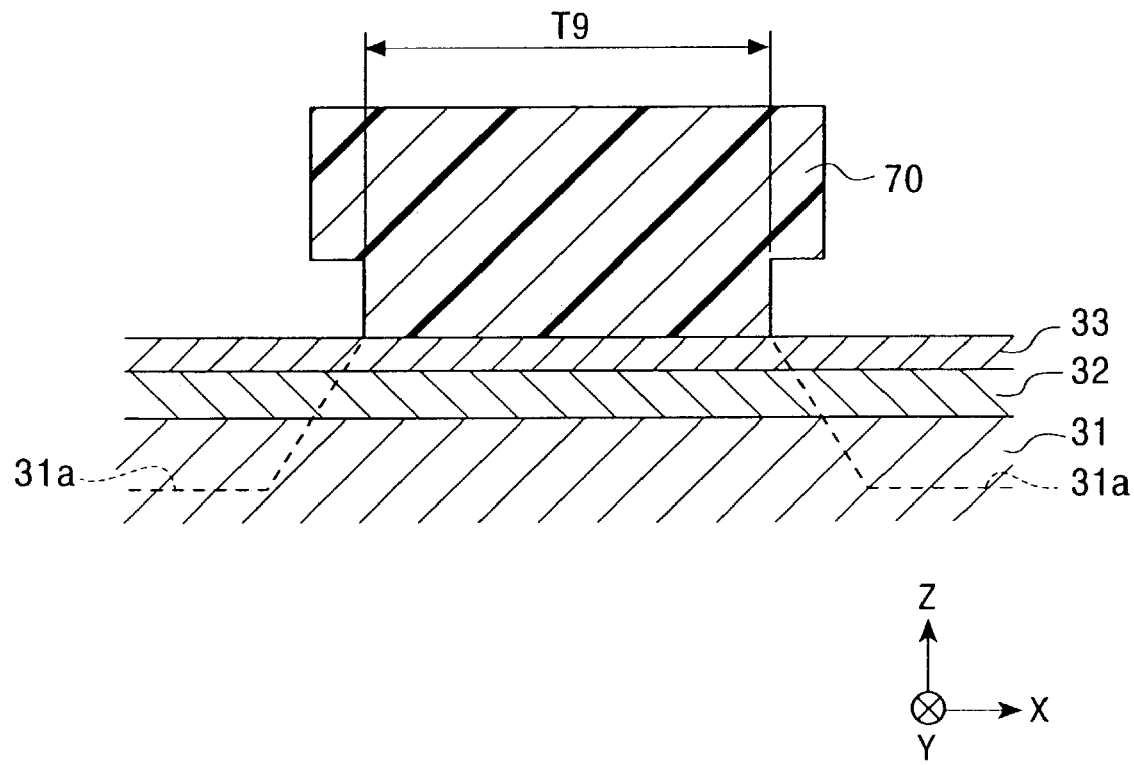
FIG. 29 shows a step for making the magnetic sensing element shown in FIG. 6.

In the step shown in FIG. 29, the lower shield layer 31, the nonmagnetic layer 32, and the seed layer 33 are deposited on the substrate (not shown). A lift-off resist layer 70 is formed on the seed layer 33. Since the width T9 of the bottom of the resist layer 70 in the track width direction (the X direction) determines the track width Tw, the width T9 must be about the same as the desired track width Tw.

Next, the seed layer 33 and the nonmagnetic layer 32 not covered with the resist layer 70 are removed by ion milling. The lower shield layer 31 is milled partway to form the flat portions 31a in the lower shield layer 31.

Figure 30:
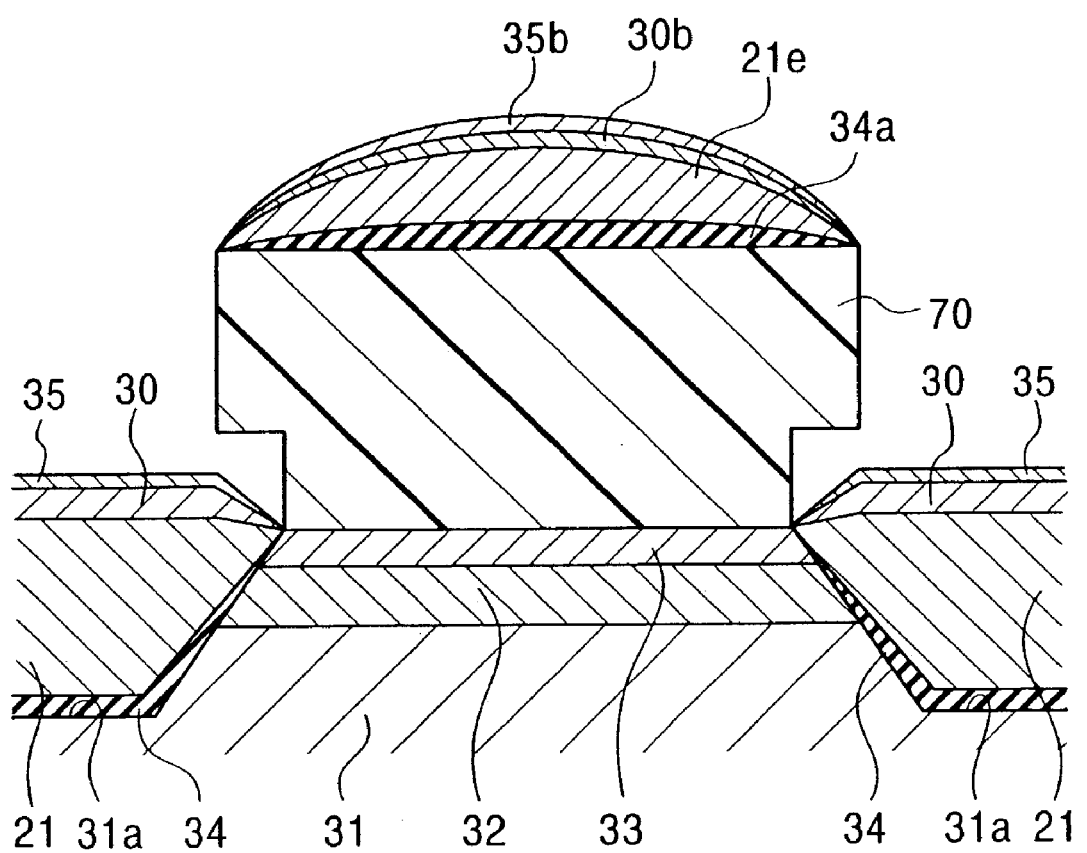
FIG. 30 shows a step subsequent to the step shown in FIG. 29.

Next, in the step shown in FIG. 30, without removing the resist layer 70 from the seed layer 33, the insulating layers 34, the second antiferromagnetic layers 21, the ferromagnetic layers 30, and the nonmagnetic layers 35 are sequentially deposited on the flat portions 31 by sputtering. Any one or combination of ion beam sputtering, long throw sputtering, and collimation sputtering may be employed. During the course, an insulating material layer 34a composed of the same material for the electrode layers 34, an antiferromagnetic material layer 21e composed of the same material for the second antiferromagnetic layers 21, and a ferromagnetic material layer 30b composed of the same material for the ferromagnetic layers 30 are deposited on the resist layer 70.

The resist layer 70 is removed and first field annealing is performed. While applying a first magnetic field in the track width direction (the X direction), the deposited layers are annealed at a first annealing temperature to generate an exchange coupling magnetic field between each second antiferromagnetic layer 21 and each ferromagnetic layer 30. As a result, the magnetization direction of the ferromagnetic layer 30 is pinned in the X direction in the drawing. For example, the first annealing temperature is 270° C., and the magnitude of the first magnetic field is 800 kA/m.

Figure 31:
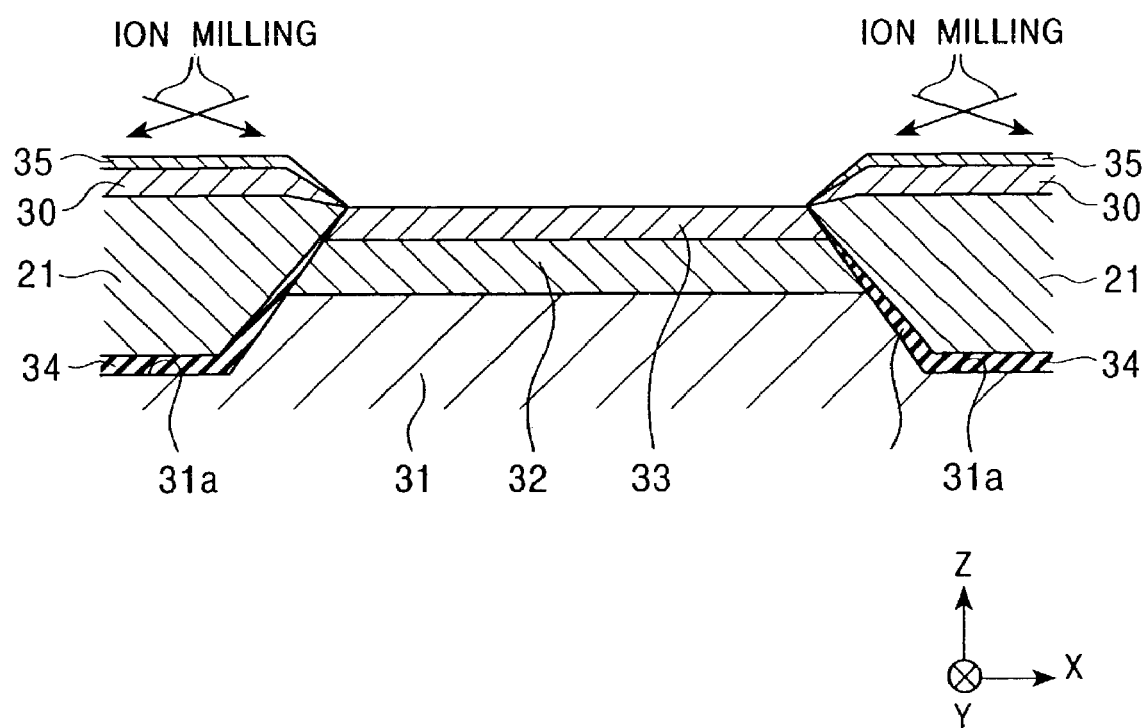
FIG. 31 shows a step subsequent to the step shown in FIG. 30.

Next, in the step shown in FIG. 31, the oxidized surface of the seed layer 33 and the nonmagnetic layers 35 are milled with ions. Low-energy ion milling may be employed since the nonmagnetic layers 35 are thin, i.e., approximately 3 to 10 Å in thickness.

Low-energy ion milling uses ion beams having a beam voltage (accelerating voltage) or less than 1,000 V. For example, a beam voltage of 100 to 500 V may be employed. In this embodiment, a 200-volt Ar ion beam is used.

The seed layer 33 is composed of, for example, Ta. A thin nonmagnetic noble metal layer 3 to 8 Å in thickness composed of Ru or the like may be sequentially deposited on the surface of the Ta layer so as to prevent oxidation of Ta. The nonmagnetic noble metal layer can be properly removed by ion milling process described above.

Figure 32:
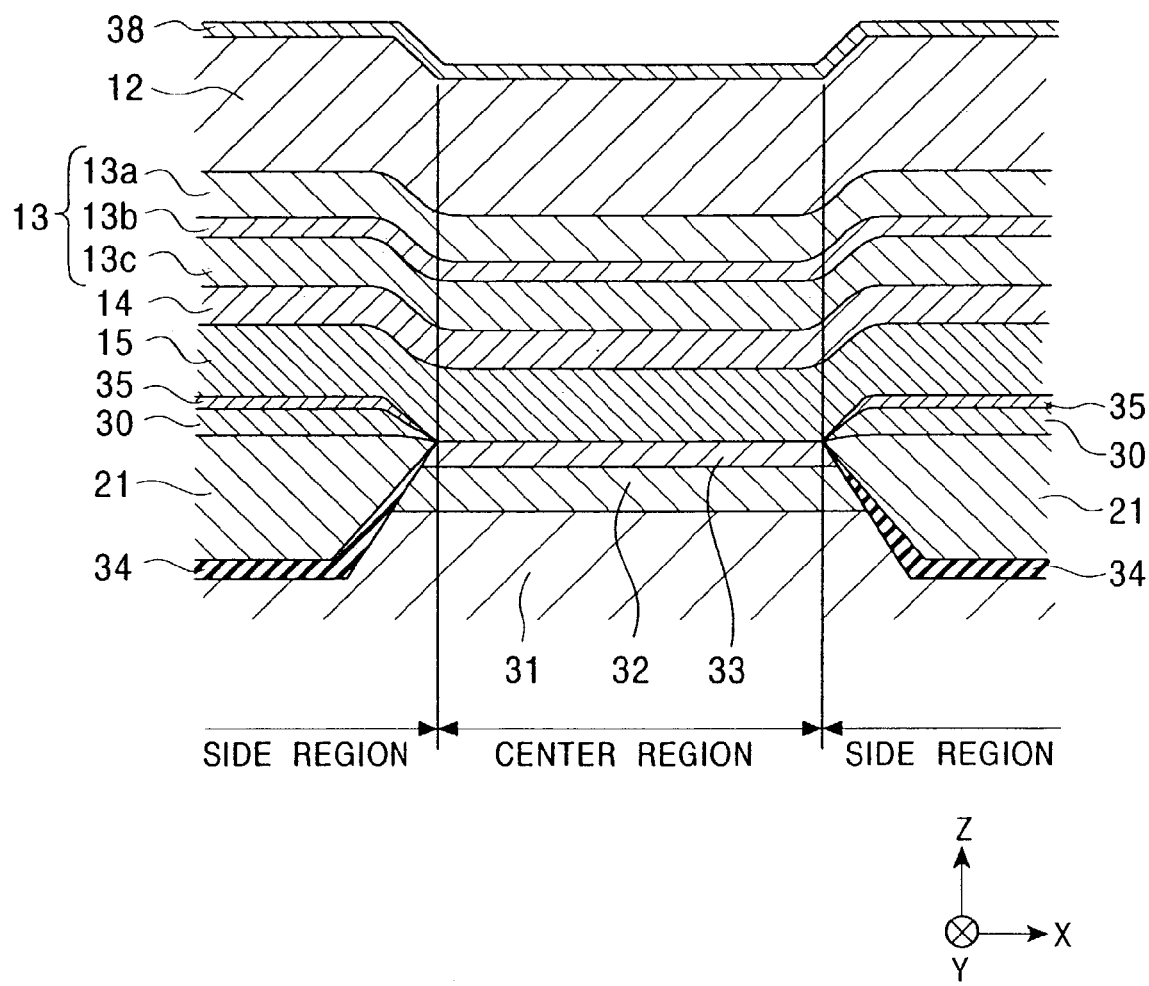
FIG. 32 shows a step subsequent to the step shown in FIG. 31.

After milling the surfaces of the nonmagnetic layers 35 and the seed layer 33, the step shown in FIG. 32 is performed. In the step shown in FIG. 32, the free magnetic layer 15, the nonmagnetic material layer 14, the second pinned magnetic sublayer 13c, the nonmagnetic interlayer 13b, the first pinned magnetic sublayer 13a, the first antiferromagnetic layer 12, and the protective layer 38 are sequentially deposited in vacuum. The second pinned magnetic sublayer 13c, the nonmagnetic interlayer 13b, and the first pinned magnetic sublayer 13a constitute the pinned magnetic layer 13 of a synthetic ferrimagnetically pinned type.

In the structure shown in FIG. 32, the two side portions of the free magnetic layer 15 are magnetically coupled with the ferromagnetic layers 30 by the RKKY interactions via the nonmagnetic layers 35. This puts the free magnetic layer 15 in a single-magnetic-domain state. When each nonmagnetic layer 35 is milled in the step shown in FIG. 31 to a thickness in the range of 6 to 11 Å, the magnetization direction of the free magnetic layer 15 becomes antiparallel to the track width direction (the X direction). When each nonmagnetic layer 35 is milled in the step shown in FIG. 31 to a thickness of 0.5 or more but less than 6 Å, the magnetization direction of the free magnetic layer 15 becomes parallel to the track width direction (the X direction).

Next, second field annealing is performed. During the second field annealing, a magnetic field is applied in a direction perpendicular to the track width direction, i.e., applied in the height direction (the Y direction in the drawing). The magnitude of the applied magnetic field is smaller than the exchange anisotropic magnetic field between each second antiferromagnetic layer 21 and each ferromagnetic layer 30. The annealing temperature is lower than the blocking temperature of the second antiferromagnetic layer 21.

In particular, the magnitude of the magnetic field during the second field annealing is preferably larger than the magnetic field that can put the first pinned magnetic sublayer 13a and the second pinned magnetic sublayer 13c to a single-magnetic domain state and larger than the demagnetizing field of the first pinned magnetic sublayer 13a and the second pinned magnetic sublayer 13c. However, the magnitude of the magnetic field during the second field annealing is preferably smaller than the spin-flop magnetic field at which the antiparallel coupling between the first pinned magnetic sublayer 13a and the second pinned magnetic sublayer 13c is canceled.

In this manner, the exchange anisotropic magnetic field between the first antiferromagnetic layer 12 and the first pinned magnetic sublayer 13a can be oriented in a direction 180° different from the height direction (the Y direction) without changing the direction of the exchange anisotropic magnetic field between the second antiferromagnetic layer 21 and the ferromagnetic layer 30, which is oriented in the track width direction (the X direction). For example, the annealing temperature of the second field annealing is 270° C., and the magnitude of the applied magnetic field is 8 to 30 kA/m, for example, 24 kA/m.

Upon completion of the second field annealing, the first pinned magnetic sublayer 13a is magnetized in a direction 180° different from the Y direction, and the second pinned magnetic sublayer 13c is magnetized in the Y direction by the RKKY interaction between the first pinned magnetic sublayer 13a and the second pinned magnetic sublayer 13c.

Figure 33:
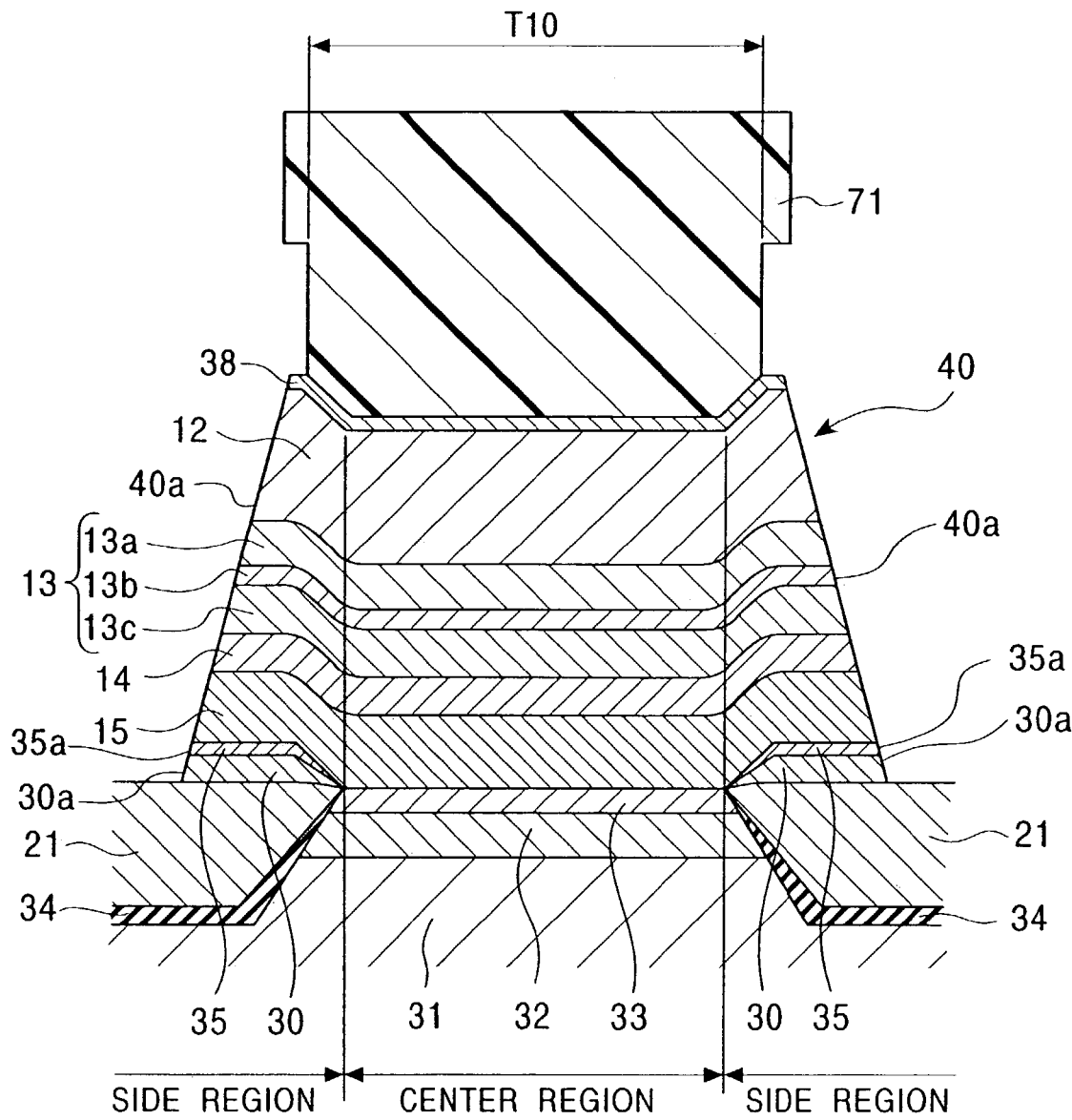
FIG. 33 shows a step subsequent to the step shown in FIG. 32.

Next, in the step shown in FIG. 33, a lift-off resist layer 71 is formed on the protective layer 38. The width T10 of the bottom of the resist layer 71 in the track width direction (the X direction) is approximately equal to or slightly smaller than the distance between the second antiferromagnetic layers 21 in the track width direction. This distance corresponds to the track width Tw.

Portions of the composite film 40 comprising layers from the free magnetic layer 15 to the protective layer 38, ferromagnetic layer 30, and the nonmagnetic layers 35 not covered with the resist layer 71 are milled with ions to form the side faces 40a, 30a, and 35a of the composite film 40, the ferromagnetic layers 30, and the nonmagnetic layers 35, respectively. This exposes the surface of the second antiferromagnetic layer 21 at two sides of the composite film 40 in the track width direction. During the ion milling, the surface of the second antiferromagnetic layer 21 may be slightly milled. Alternatively, the ferromagnetic layers 30 may be left intact or partly removed during the ion milling. Moreover, the nonmagnetic layers 35 may be left intact or partly removed during the ion milling. In this ion milling step, it is essential to completely mill the two side portions of the free magnetic layer 15; otherwise, the hard bias layers 18 cannot be properly placed against the two side faces of the free magnetic layer 15, and the magnetization of the free magnetic layer 15 cannot be properly controlled.

In the step shown in FIG. 34, the bias underlayers 17 are deposited over the portions of the second antiferromagnetic layers 21 not overlaid by the composite film 40 and the side faces 40a of the composite film 40. The hard bias layers 18 are formed on the bias underlayers 17, and the electrode layers 22 are formed on the hard bias layers 18. The bias underlayers 17, the hard bias layers 18, the electrode layers 22 are sequentially deposited. During the course, the underlayer material layer 17a composed of the material for the bias underlayers 17, the bias material layer 18b composed of the material for the hard bias layers 18, and the electrode material layer 22d composed of the same material for the electrode layers 22 are deposited on the resist layer 71. These layers and the resist layer 71 are removed to complete fabrication of the magnetic sensing element shown in FIG. 6.

Figure 35:
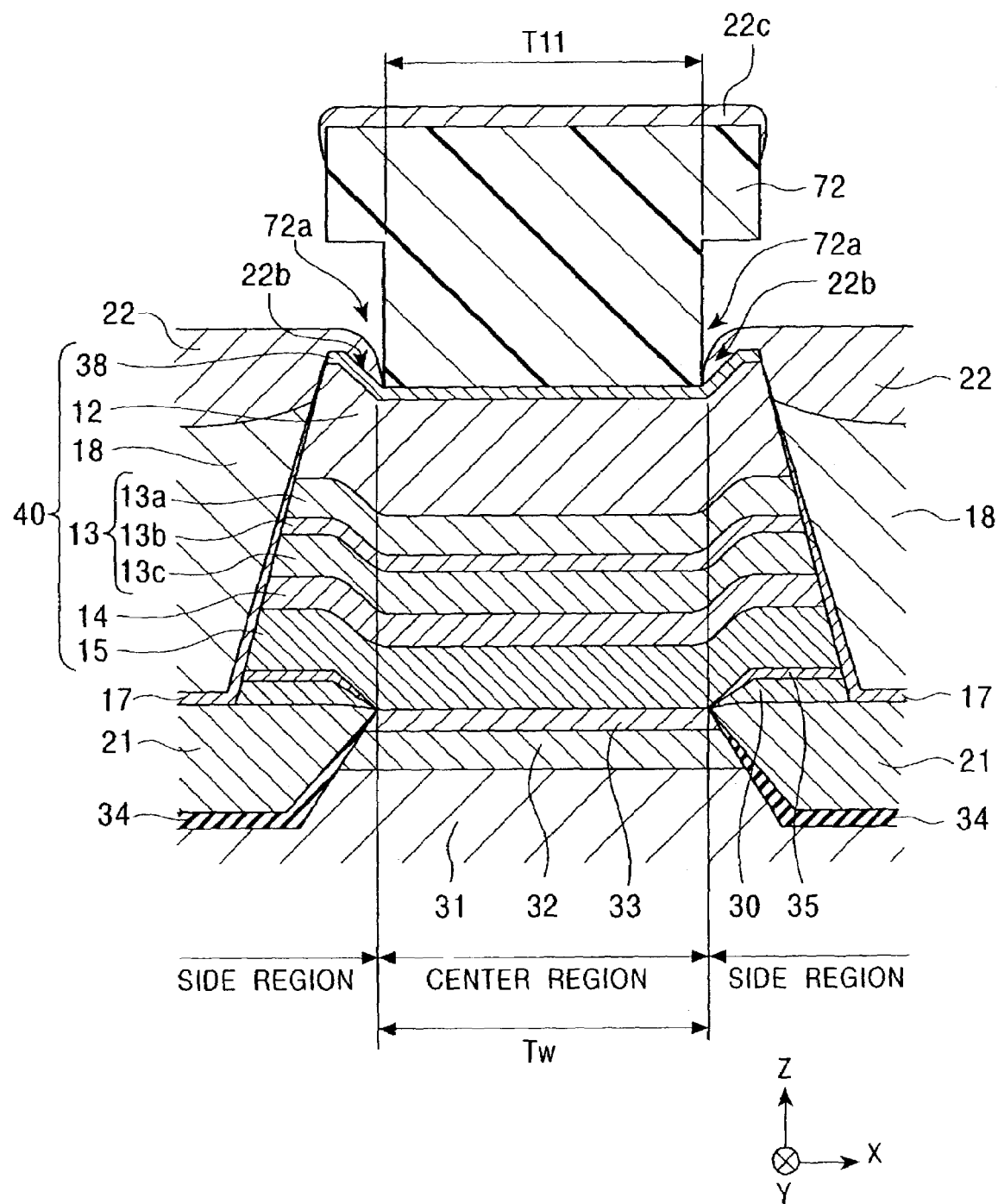
FIG. 35 shows a step that replaces the step shown in FIG. 34 according to another method.
Figure 36:
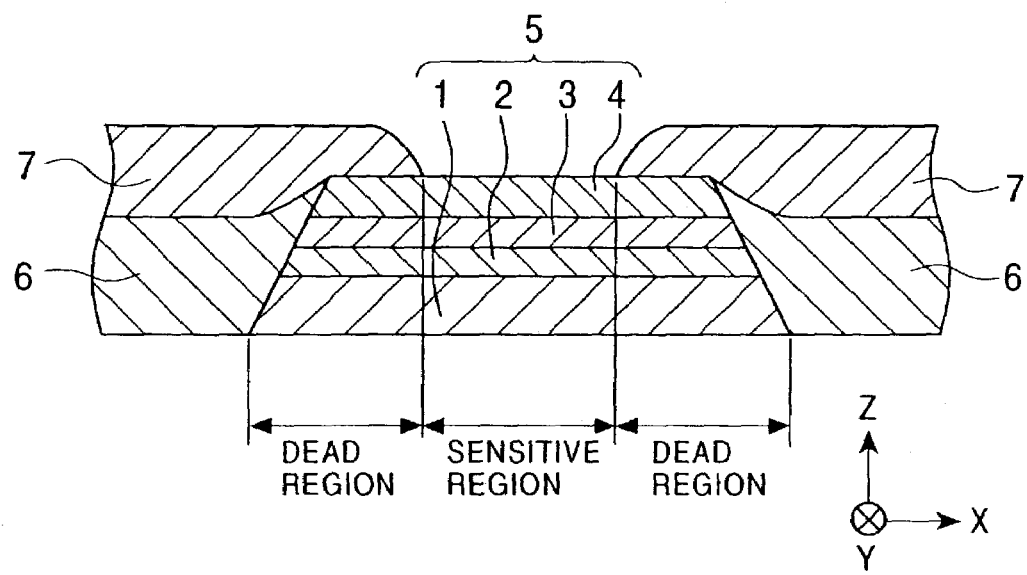
FIG. 36 is a partial cross-sectional view of a conventional magnetic sensing element viewed from the opposing face.
Figure 37:
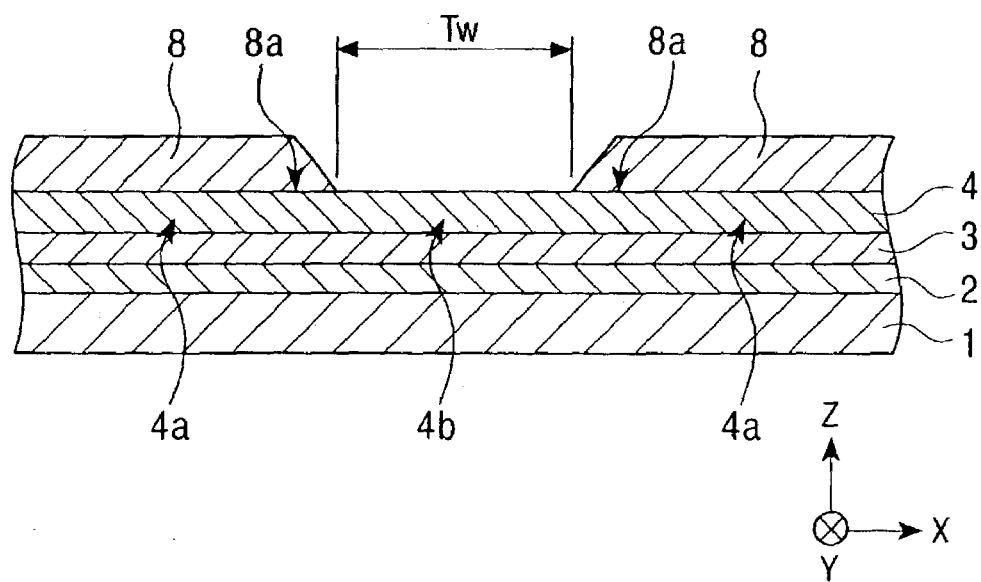
FIG. 37 is a partial cross-sectional view of another conventional magnetic sensing element viewed from the opposing face.

In order to fabricate the tips 22b of the electrode layer 22 overlapping the top face of the composite film 40, as show in FIG. 6, the resist layer 71 is removed after depositing layers up to the hard bias layer 18 in the step shown in FIG. 34, and a lift-off resist layer 72 is formed on the composite film 40, as shown in FIG. 35. The width T11 of the lower part of the resist layer 72 in the track width direction is smaller than the width of the top face of the composite film 40 in the track width direction but is equal to or smaller than the track width Tw.

The electrode layers 22 are then formed on the hard bias layers 18 by sputtering in a direction oblique from the normal line (the Z direction) to the surface of the substrate 11. At this time, the tips 22b of the electrode layers 22 are deposited on the top face of the composite film 40 inside voids 72a. Subsequently, the resist layer 72 is removed. In this manner, the electrode layers 22 overlapping part of the top face of the composite film 40 are formed. The distance between the electrode layers 22 in the track width direction is equal to or smaller than the track width Tw.

In order to make the magnetic sensing element of the seventh embodiment shown in FIG. 7, the nonmagnetic layers 35 are completely removed by ion milling in the step shown in FIG. 31. Subsequently, the steps shown in FIGS. 32 to 35 are performed.

In order to make the magnetic sensing element of the eighth embodiment shown in FIG. 8, the second antiferromagnetic layer 21, the ferromagnetic layer 30, and the nonmagnetic layers 35 are sputter deposited on the nonmagnetic layer 32 using a resist layer (not shown). Subsequently, the resist layer is removed, and the steps shown in FIGS. 32 to 35 are performed.

In order to make the magnetic sensing element of the ninth embodiment shown in FIG. 9, the lower electrode layer 52 is made instead of the substrate 11 in the step shown in FIG. 11, and the insulating layers 50 are made instead of the electrode layers 22 in the step show in FIG. 13 after performing the step shown in FIG. 12. After removing the resist layer 61 in the step show in FIG. 13, the upper electrode layer 51 is formed over the insulating layers 50 and the nonmagnetic layer 20.

Note that the practical application of the magnetic sensing element of the present invention is not limited to thin film magnetic head of a hard disk device. The magnetic sensing element can be used in a magnetic head for tapes and in a magnetic sensor.

In the magnetic sensing element of the present invention, the second antiferromagnetic layers are formed on or above a face of the free magnetic layer remote from the nonmagnetic material layer, and hard bias layers are placed against the two side faces of the free magnetic layer in the track width direction.

In this manner, the side regions of the free magnetic layer can be properly put into a single-magnetic-domain state in the track width direction by a synergetic effect of the exchange coupling magnetic fields by the second antiferromagnetic layers and the longitudinal bias magnetic fields from the hard bias layers. When compared with conventional art in which the free magnetic layer is put into a single-magnetic-domain state solely by the longitudinal bias magnetic field from hard bias layers or solely by the exchange coupling magnetic fields by second antiferromagnetic layers, the magnetization directions of the side portions of the free magnetic layer can be reliably pinned.

Thus, even with narrow tracks, side reading can be prevented and read characteristics such as stability in off-track properties can be improved.

What is claimed is:

1. A magnetic sensing element comprising:
   a composite film having side regions and a center region, comprising, in order from the bottom to top:
   a first antiferromagnetic layer;
   a pinned magnetic layer;
   a nonmagnetic material layer; and
   a free magnetic layer;
   two second antiferromagnetic layers disposed above the side regions of the free magnetic layer;
   a nonmagnetic layer disposed in a gap between the second antiferromagnetic layers in a track width direction;
   two hard bias layers provided against at least part of two side faces of the free magnetic layer in the track width direction; and
   a third antiferromagnetic layer disposed on the free magnetic layer, the second antiferromagnetic layers being formed over the side regions of the third antiferromagnetic layer and the hard bias layers.

2. The magnetic sensing element according to claim 1, wherein the third antiferromagnetic layer has a thickness of 20 to 50 Å.

3. The magnetic sensing element according to claim 1, wherein at least one nonmagnetic element exists at interfaces between the third antiferromagnetic layer and the second antiferromagnetic layers.

4. The magnetic sensing element according to claim 3, wherein the nonmagnetic layer comprises at least one element selected from the group consisting of Ru, Re, Pd, Os, Ir, Pt, Au, Rh, and Cr, and said at least one nonmagnetic element is selected from the group consisting of Ru, Re, Pd, Os, Ir, Pt, Au, Rh, and Cr.

5. The magnetic sensing element according to claim 1, further comprising electrode layers disposed on the second antiferromagnetic layers.

* * * * *